(12) United States Patent
Samonji

(10) Patent No.: US 12,278,458 B2
(45) Date of Patent: Apr. 15, 2025

(54) LIGHT EMITTING ASSEMBLY WITH A DEGRADATION DETERMINER FOR THE LASER ELEMENTS AND FOR THE OPTICAL SYSTEM

(71) Applicant: NUVOTON TECHNOLOGY CORPORATION JAPAN, Kyoto (JP)

(72) Inventor: Katsuya Samonji, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 870 days.

(21) Appl. No.: 17/410,109

(22) Filed: Aug. 24, 2021

(65) Prior Publication Data

US 2021/0384697 A1 Dec. 9, 2021

Related U.S. Application Data

(63) Continuation of application No. PCT/JP2020/006076, filed on Feb. 17, 2020.

(30) Foreign Application Priority Data

Feb. 27, 2019 (JP) ................................ 2019-034777

(51) Int. Cl.
*H01S 5/00* (2006.01)
*H01S 5/024* (2006.01)
(Continued)

(52) U.S. Cl.
CPC ............ *H01S 5/0021* (2013.01); *H01S 5/024* (2013.01); *H01S 5/062* (2013.01); *H01S 5/0683* (2013.01);
(Continued)

(58) Field of Classification Search
CPC ........ H01S 5/0021; H01S 5/024; H01S 5/062; H01S 5/0683; H01S 5/0617; H01S 5/3013; H01S 5/4025
See application file for complete search history.

(56) References Cited

U.S. PATENT DOCUMENTS

| | | | | | |
|---|---|---|---|---|---|
| 5,163,063 | A | * | 11/1992 | Yoshikawa | ......... H01S 5/06825 372/31 |
| 5,381,103 | A | * | 1/1995 | Edmond | ............ G01R 31/2635 324/754.06 |
| 8,189,632 | B2 | * | 5/2012 | Mizushima | .......... G09G 3/3413 372/38.07 |

(Continued)

FOREIGN PATENT DOCUMENTS

JP 2007-141879 A 6/2007
JP 2014-183410 A 9/2014
(Continued)

*Primary Examiner* — M. A. Golub-Miller
(74) *Attorney, Agent, or Firm* — Rimon P.C.

(57) ABSTRACT

A light source device includes: a first optical element through which emission light emitted from each of semiconductor laser elements propagates; a first light receiver that receives first propagating light that has propagated through the first optical element; a laser driving controller that controls the semiconductor laser elements; and a measurement circuit that measures a first output value that indicates a received-light intensity of the first propagating light that has been received by the first light receiver. The first light receiver is disposed downstream of the first optical element. The laser driving controller drives the semiconductor laser elements by using a plurality of values of a driving current that are different from each other. The measurement circuit measures the first output value of the first propagating light received by first light receiver for each of the plurality of values of the driving current that are different from each other.

18 Claims, 31 Drawing Sheets

(51) Int. Cl.
*H01S 5/06* (2006.01)
*H01S 5/062* (2006.01)
*H01S 5/0683* (2006.01)
*H01S 5/30* (2006.01)
*H01S 5/40* (2006.01)

(52) U.S. Cl.
CPC ........... *H01S 5/0617* (2013.01); *H01S 5/3013* (2013.01); *H01S 5/4025* (2013.01)

(56) References Cited

U.S. PATENT DOCUMENTS

| | | | |
|---|---|---|---|
| 8,294,484 B1* | 10/2012 | Thiyagarajan | G01R 31/2635 324/750.05 |
| 8,624,614 B2* | 1/2014 | Omori | H01S 5/0021 324/750.05 |
| 9,316,531 B2* | 4/2016 | Suga | G01J 1/4257 |
| 2003/0204820 A1* | 10/2003 | Asano | G01R 31/2642 716/110 |
| 2004/0167747 A1* | 8/2004 | Watanabe | H04B 10/564 702/184 |
| 2007/0030176 A1* | 2/2007 | Sanchez-Olea | H01S 5/0014 341/13 |
| 2009/0274182 A1* | 11/2009 | Morikawa | H04N 9/3155 372/34 |
| 2010/0033508 A1 | 2/2010 | Mizushima et al. | |
| 2014/0270752 A1 | 9/2014 | Onaka | |
| 2018/0352164 A1 | 12/2018 | Higuchi et al. | |

FOREIGN PATENT DOCUMENTS

| | | |
|---|---|---|
| JP | 2016-004597 A | 1/2016 |
| WO | 2008/041648 A1 | 4/2008 |
| WO | 2017/138321 A1 | 8/2017 |

* cited by examiner

FIG. 7

| | | 342 | | |
|---|---|---|---|---|
| | Laser element number n | | | |
| | N | | | |
| 341 | Inspection number M | Cumulative operating time t [h] | Threshold current I$_{th}$ [mA] | Slope efficiency S$_e$ [1/A] |
| | 0 | 0 | 250 | 1.7 |

| | Laser element number n | | | |
|---|---|---|---|---|
| | 2 | | | |
| 340 | Inspection number M | Cumulative operating time t [h] | Threshold current I$_{th}$ [mA] | Slope efficiency S$_e$ [1/A] |
| | 0 | 0 | 250 | 1.7 |

| Laser element number n | | | |
|---|---|---|---|
| 1 | | | |
| Inspection number M | Cumulative operating time t [h] | Threshold current I$_{th}$ [mA] | Slope efficiency S$_e$ [1/A] |
| 0 | 0 | 250 | 1.72 |
| 1 | 20 | 251 | 1.72 |
| 2 | 32 | 251 | 1.70 |
| 3 | 40 | 252 | 1.69 |
| 4 | 100 | 254 | 1.69 |
| 5 | 150 | 255 | 1.69 |
| 6 | 230 | 256 | 1.68 |
| 7 | 400 | 259 | 1.68 |
| 8 | 460 | 260 | 1.60 |
| 9 | 540 | 276 | 1.59 |
| 10 | 700 | 280 | 1.59 |
| 11 | 785 | 284 | 1.58 |
| 12 | 810 | 285 | 1.57 |
| 13 | | | |
| 14 | | | |
| 15 | | | |
| 16 | | | |
| 17 | | | |
| 18 | | | |
| 19 | | | |
| 20 | | | |

FIG. 22

| Laser element number n | | | | |
|---|---|---|---|---|
| 1 | | | | |
| Inspection number M | Cumulative operating time t [h] | Threshold current Ith [mA] | Slope efficiency $S_{e2}$ [1/A] | Slope efficiency $S_{e1}$ [1/A] |
| 0 | 0 | 250 | 0.81 | 1.72 |
| 1 | 20 | 251 | 0.81 | 1.72 |
| 2 | 32 | 251 | 0.81 | 1.70 |
| 3 | 40 | 252 | 0.81 | 1.69 |
| 4 | 100 | 254 | 0.81 | 1.69 |
| 5 | 150 | 255 | 0.81 | 1.69 |
| 6 | 230 | 256 | 0.81 | 1.68 |
| 7 | 400 | 259 | 0.81 | 1.68 |
| 8 | 460 | 260 | 0.81 | 1.60 |
| 9 | 540 | 276 | 0.81 | 1.59 |
| 10 | 700 | 280 | 0.80 | 1.59 |
| 11 | 785 | 284 | 0.80 | 1.58 |
| 12 | 810 | 285 | 0.80 | 1.57 |
| 13 | | | | |
| 14 | | | | |
| 15 | | | | |
| 16 | | | | |
| 17 | | | | |
| 18 | | | | |
| 19 | | | | |
| 20 | | | | |

FIG. 25

| Second light receiver | First light receiver | Degraded portion |
|---|---|---|
| ○ | ○ | None |
| ✕ | ✕ | Second optical element |
| ○ | ✕ | First optical element |
| ✕ | ○ | — |

○ ⋯ Normal slope efficiency
✕ ⋯ Slope efficiency lower than reference value

LIGHT EMITTING ASSEMBLY WITH A DEGRADATION DETERMINER FOR THE LASER ELEMENTS AND FOR THE OPTICAL SYSTEM

CROSS REFERENCE TO RELATED APPLICATIONS

This is a continuation application of PCT International Application No. PCT/JP2020/006076 filed on Feb. 17, 2020, designating the United States of America, which is based on and claims priority of Japanese Patent Application No. 2019-034777 filed on Feb. 27, 2019. The entire disclosures of the above-identified applications, including the specifications, drawings and claims are incorporated herein by reference in their entirety.

FIELD

The present disclosure relates to a light source device that includes a semiconductor laser element.

BACKGROUND

Conventionally, a device is known that detects laser light output from a laser element such as a semiconductor laser element and controls the value of electric current applied to the semiconductor laser element (see, for example, Patent Literature (PTL) 1).

PTL 1 discloses a laser light emitting device (light source device) that is an example of a device that includes a laser element (semiconductor laser element), the laser light emitting device including: a plurality of laser elements; an optical element that equalizes laser light amount distribution of laser light beams emitted from the plurality of laser elements; a light receiving element that receives a portion of the laser light beam output from each of the plurality of laser elements; a measurer; and a controller. The measurer measures at least values of operating currents for operating the plurality of laser elements and a relationship of laser light output values relative to the operating current values. The controller causes at least one of the plurality of laser elements to operate such that the laser element provides a light output different from the light outputs of the other laser elements based on the values of operating currents for operating the plurality of laser elements and the relationship of relationship of laser light output values relative to the operating current values that were measured by the measurer.

With this configuration, it is possible to cause the laser elements to operate such that a laser element that has a high light emission efficiency provides an output larger than that of a laser element that has a low light emission efficiency. In other words, by preferentially using a laser element that has a high emission efficiency, it is possible to reduce the power consumption of the laser light emitting device as a whole. Also, by suppressing the output of a laser element with an initial failure or a maladjustment, the service life of the laser element can be extended. Accordingly, with the conventional laser light emitting device, it is possible to output laser light at a stable light output with time.

CITATION LIST

Patent Literature

PTL 1: WO 2008/041648

SUMMARY

Technical Problem

However, with the conventional light source device, for example, even if the light output of laser light output from the conventional light source device varies due to degradation of an optical system for controlling laser light distribution, it is not possible to determine whether the variation in the light output was caused by degradation of the optical system or by degradation of the semiconductor laser element.

The present disclosure provides a light source device, with which it is possible to make a distinction between a variation in the light output due to degradation of an optical system and a variation in the light output due to degradation of a semiconductor laser element.

Solution to Problem

A semiconductor laser device according to an aspect of the present disclosure includes: a semiconductor laser element; an optical system that includes a first optical element through which emission light emitted from the semiconductor laser element propagates; a first light receiver that receives first propagating light that has propagated through at least a portion of the first optical element; a laser driving controller that controls a driving current for driving the semiconductor laser element; and a received-light intensity measurer that measures a first output value that indicates a received-light intensity of the first propagating light that has been received by the first light receiver, wherein the first light receiver is disposed downstream of the first optical element, the laser driving controller drives the semiconductor laser element by using a plurality of values of the driving current that are different from each other, and the received-light intensity measurer measures the first output value of the first propagating light that has been received by the first light receiver for each of the plurality of values of the driving current that are different from each other.

Advantageous Effects

With the light source device according to an aspect of the present disclosure, it is possible to make a distinction between a variation in the light output due to degradation of the optical system and a variation in the light output due to degradation of the semiconductor laser element.

BRIEF DESCRIPTION OF DRAWINGS

These and other advantages and features will become apparent from the following description thereof taken in conjunction with the accompanying drawings, by way of non-limiting examples of embodiments disclosed herein.

FIG. 7 shows tables that show examples of data tables stored in the light source device according to Embodiment 1.

FIG. 22 shows tables that show examples of data tables stored in the light source device according to Embodiment 2.

FIG. 25 is a table that shows an example of results of the degrees of degradation of a first optical element and a second optical element determined by a determiner included in the light source device according to Embodiment 2 based on slope efficiency.

DESCRIPTION OF EMBODIMENTS

Figure 1:
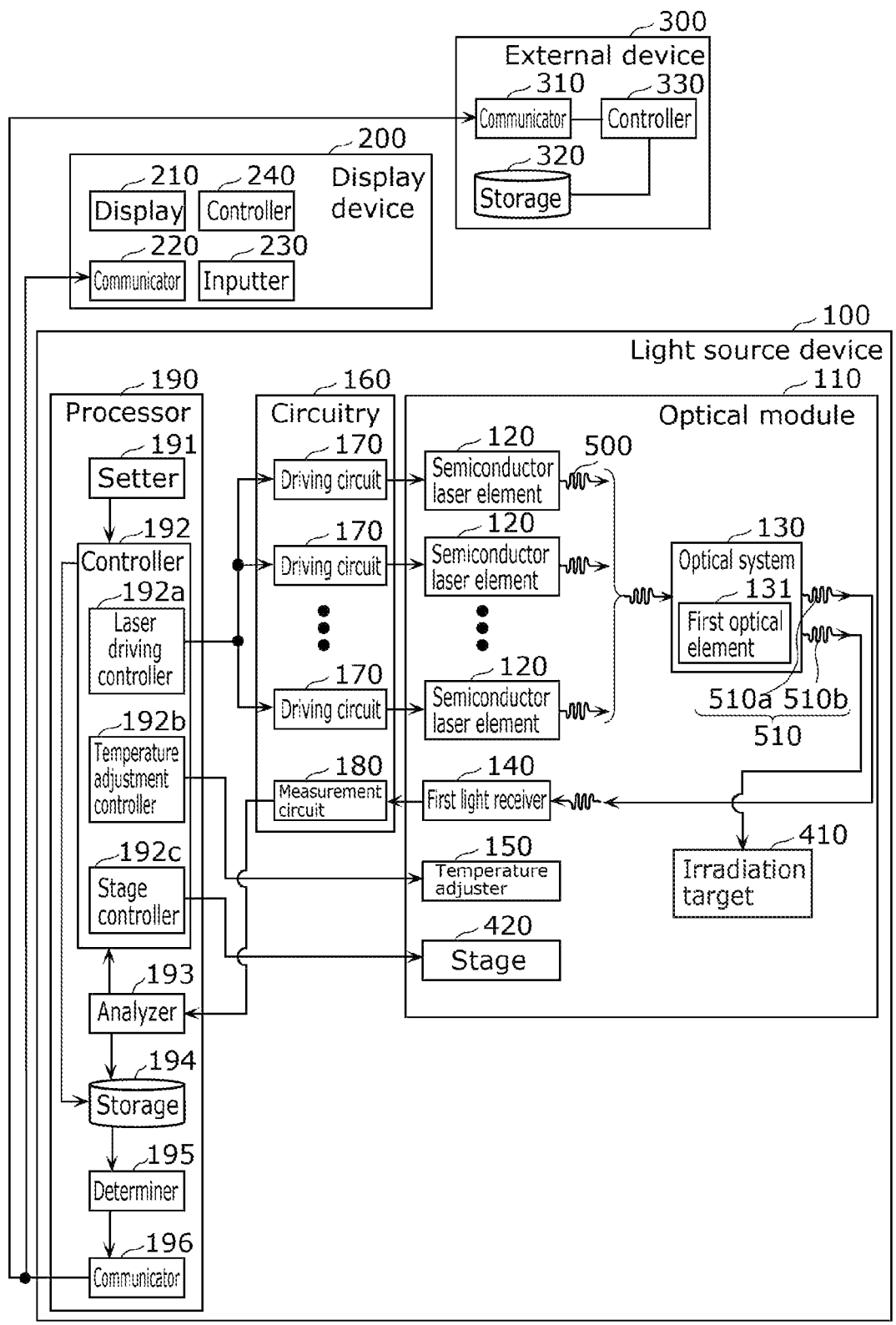
FIG. 1 is a block diagram showing a characteristic functional configuration of a light source device according to Embodiment 1.

Hereinafter, embodiments of the present disclosure will be described in detail with reference to the drawings. The embodiments described below show specific examples of the present disclosure. Accordingly, the numerical values, shapes, materials, structural elements, the arrangement or positions and connection of the structural elements, steps, the order of the steps, and the like shown in the following embodiments are merely examples, and therefore are not intended to limit the scope of the present disclosure.

The diagrams are schematic representations, and thus are not necessarily true to scale. Accordingly, for example, the scale and the like are not necessarily the same in the diagrams. Also, in the diagrams, structural elements that are substantially the same are given the same reference numerals, and a redundant description of the structural elements that are substantially the same may be omitted or simplified.

Embodiment 1

[Configuration]

A configuration of a light source device according to Embodiment 1 will be described first with reference to FIG. 1 and FIGS. 2A and 2B.

FIG. 1 is a block diagram showing a characteristic functional configuration of light source device 100 according to Embodiment 1. FIGS. 2A and 2B are schematic diagrams schematically showing an example of light source device 100 according to Embodiment 1.

Light source device 100 is a device that outputs laser light. Light source device 100 is used in, for example, a laser processing machine that processes irradiation target 410 by using laser light as shown in FIGS. 2A and 2B. In FIGS. 2A and 2B, an example is shown in which light source device 100 includes four semiconductor laser elements 120. However, there is no particular limitation on the number of semiconductor laser elements 120 included in light source device 100. Light source device 100 may include only one semiconductor laser element 120, or may include a plurality of semiconductor laser elements 120.

As shown in FIG. 1, light source device 100 includes optical module 110, circuitry 160, and processor 190.

Optical module 110 is a light source that outputs laser light. Optical module 110 includes semiconductor laser elements 120, optical system 130, first light receiver 140, temperature adjuster 150, and stage 420.

Semiconductor laser elements 120 are semiconductor elements that output laser light. There is no particular limitation on the number of semiconductor laser elements 120 included in optical module 110 as long as one or more semiconductor laser elements 120 are included in optical module 110. In the present embodiment, optical module 110 includes a plurality of semiconductor laser elements 120 (more specifically, N semiconductor laser elements 120, where N satisfies N 2). In FIGS. 2A and 2B, an example is shown in which light source device 100 includes four semiconductor laser elements 120.

The wavelength of laser light (emission light) output from each semiconductor laser element 120 is, for example, 550 nm or less, and more preferably 500 nm or less. Each semiconductor laser element 120 includes, for example, a nitride semiconductor.

The plurality of semiconductor laser elements 120 each output a laser light beam toward optical system 130.

Optical system 130 controls the distribution of laser light beams output from semiconductor laser elements 120. Specifically, optical system 130 performs, on the laser light beams output from semiconductor laser elements 120, collimation processing, wavelength combining processing, condensation processing, and the like, and outputs laser light with a controlled distribution toward irradiation target 410 or first light receiver 140, which will be described later.

Optical system 130 includes first optical element 131.

Optical system 130 allows, using first optical element 131, emission light 500 emitted from each semiconductor laser element 120 to propagate therethrough. For example, first optical element 131 controls the distribution of laser light beams output from semiconductor laser elements 120, and allows the laser light beams to propagate therethrough. First optical element 131 includes at least one of a lens, a mirror, or an optical wave guide. FIGS. 2A and 2B show collimating lenses 131a and 131b, condensing lens 131c, optical fiber 131d, and processing head 131e as examples of structural elements of first optical element 131. Processing head 131e includes collimating lens 131f and condensing lens 131g that are examples of first optical element 131.

First light receiver 140 is an optical sensor that receives first propagating light 510a that has propagated through at least a portion of optical system 130 (specifically, first optical element 131). First light receiver 140 is connected to circuitry 160 by a control line, and outputs detected output values (analog values) to circuitry 160. Specifically, first light receiver 140 is connected to measurement circuit (received-light intensity measurer) 180 included in circuitry 160 by a control line, and outputs the detected output values to measurement circuit 180.

First light receiver 140 is provided downstream of first optical element 131. For example, in the case where optical system 130 includes a plurality of optical elements other than first optical element 131, first light receiver 140 is disposed downstream of all of the optical elements included in optical system 130, or in other words, downstream of optical system 130.

Temperature adjuster 150 is a temperature changer for controlling the temperatures of semiconductor laser elements 120. Temperature adjuster 150 controls the temperatures of semiconductor laser elements 120 by, for example, heating or cooling semiconductor laser element 120. Temperature adjuster 150 is, for example, a peltier element. Semiconductor laser elements 120 are incorporated in, for example, temperature adjuster 150.

Stage 420 holds first light receiver 140 and irradiation target 410 that is brought from the outside of light source device 100. First light receiver 140 is irradiated with first propagating light 510a, which will be described later, while being held by stage 420, and irradiation target 410 is irradiated with first propagating light 510b, which will be described later, while being held by stage 420.

In the description given below, first propagating light 510a and first propagating light 510b may be collectively referred to as first propagating light 510.

Circuitry 160 is connected to processor 190 and optical module 110, and controls the operations of optical module 110 based on instructions from processor 190. Circuitry 160 is, for example, an analog circuit, and functionally includes driving circuits 170 and measurement circuit 180.

Driving circuits 170 are circuits for driving semiconductor laser elements 120. In the present embodiment, circuitry 160 includes the same number of driving circuits 170 as the number of semiconductor laser elements 120 such that the plurality of semiconductor laser elements 120 can be each independently driven. For example, in the case where optical module 110 includes N semiconductor laser elements 120, circuitry 160 includes N driving circuits 170.

Measurement circuit 180 measures a first output value that indicates the received-light intensity of first propagating light 510a received by first light receiver 140. Specifically, measurement circuit 180 is an AD (Analog to Digital) converter that converts analog output values output from first light receiver 140 to digital output values. Measurement circuit 180 outputs the first output value to processor 190 (more specifically, analyzer 193 included in processor 190).

Processor 190 controls the operations of circuitry 160. Specifically, processor 190 controls driving currents for driving semiconductor laser elements 120 by controlling circuitry 160.

Processor 190 functionally includes setter 191, controller 192, analyzer 193, storage 194, determiner (degradation determiner) 195, and communicator 196.

Setter 191 sets the values of driving currents for driving semiconductor laser elements 120. For example, setter 191 acquires information indicating the values of driving currents for driving semiconductor laser elements 120 from display device 200 operated by the user, and stores the acquired driving current values in storage 194. Also, in the case where optical module 110 includes a plurality of semiconductor laser elements 120, setter 191 selects one of the plurality of semiconductor laser elements 120 as a semiconductor laser element to be used. For example, setter 191 acquires information indicating semiconductor laser element 120 to be used from display device 200 operated by the user, and stores the acquired information indicating semiconductor laser element 120 to be used in storage 194. Setter 191 includes a communication interface, and may be communicably connected to display device 200, or may perform communication with display device 200 via communicator 196.

Controller 192 includes laser driving controller 192a that controls the driving currents for driving semiconductor laser elements 120, temperature adjustment controller 192b that controls temperature adjuster 150, and stage controller 192c that controls the driving of stage 420 that holds first light receiver 140 and irradiation target 410. Specifically, laser driving controller 192a of controller 192 applies an electric current corresponding to the driving current value set by setter 191 to semiconductor laser element 120 to be used, which was set by setter 191, by controlling driving circuit 170 included in circuitry 160, and drives semiconductor laser element 120. Laser driving controller 192a drives semiconductor laser elements 120, one by one, using a plurality of driving current values that are different from each other in, for example, an inspection mode, which will be described later. In this case, measurement circuit 180 measures the first output value of first propagating light 510a received by first light receiver 140 for each of the plurality of driving current values that are different from each other.

For example, in the case where optical module 110 includes a plurality of semiconductor laser elements 120, laser driving controller 192a drives the plurality of semiconductor laser elements 120 at different timings. Also, first light receiver 140 receives at least a portion of first propagating light 510a corresponding to each of the plurality of semiconductor laser elements 120 driven at different timings. Also, measurement circuit 180 measures an output of first light receiver 140 for each of the plurality of driving current values for driving the plurality of semiconductor laser elements 120. That is, controller 192 drives the plurality of semiconductor laser elements 120 at different timings. Also, first light receiver 140 receives at least a portion of first propagating light 510a for each of the plurality of semiconductor laser elements driven at different timings. Also, measurement circuit 180 measures the first output value of first propagating light 510a received by first light receiver 140 for each of the driving current values for driving the plurality of semiconductor laser elements 120 that are different from each other.

Also, temperature adjustment controller 192b included in controller 192 control the temperatures of semiconductor laser elements 120 by controlling, for example, temperature adjuster 150. Setter 191 may set the temperatures of semiconductor laser elements 120. For example, setter 191 acquires information indicating the temperatures of semiconductor laser elements 120 from display device 200 operated by the user, and stores the acquired temperatures in storage 194. Temperature adjustment controller 192b controls the temperatures of semiconductor laser elements 120 by controlling, for example, temperature adjuster 150 based on the temperatures set by setter 191.

For example, the temperature of each semiconductor laser element 120 is controlled to be within a range of ±5° C. of a reference temperature by temperature adjustment controller 192b controlling temperature adjuster 150 when measurement circuit 180 measures the first output value, the reference temperature being a temperature that has been set in advance.

Also, stage controller 192c included in controller 192 controls the position, the height, the temperature, and the like of stage 420 that holds first light receiver 140 and irradiation target 410. Specifically, first light receiver 140 is irradiated with first propagating light 510a that has propagated through optical system 130 or irradiation target 410 is irradiated with first propagating light 510b that has propagated through optical system 130, and thus the position and the height of stage 420 are adjusted while stage 420 is holding first light receiver 140 and irradiation target 410. First propagating light 510a that is irradiated on first light receiver 140 and first propagating light 510b that is irradiated on irradiation target 410 are first propagating light 510 that is emitted from the same semiconductor laser element and has propagated through the same optical system 130, except that first propagating light 510a and first propagating light 510b are irradiated on different target objects. In the case where light source device 100 is, for example, a processing device, irradiation target 410 is a workpiece to be processed that is brought from the outside of the processing device.

Also, controller 192 measures cumulative operating time t that is the total amount of time during which each semiconductor laser element 120 was driven (or in other words, the time during which each semiconductor laser element 120 was caused to output laser light). Controller 192 may include, for example, a timer such as a RTC (Real Time Clock) to measure time. Controller 192 stores, in storage 194, cumulative operating time t that is the measured total amount of time during which semiconductor laser element 120 was driven.

Analyzer 193 calculates a threshold current value (threshold current $I_{th}$) and slope efficiency $S_e$ based on the laser light output value of semiconductor laser element 120 acquired from measurement circuit 180.

Threshold current $I_{th}$ is the value of electric current at which semiconductor laser element 120 performs laser oscillation.

Slope efficiency $S_e$ represents the amount of variation (or in other words, slope) in light output between current values in laser oscillation current values. In order to calculate threshold current $I_{th}$ and slope efficiency $S_e$, analyzer 193 acquires light outputs that correspond to two current values in the laser oscillation current values. In other words, controller 192 controls each semiconductor laser element 120 (specifically, driving circuit 170) such that analyzer 193 acquires light outputs that correspond to two current values in the laser oscillation current values. In the case where optical module 110 includes a plurality of semiconductor laser elements 120, controller 192 individually drives the plurality of semiconductor laser elements 120 such that analyzer 193 acquires light outputs that correspond to two current values in the laser oscillation current values of each semiconductor laser element 120.

Storage 194 stores threshold current $I_{th}$ and slope efficiency $S_e$ that were calculated by analyzer 193. More specifically, storage 194 stores threshold current $I_{th}$ and slope efficiency $S_e$ that were calculated by analyzer 193 every predetermined time. In the case where, for example, optical module 110 includes a plurality of semiconductor laser elements 120, storage 194 stores, for each semiconductor laser element 120, threshold current $I_{th}$ and slope efficiency $S_e$ that were calculated by analyzer 193, and the time during which semiconductor laser element 120 was driven in association with each other, in the form of data table 340 shown in FIG. 7, which will be described later.

Also, storage 194 stores, for example, the driving current values for driving semiconductor laser elements 120 and semiconductor laser element 120 to be used that were set by setter 191.

Also, storage 194 stores, for example, a control program executed by processor 190.

Storage 194 is, for example, a HDD (Hard Disk Drive), a non-volatile memory, or the like.

Determiner 195 determines the degree of degradation of semiconductor laser element 120 and optical system 130 based on threshold current $I_{th}$ and slope efficiency $S_e$ that were calculated by analyzer 193. Specifically, determiner 195 determines the degree of degradation of semiconductor laser element 120 based on threshold current $I_{th}$, and determines the degree of degradation of first optical element 131 of optical system 130 based on slope efficiency $S_e$.

Semiconductor laser element 120 and first optical element 131 have different features in their degradation processes. In the degradation process of semiconductor laser element 120, an increase in threshold current $I_{th}$ and a decrease in slope efficiency $S_e$ occur simultaneously. On the other hand, in the degradation process of first optical element 131, an increase in threshold current $I_{th}$ is not observed, and only a decrease in slope efficiency $S_e$ occurs. This is because the degradation of first optical element 131 is the phenomenon in which the transmittance of propagating light 510a decreases.

Accordingly, if the correlation between the amount of increase in threshold current $I_{th}$ and the amount of decrease in slope efficiency $S_e$ that occur in the degradation process of semiconductor laser element 120 is quantitatively known in advance, the degradation of semiconductor laser element 120 and the degradation of first optical element 131 can be determined separately.

For example, as will be described later with reference to FIG. 10, it is assumed that there are fixed amounts of increase in threshold current $I_{th}$ and decrease in slope efficiency $S_e$. In this case, if the amount of decrease in slope efficiency $S_e$ exceeds the estimated amount of decrease in slope efficiency $S_e$ in the degradation process of semiconductor laser element 120 (for example, the amount of decrease determined based on the amount of increase in threshold current $I_{th}$), it is possible to determine that the degradation of first optical element 131 has occurred. Also, in the degradation process of semiconductor laser element 120 that is made of a nitride semiconductor, it is often the case that a feature in which there is little change in slope efficiency $S_e$, and threshold current $I_{th}$ increases significantly is observed. Accordingly, the degradation of semiconductor laser element 120 and the degradation of first optical element 131 can be determined separately with high accuracy.

Specifically, determiner 195 determines the degree of degradation of first optical element 131 based on a plurality of driving current values and outputs that correspond to the plurality of driving current values. More specifically, determiner 195 determines the degree of degradation of first optical element 131 based on a plurality of driving current values that are different from each other and first output values of first propagating light 510a received by first light receiver 140 that correspond to the plurality of driving current values that are different from each other.

Determiner 195 determines the degree of degradation of first optical element 131 based on, for example, ΔPom/ΔIf, where ΔIf represents the amount of variation between two driving current values out of the plurality of driving current values that are different from each other, and ΔPom represents the amount of variation between the first output values of first propagating light 510a received by first light receiver 140 that correspond to the two driving current values.

Also, determiner 195 calculates, for example, the amount of variation with time in threshold current $I_{th}$ at which semiconductor laser element 120 performs laser oscillation, and distinctively determines the service life of semiconductor laser element 120 and the degree of degradation of first optical element 131 by using the calculated amount of variation in threshold current $I_{th}$. More specifically, for example, determiner 195 calculates the service life of semiconductor laser element 120 and determines the degree of degradation of first optical element 131.

Also, for example, processor 190 repeatedly executes an inspection mode and an operation mode by switching between the two modes, the inspection mode being a mode in which determiner 195 determines the degree of degradation of first optical element 131, and distinguishes the service life of semiconductor laser element 120 and the degree of degradation of first optical element 131 from each other, and the operation mode being a mode in which irradiation target 410 is irradiated with the propagating light that has propagated through optical system 130. Specifically, controller 192 repeatedly execute the inspection mode and the operation mode by switching between the two modes, the inspection mode being the mode in which controller 192 is caused to drive semiconductor laser element 120 to irradiate first light receiver 140 with the propagating light that has propagated through optical system 130 in order for determiner 195 to determine the degree of degradation of first optical element 131 and distinguish the service life of semiconductor laser element 120 and the degree of degradation of first optical element 131 from each other, and the operation mode being the mode in which controller 192 is caused to drive semiconductor laser element 120 to irradiate irradiation target 410 with the propagating light that has propagated through optical system 130 without using determiner 195. More specifically, controller 192 repeatedly executes the inspection mode and the operation mode by switching between the two modes, the inspection mode being the mode in which determination of the degree of degradation of first optical element 131 and calculation of the service life of semiconductor laser element 120 are performed by causing first light receiver 140 to receive first propagating light 510a that has propagated through first optical element 131, and the operation mode being the mode in which irradiation target 410 is irradiated with first propagating light 510b that has propagated through first optical element 131. That is, controller 192 performs switching between a state (inspection mode) shown in FIG. 2A and a state (operation mode) shown in FIG. 2B by driving stage 420.

Figure 2A:
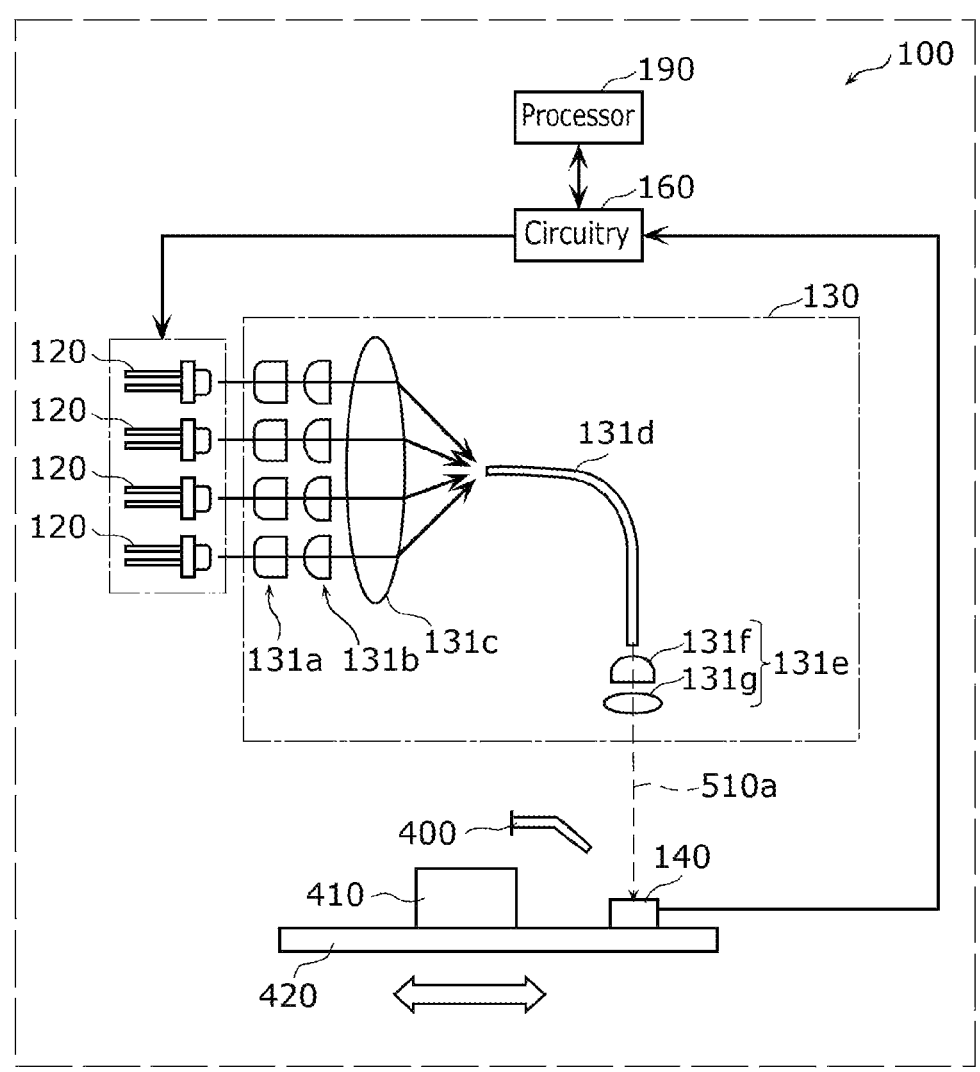
FIG. 2A is a schematic diagram schematically showing an example of the light source device according to Embodiment 1.

As shown in FIG. 2A, for example, in the inspection mode, stage 420 is driven to move first light receiver 140 to a position where first propagating light 510a output from optical system 130 (more specifically, processing head 131e) is irradiated on, and semiconductor laser elements 120 are individually driven to irradiate first light receiver 140 with first propagating light 510a.

Figure 2B:
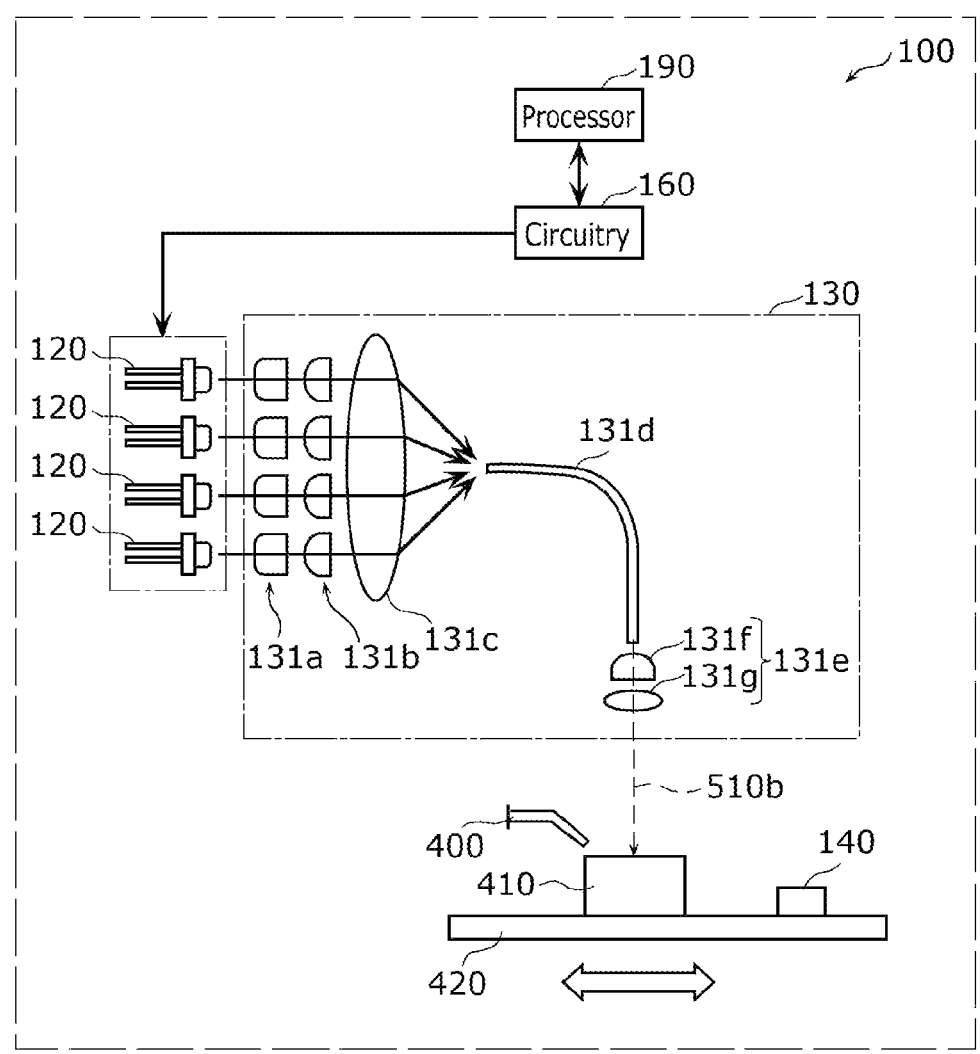
FIG. 2B is a schematic diagram schematically showing an example of the light source device according to Embodiment 1.

On the other hand, as shown in FIG. 2B, for example, in the operation mode, stage 420 is driven to move irradiation target 410 to a position where first propagating light 510b output from optical system 130 (more specifically, processing head 131e) is irradiated on, and laser processing is performed on irradiation target 410 by irradiating irradiation target 410 with first propagating light 510b while spraying a gas to irradiation target 410 by driving gas spray 400.

In the inspection mode, for example, first light receiver 140 receives first propagating light 510a at a position displaced from the focal point of first propagating light 510a on the light receiving surface of first light receiver 140, first propagating light 510a being obtained as a result of emission light 500 being condensed by first optical element 131.

Also, for example, the driving current value that corresponds to first propagating light 510a received by first light receiver 140 is smaller than the rated driving current value. For example, controller 192 drives semiconductor laser element 120 in the inspection mode such that the driving current value that corresponds to first propagating light 510a received by first light receiver 140 is smaller than the rated driving current value that has been arbitrarily set in advance.

Also, processor 190 can arbitrarily drive stage 420. For example, stage controller 192c included in controller 192 is connected to a driver (not shown) included in stage 420 with a communication line or the like, and moves stage 420 to a desired position.

Also, determiner 195 predicts cumulative operating time t taken until it is determined that a failure has occurred in first optical element 131 or the service life of first optical element 131 taken until it is determined that a failure has occurred in first optical element 131 based on, for example, ΔPom/ΔIf, where ΔIf represents the amount of variation between a plurality of driving current values that are different from each other, and ΔPom represents the amount of variation between a plurality of output values. That is, where the amount of variation between two driving current values out of a plurality of driving current values that are different from each other is represented by ΔIf, and the amount of variation between a plurality of first output values of first propagating light 510a received by first light receiver 140 that correspond to the two driving current values is represented by ΔPom, determiner 195 calculates, based on ΔPom/ΔIf, at least one of cumulative operating time t taken until it is determined that a failure has occurred in first optical element 131 or the time taken until it is determined that a failure has occurred in first optical element 131.

Also, determiner 195 transmits, for example, the calculated service life of semiconductor laser element 120 to an external device (external computer) 300 via communicator 196.

Also, determiner 195 transmits the determined degree of degradation of first optical element 131 to external device 300 via communicator 196.

Also, determiner 195 transmits the time taken until it is determined that a failure has occurred in first optical element 131 (in short, service life) to external device 300 via communicator 196.

Also, in the case where, for example, optical module 110 includes a plurality of semiconductor laser elements 120, determiner 195 determines the service life of each of the plurality of semiconductor laser elements 120.

Communicator 196 is a communication interface for performing communication between processor 190 and external device 300 via a network. Communicator 196 is communicably connected to communicator 310 included in external device 300. Communicator 196 and communicator 310 may be communicably connected to each other with a communication line. Also, communicator 196 and communicator 310 may each include a wireless module such as a wireless adapter, and may be connected so as to be capable of performing wireless communication.

Processor 190 is implemented by, for example, a CPU (Central Processing Unit) and a control program executed by the CPU. The control program is stored in, for example, storage 194. Processor 190 may be implemented by a dedicated electronic circuit or the like. For example, setter 191, controller 192, analyzer 193, and determiner 195 may be implanted by a single CPU or may be implemented by a plurality of CPUs.

Display device 200 displays threshold current $I_{th}$ and slope efficiency $S_e$ that were calculated by analyzer 193, the results of the degree of degradation of semiconductor laser element 120 and the degree of degradation of first optical element 131 that were determined by determiner 195, and the like so as to notify the user.

Display device 200 includes display 210, communicator 220, inputter 230, and controller 240.

Display 210 is a display for displaying threshold current $I_{th}$ and slope efficiency $S_e$ that were calculated by analyzer 193, the results of the degree of degradation of semiconductor laser element 120 and the degree of degradation of first optical element 131 that were determined by determiner 195, and the like.

Communicator 220 outputs information received by inputter 230 from the user to processor 190. Communicator 220 is, for example, a communication interface for performing communication with communicator 196 included in processor 190.

Inputter 230 is a device that is operated by the user to input a result of selection of semiconductor laser element 120 to be used, the driving current values for driving semiconductor laser elements 120, and the like. Inputter 230 includes, for example, a mouse, a keyboard, a touch panel, and the like.

Controller 240 performs various types of control operations executed by display device 200. For example, controller 240 outputs information received by inputter 230 from the user to processor 190 via communicator 220. Controller 240 is implemented by, for example, a CPU and a control program that is stored in a memory (not shown) included in display device 200 and executed by the CPU.

External device 300 is a device that acquires information transmitted from processor 190 and stores the information. External device 300 is, for example, a computer such as a personal computer or a server device.

External device 300 includes, for example, communicator 310, storage 320, and controller 330.

Communicator 310 is a communication interface for performing communication with processor 190. Communicator 310 is communicably connected to, for example, communicator 196 included in processor 190.

Storage 320 is a storage device in which information acquired from processor 190 via communicator 310 is stored. Storage 320 is, for example, a non-volatile memory such as a hard disk drive or a flash memory.

Controller 330 performs various types of control operations executed by external device 300. For example, controller 330 stores, in storage 320, information acquired from processor 190 via communicator 196. Controller 330 is implemented by, for example, a CPU and a control program that is stored in storage 320 and executed by the CPU.

[Processing Procedure]

A processing procedure for determining the degree of degradation of semiconductor laser element 120 and the degree of degradation of first optical element 131, executed by light source device 100 according to Embodiment 1, will be described next with reference to FIGS. 3 to 14.

Figure 3:
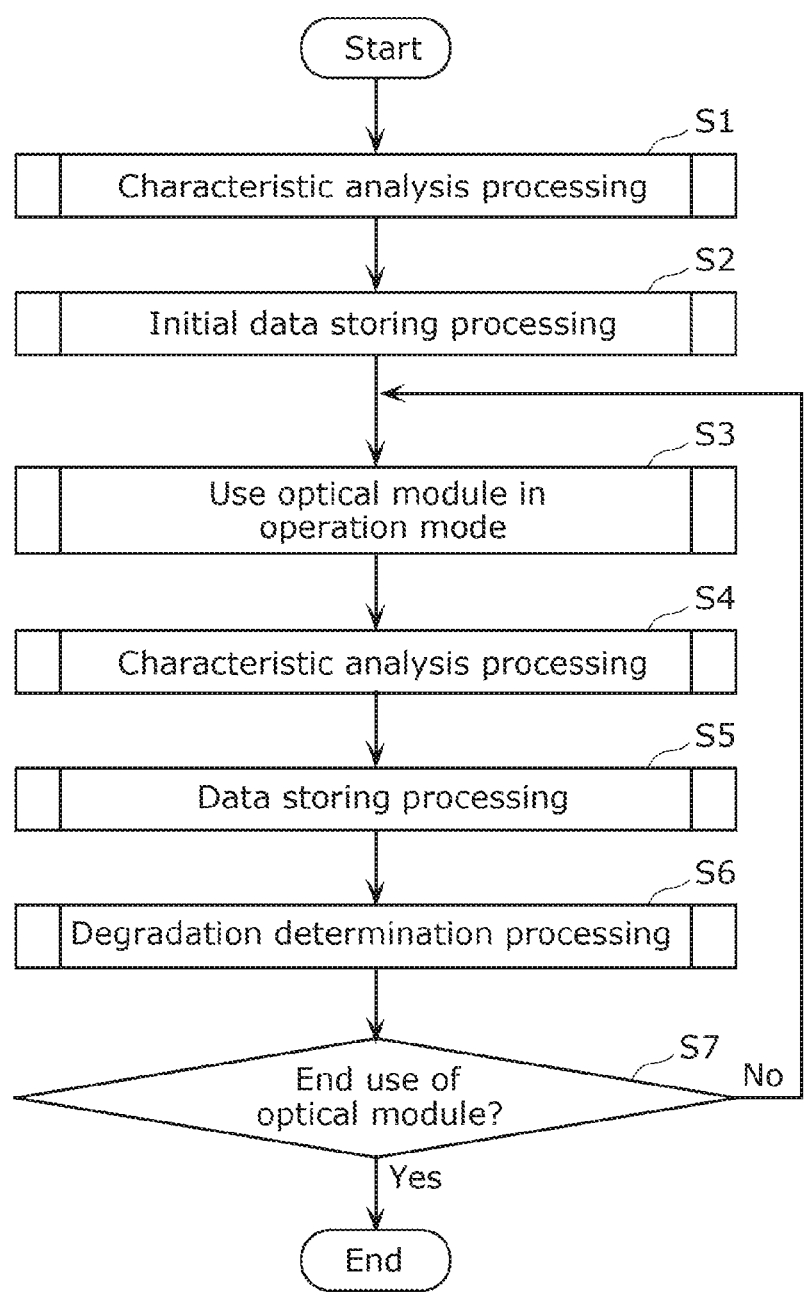
FIG. 3 is a flowchart illustrating a processing procedure for determining the degree of degradation of a semiconductor laser element and the degree of degradation of a first optical element, executed by the light source device according to Embodiment 1.

FIG. 3 is a flowchart illustrating the processing procedure for determining the degree of degradation of semiconductor laser element 120 and the degree of degradation of first optical element 131, executed by light source device 100 according to Embodiment 1.

First, light source device 100 executes characteristic analysis processing for each of semiconductor laser element 120 and first optical element 131 (step S1). Specifically, in step S1, analyzer 193 calculates threshold current $I_{th}$ and slope efficiency $S_e$ based on the laser light output from first optical element 131, and stores threshold current $I_{th}$ and slope efficiency $S_e$ in storage 194.

Next, light source device 100 executes initial data storing processing for each of semiconductor laser element 120 and first optical element 131 (step S2). Specifically, in step S2, analyzer 193 calculates initial values for threshold current $I_{th}$ and slope efficiency $S_e$ that were calculated in step S1 based on the laser light output from first optical element 131, also calculates reference threshold current $I_{END}$ and reference slope efficiency $S_{END}$, which are used by determiner 195 as the criteria for determining the degree of degradation, based on the calculated initial values, and then stores reference threshold current $I_{END}$ and reference slope efficiency $S_{END}$ in storage 194.

Reference threshold current $I_{END}$ and reference slope efficiency $S_{END}$ are each calculated by, for example, multiplying the initial value by a predetermined constant. Reference threshold current $I_{END}$ and reference slope efficiency $S_{END}$ may be arbitrarily set in advance.

Next, light source device 100 uses optical module 110 in the operation mode (step S3). For example, in the case where light source device 100 is used as a laser processing machine as shown in FIGS. 2A and 2B, in step S3, light source device 100 processes irradiation target 410 by irradiating irradiation target 410 with laser light, as shown in FIG. 2A.

Next, light source device 100 executes characteristic analysis processing for each of semiconductor laser element 120 and first optical element 131 (step S4). Specifically, in step S4, as in step S1, analyzer 193 calculates threshold current $I_{th}$ and slope efficiency $S_e$ based on the laser light output from first optical element 131.

Next, light source device 100 executes data storing processing for each of semiconductor laser element 120 and first optical element 131 (step S5). Specifically, in step S5, analyzer 193 stores, in storage 194, the values of threshold current $I_{th}$ and slope efficiency $S_e$ that were calculated in step S4 based on the laser light output from first optical element 131 in association with cumulative operating time t that is the time during which semiconductor laser element 120 was used.

Next, light source device 100 executes degradation determination processing for each of semiconductor laser element 120 and first optical element 131 (step S6). Specifically, in step S6, determiner 195 determines the degree of degradation of semiconductor laser element 120 and the degree of degradation of first optical element 131 based on threshold current $I_{th}$, slope efficiency $S_e$, and cumulative operating time t stored in storage 194 in step S5 by analyzer 193.

Next, light source device 100 determines whether to end the use of optical module 110 (step S7). For example, in step S7, controller 192 determines, based on an instruction acquired from the user via inputter 230 and communicator 220, whether to continuously use optical module 110 in the operation mode.

If it is determined that the use of optical module 110 is to end (Yes in step S7), light source device 100 ends the processing.

On the other hand, if it is determined that the use of light source device 100 is not to end (No in step S7), light source device 100 returns the processing to step S3, and continuously uses optical module 110 in the operation mode.

Next, the steps shown in FIG. 3 will be described in detail.

In the flowcharts shown in FIGS. 4 to 9 and FIG. 11 described below, an example will be described in which light source device 100 includes N semiconductor laser elements 120.

Figure 4:
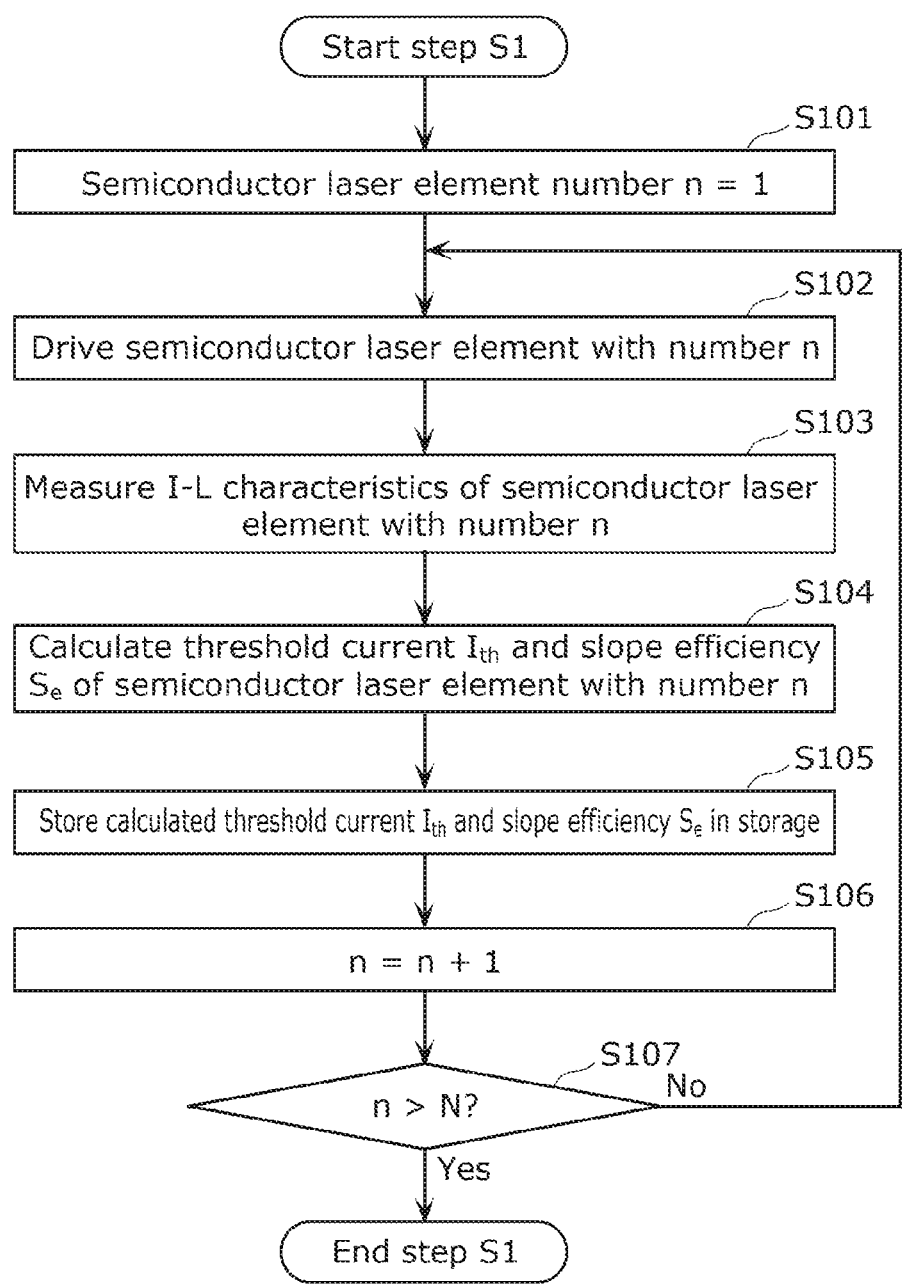
FIG. 4 is a flowchart illustrating characteristic analysis processing executed by the light source device according to Embodiment 1 in detail.

FIG. 4 is a flowchart illustrating the characteristic analysis processing (specifically, step S1 and step S4) executed by light source device 100 according to Embodiment 1 in detail.

The only difference between step S1 and step S4 is that whether semiconductor laser element 120 is in an initial state, and thus step S1 will be described in detail with reference to FIG. 4.

First, setter 191 selects one from among N semiconductor laser elements 120 and sets the selected semiconductor laser element. Here, for example, numbers from 1 to N are assigned to N semiconductor laser elements 120 in advance so as to distinguish N semiconductor laser elements 120 from each other. For example, setter 191 selects, from among N semiconductor laser elements 120, semiconductor laser element 120 with a number n=1, and sets the selected semiconductor laser element (step S101).

Next, controller 192 drives semiconductor laser element 120 with a number n=1 that was set by setter 191 in step S101 (or in other words, causes the semiconductor laser element to output laser light) (step S102).

Next, analyzer 193 measures the I-L characteristics (the light output relative to the driving current value) of semiconductor laser element 120 with a number n=1 (step S103). Specifically, analyzer 193 acquires the light output of semiconductor laser element 120 with a number n=1 received by first light receiver 140 from measurement circuit 180, and acquires the driving current value used by controller 192 to drive semiconductor laser element 120 with a number n=1.

Next, analyzer 193 calculates threshold current $I_{th}$ and slope efficiency $S_e$ based on the I-L characteristics of semiconductor laser element 120 with a number n=1 measured in step S103 (step S104). Next, analyzer 193 stores, in storage 194, threshold current $I_{th}$ and slope efficiency $S_e$ of semiconductor laser element 120 with a number n=1 that were calculated in step S104 (step S105).

In step S105, for example, analyzer 193 stores, in storage 194, threshold current $I_{th}$ and slope efficiency $S_e$ together with cumulative operating time t of semiconductor laser element 120 with a number n=1 measured by controller 192.

Next, setter 191 sets semiconductor laser element 120 with a number n=n+1, which represents the number next to number n (step S106). Specifically, setter 191 sets semiconductor laser element 120 with a number n=2, which is the number next to n=1.

Next, controller 192 determines whether number n set by setter 191 in step S106 satisfies n>N, or in other words, whether number n exceeds the largest value of the numbers assigned to N semiconductor laser elements 120 included in light source device 100 (step S107).

If it is determined that number n does not satisfy n>N (No in step S107), controller 192 returns the processing to step S102. Setter 191, controller 192, and analyzer 193 repeat the processing from step S102 to step S107, and thereby calculate threshold current $I_{th}$ and slope efficiency $S_e$ of each of N semiconductor laser elements 120 and store them in storage 194.

On the other hand, if it is determined that number n satisfies n>N (Yes in step S107), controller 192 determines that the values of threshold current $I_{th}$ and slope efficiency $S_e$ of N semiconductor laser elements 120 have been stored in storage 194, and ends the processing.

Figure 5:
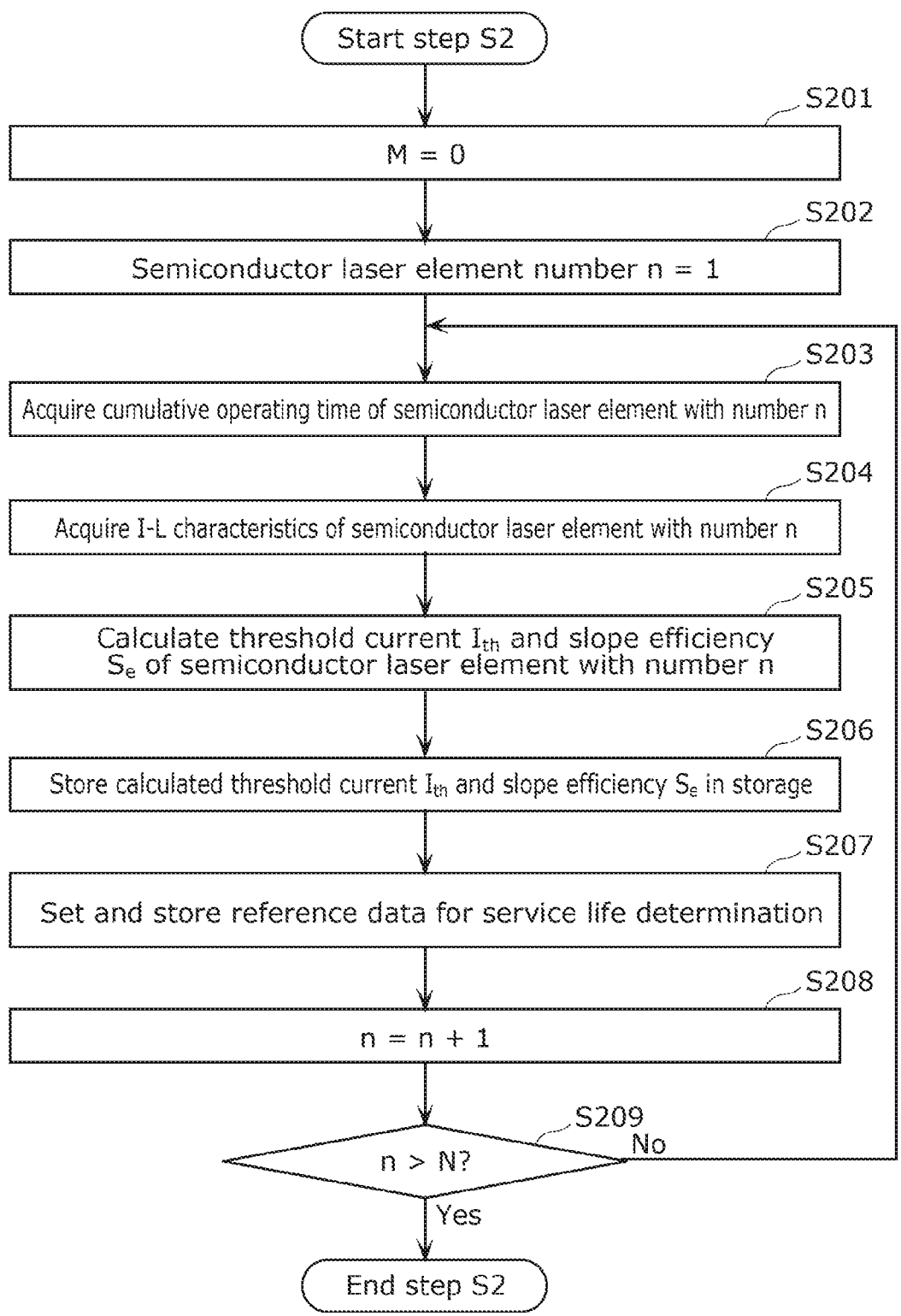
FIG. 5 is a flowchart illustrating initial data storing processing executed by the light source device according to Embodiment 1 in detail.

FIG. 5 is a flowchart illustrating the initial data storing processing executed by light source device 100 according to Embodiment 1 in detail. Specifically, FIG. 5 is a flowchart illustrating step S2 shown in FIG. 3 in detail.

First, setter 191 sets M=0 for the initial value of threshold current $I_{th}$ and the initial value of slope efficiency $S_e$ of each of N semiconductor laser elements 120 analyzed by analyzer 193 in step S1 shown in FIG. 3 (step S201). Here, M represents the order in which each of N semiconductor laser elements 120 was subjected to measurement for threshold current $I_{th}$ and slope efficiency $S_e$. In step S201, setter 191 sets, for example, M=0 because the values of threshold current $I_{th}$ and slope efficiency $S_e$ of each of N semiconductor laser elements 120 analyzed by analyzer 193 in step S1 shown in FIG. 3 are the values that were measured first.

Next, setter 191 selects, from among N semiconductor laser elements 120, semiconductor laser element 120 with a number n=1, and sets the selected semiconductor laser element (step S202).

Next, analyzer 193 acquires, from storage 194, cumulative operating time t of semiconductor laser element 120 with a number n=1 that was set by setter 191 in step S202 (step S203).

Next, analyzer 193 acquires the I-L characteristics of semiconductor laser element 120 with a number n=1 stored in storage 194 (step S204).

Next, analyzer 193 calculates (acquires) threshold current $I_{th}$ and slope efficiency $S_e$ of semiconductor laser element 120 with a number n=1 stored in storage 194 (step S205).

Next, analyzer 193 stores, in storage 194, data table 340 (see FIG. 7) in which threshold current $I_{th}$ and slope efficiency $S_e$ of semiconductor laser element 120 with a number n=1 that were acquired are associated with cumulative operating time t (step S206). By doing so, in step S206, analyzer 193 stores the initial data (threshold current $I_{th}$ and slope efficiency $S_e$ when M=0, and cumulative operating time t=0) of semiconductor laser element 120 with a number n=1 in storage 194.

Next, analyzer 193 sets (calculates) reference threshold current $I_{END}$ and reference slope efficiency $S_{END}$ of semiconductor laser element 120 with a number n=1 based on the initial data stored in storage 194 in step S206, and stores the same in storage 194 (step S207), reference threshold current $I_{END}$ and reference slope efficiency $S_{END}$ being criteria data for service life determination used by determiner 195 to determine the degree of degradation of semiconductor laser element 120 with a number n=1 and the degree of degradation of first optical element 131.

Next, setter 191 sets semiconductor laser element 120 with a number n=n+1, which represents the number next to number n (step S208). Specifically, setter 191 sets semiconductor laser element 120 with a number n=2, which is the number next to n=1.

Next, controller 192 determines whether number n set by setter 191 in step S208 satisfies n>N, or in other words, whether number n exceeds the largest value of the numbers assigned to N semiconductor laser elements 120 of light source device 100 (step S209).

If it is determined that number n does not satisfy n>N (No in step S209), controller 192 returns the processing to step S203. Setter 191, controller 192, and analyzer 193 repeat the processing from step S203 to step S207, and thereby create data table 340 for each of N semiconductor laser elements 120.

On the other hand, if it is determined that number n satisfies n>N (Yes in step S209), controller 192 determines that data tables 340 of N semiconductor laser elements 120 have been stored in storage 194, and ends the processing.

Figure 6:
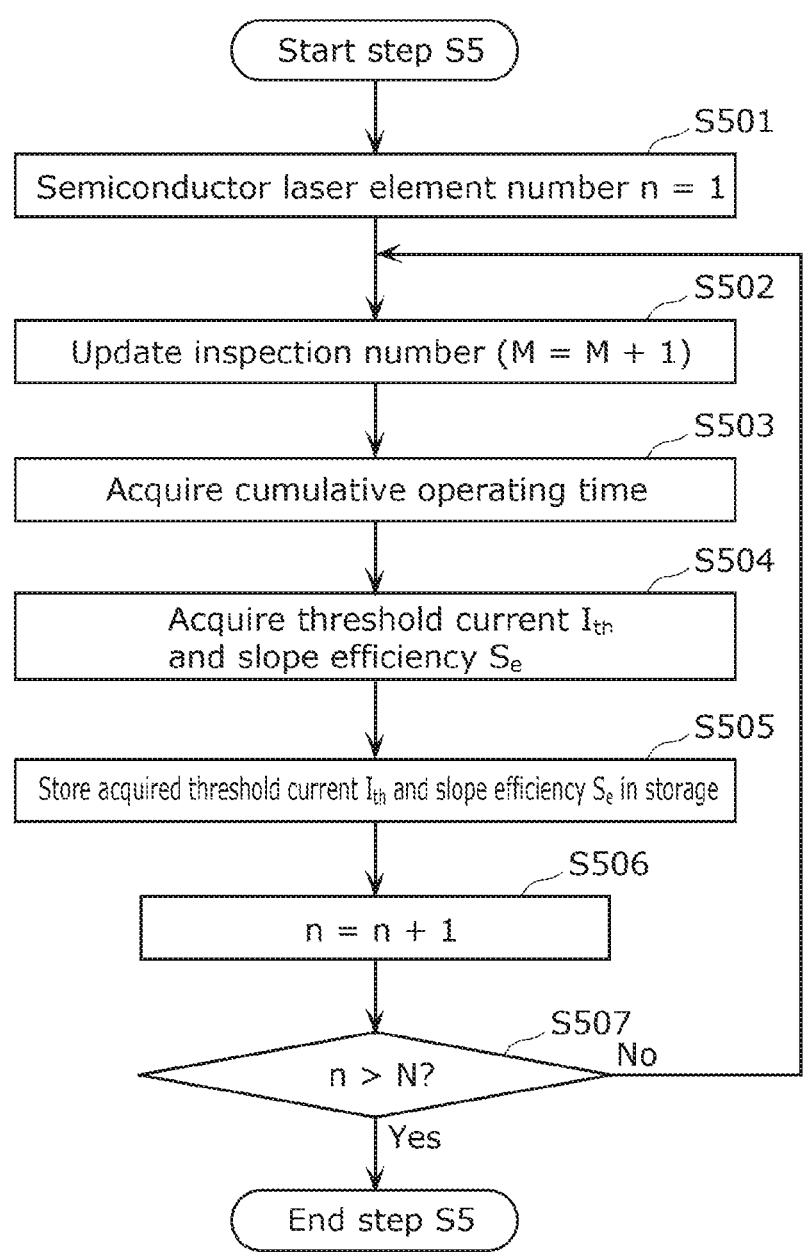
FIG. 6 is a flowchart illustrating data storing processing executed by the light source device according to Embodiment 1 in detail.

FIG. 6 is a flowchart illustrating the data storing processing (step S5) executed by light source device 100 according to Embodiment 1 in detail.

First, setter 191 selects, from among N semiconductor laser elements 120, semiconductor laser element 120 with a number n=1 and sets the selected semiconductor laser element (step S501).

Next, analyzer 193 updates inspection number M to M+1 (M=M+1) (step S502). For example, in the case where inspection number M is set to 0 (M=0) for each of semiconductor laser elements 120 that is subjected to inspection in which threshold current $I_{th}$ and the like are measured for the first time, and the second inspection is performed in step S502, analyzer 193 sets M to 1 (M=1).

Next, analyzer 193 acquires cumulative operating time t of semiconductor laser element 120 with a number n=1 from controller 192 (step S503). In the case where cumulative operating time t of semiconductor laser element 120 with a number n=1 is stored in storage 194 by controller 192, analyzer 193 may acquire cumulative operating time t of semiconductor laser element 120 with a number n=1 from storage 194.

Next, analyzer 193 acquires results of the second measurement (threshold current $I_{th}$ and slope efficiency $S_e$) of semiconductor laser element 120 with a number n=1 stored in storage 194 (step S504).

Next, analyzer 193 stores, in storage 194, data table 341 (see FIG. 7) in which the acquired results of the second measurement (threshold current $I_{th}$ and slope efficiency $S_e$) of semiconductor laser element 120 with a number n=1 are associated with cumulative operating time t (step S505). By doing so, in step S505, analyzer 193 stores, in storage 194, the data of the results of the second measurement of semiconductor laser element 120 with a number n=1 (cumulative operating time t, threshold current $I_{th}$, and slope efficiency $S_e$ when M=1).

The results of the second measurement are stored in storage 194 by analyzer 193 in step S4 shown in FIG. 3.

Next, setter 191 sets semiconductor laser element 120 with a number n=n+1, which represents the number next to number n (step S506). Specifically, setter 191 sets semiconductor laser element 120 with a number n=2, which is the number next to n=1.

Next, controller 192 determines whether number n set by setter 191 in step S506 satisfies n>N, or in other words, whether number n set by setter 191 in step S506 exceeds the largest value of the numbers assigned to N semiconductor laser elements 120 of light source device 100 (step S507).

If it is determined that number n does not satisfy n>N (No in step S507), controller 192 returns the processing to step S502. Setter 191, controller 192, and analyzer 193 repeat the processing from step S502 to step S507, and thereby create data tables 341 and 342 for N semiconductor laser elements 120 in which the results of measurement for each inspection number M are contained (see FIG. 7).

On the other hand, if it is determined that number n satisfies n>N (Yes in step S507), controller 192 determines that the data tables (for example, data tables 340, 341, and 342 shown in FIG. 7) of N semiconductor laser elements 120 in which the results of measurement for each inspection number M are contained have been stored in storage 194, and ends the processing.

FIG. 7 shows an example of data tables 340, 341, and 342 stored in light source device 100 according to Embodiment 1.

As shown in FIG. 7, for example, data table 340 includes cumulative operating time t, threshold current $I_{th}$, and slope efficiency $S_e$ of semiconductor laser element 120 with a number n=1 for each inspection number M from 0 to 12 (from M=0 to M=12). Analyzer 193 stores the data tables of all semiconductor laser elements 120 (in the present embodiment, N semiconductor laser elements 120).

Figure 8:
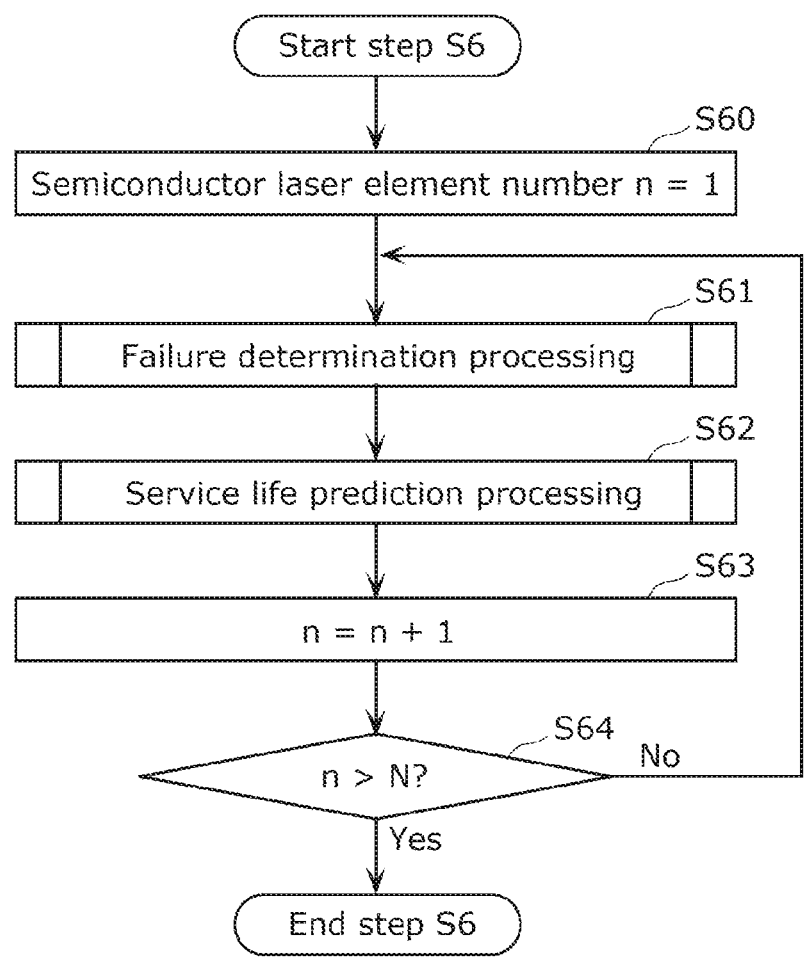
FIG. 8 is a flowchart illustrating degradation determination processing executed by the light source device according to Embodiment 1 in detail.

FIG. 8 is a flowchart illustrating the degradation determination processing (step S6) executed by light source device 100 according to Embodiment 1 in detail.

First, setter 191 selects, from among N semiconductor laser elements 120, semiconductor laser element 120 with a number n=1, and sets the selected semiconductor laser element (step S60).

Next, determiner 195 executes failure determination processing for each of semiconductor laser element 120 with a number n=1 and first optical element 131 (step S61). Specifically, in step S61, determiner 195 determines, based on the data table stored in storage 194, whether a failure has occurred in semiconductor laser element 120 with a number n=1 and first optical element 131.

Next, determiner 195 executes service life prediction processing for each of semiconductor laser element 120 with a number n=1 and first optical element 131 (step S62). Specifically, in step S62, determiner 195 calculates the service life of each of semiconductor laser element 120 with a number n=1 and first optical element 131, based on the data table stored in storage 194.

That is, in steps S61 and S62, determiner 195 calculates the degree of degradation of semiconductor laser element 120 with a number n=1 and the degree of degradation of first optical element 131.

Next, setter 191 sets semiconductor laser element 120 with a number n=n+1, which represents the number next to number n (step S63). Specifically, setter 191 sets semiconductor laser element 120 with a number n=2, which is the number next to n=1.

Next, determiner 195 determines whether number n set by setter 191 in step S63 satisfies n>N, or in other words, number n exceeds the largest value of the numbers assigned to N semiconductor laser elements 120 of light source device 100 (step S64).

If it is determined by controller 192 that number n does not satisfy n>N (No in step S64), determiner 195 returns the processing to step S61. Setter 191, controller 192, and determiner 195 repeat the processing from step S61 to step S64, and thereby determine the degree of degradation of each of N semiconductor laser elements 120 and the degree of degradation of first optical element 131.

On the other hand, if it is determined by controller 192 that number n satisfies n>N (Yes in step S64), determiner 195 determines that the degree of degradation has been determined for N semiconductor laser elements 120 and first optical element 131, and ends the processing.

Figure 9:
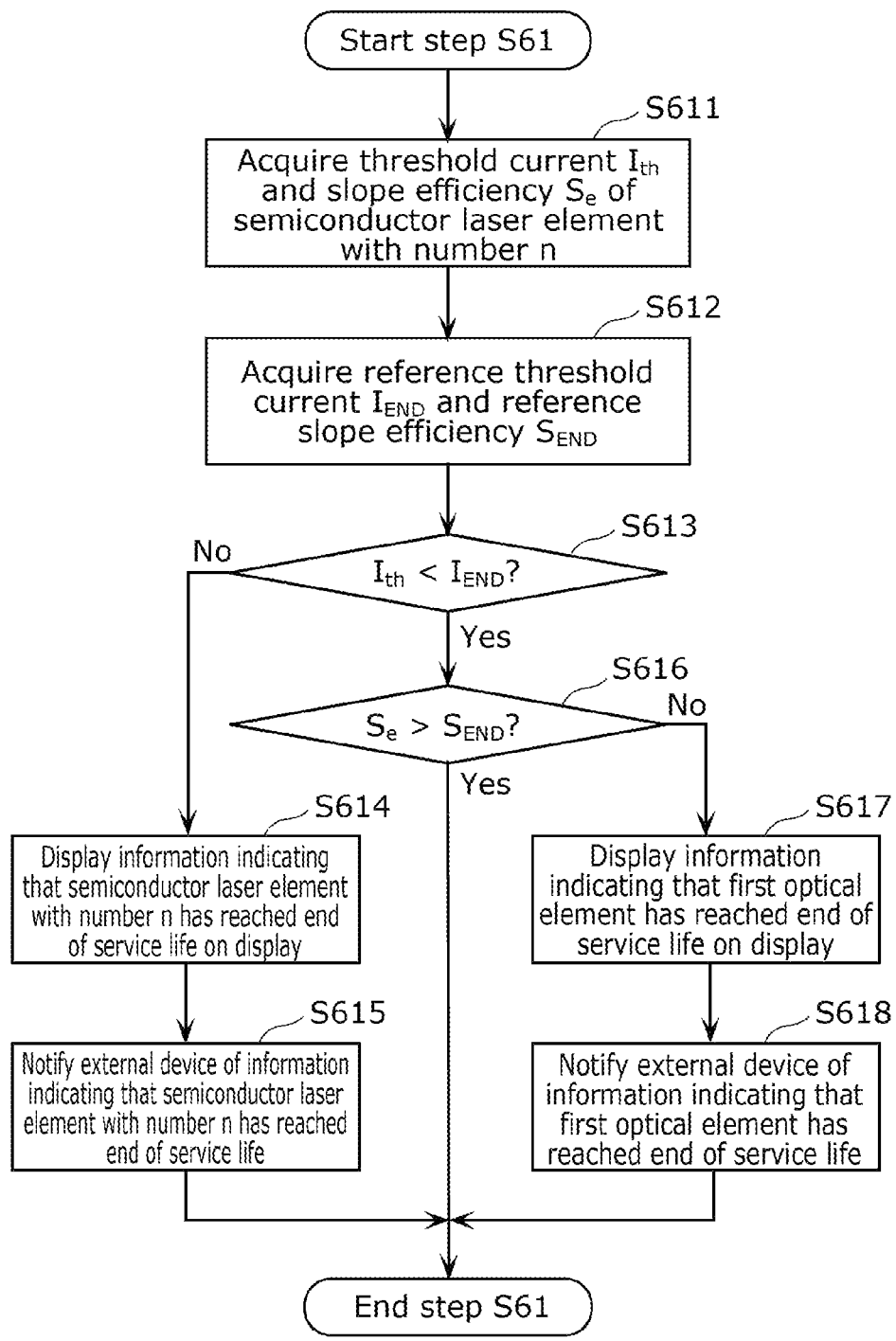
FIG. 9 is a flowchart illustrating failure determination processing executed by the light source device according to Embodiment 1 in detail.

FIG. 9 is a flowchart illustrating the failure determination processing (step S61) executed by light source device 100 according to Embodiment 1 in detail.

First, determiner 195 acquires, from storage 194, threshold current $I_{th}$ and slope efficiency $S_e$ of semiconductor laser element 120 with a number n (step S611). In step S61, for example, determiner 195 acquires threshold current $I_{th}$ and slope efficiency $S_e$ of the highest inspection number M.

Next, determiner 195 acquires reference threshold current $I_{END}$ and reference slope efficiency $S_{END}$ that are the determination criteria data for determining the service life of semiconductor laser element 120 with a number n (step S612).

Next, determiner 195 determines whether threshold current $I_{th}$<reference threshold current $I_{END}$ is satisfied (step S613).

If it is determined that threshold current $I_{th}$<reference threshold current $I_{END}$ is not satisfied (No in step S613), determiner 195 displays, on display 210, information indicating that semiconductor laser element 120 with a number n has reached the end of the service life (step S614). In step S614, for example, determiner 195 transmits the information indicating that semiconductor laser element 120 with a number n has reached the end of the service life to display device 200 via communicator 196. For example, when controller 240 of display device 200 receives, from processor 190, the information indicating that semiconductor laser element 120 with a number n has reached the end of the service life via communicator 220, controller 240 of display device 200 controls display 210 to display an image indicating that semiconductor laser element 120 with a number n has reached the end of the service life.

Also, determiner 195 notifies external device 300 of the information indicating that semiconductor laser element 120 with a number n has reached the end of the service life (step S615). In step S615, for example, determiner 195 transmits the information indicating that semiconductor laser element 120 with a number n has reached the end of the service life to external device 300 via communicator 196.

External device 300 is, for example, a device operated by the user who performs maintenance work on light source device 100. As a result of determiner 195 notifying external device 300 of the information that semiconductor laser element 120 with a number n has reached the end of the service life, the user who performs maintenance work on light source device 100 can soon be aware of the fact that semiconductor laser element 120 has reached the end of the service life.

Also, if it is determined that threshold current $I_{th}$<reference threshold current $I_{END}$ is satisfied (Yes in step S613), determiner 195 determines whether slope efficiency $S_e$>reference slope efficiency $S_{END}$ is satisfied (step S616).

If it is determined that slope efficiency $S_e$>reference slope efficiency $S_{END}$ is not satisfied (No in step S616), determiner 195 displays, on display 210, information indicating that first optical element 131 through which the laser light output from semiconductor laser element 120 with a number n passes has reached the end of the service life (step S617). In step S617, for example, determiner 195 transmits the information indicating that first optical element 131 has reached the end of the service life to display device 200 via communicator 196. For example, when controller 240 of display device 200 receives, from processor 190, the information indicating that first optical element 131 has reached the end of the service life via communicator 220, controller 240 of display device 200 controls display 210 to display an image indicating that first optical element 131 has reached the end of the service life.

Also, determiner 195 notifies external device 300 of the information indicating that first optical element 131 has reached the end of the service life (step S618). In step S618, for example, determiner 195 transmits the information indicating that first optical element 131 has reached the end of the service life to external device 300 via communicator 196.

If it is determined that slope efficiency $S_e$>reference slope efficiency $S_{END}$ is satisfied (Yes in step S616), determiner 195 determines that a failure has not occurred in either semiconductor laser element 120 with a number n or first optical element 131, and ends the processing.

Figure 10:
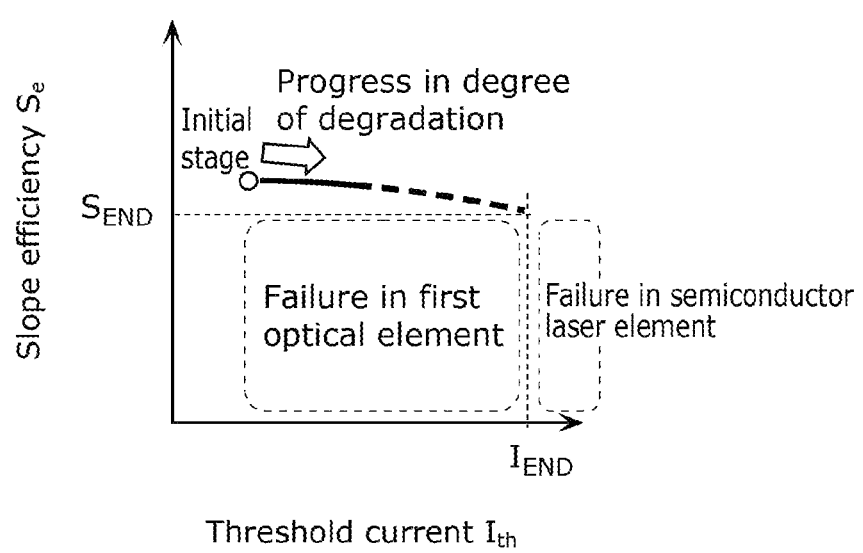
FIG. 10 is a graph showing an example of variation in slope efficiency relative to the value of threshold current in the light source device according to Embodiment 1.

FIG. 10 is a graph showing an example of variation in slope efficiency $S_e$ relative to the value of threshold current $I_{th}$ in light source device 100 according to Embodiment 1. The graph shown in FIG. 10 shows, for example, variation with time of threshold current $I_{th}$ and slope efficiency $S_e$ obtained by driving one of the plurality of semiconductor laser elements 120 included in light source device 100. Here, the correlation between threshold current $I_{th}$ and slope efficiency $S_e$ when only semiconductor laser element 120 has undergone degradation is shown. The correlation between threshold current $I_{th}$ and slope efficiency $S_e$ can be obtained in advance by performing an aging test by using a semiconductor laser element that has the same structure as and was produced in the same manner as semiconductor laser element 120 used. As described above, the degradation of first optical element 131 causes only slope efficiency $S_e$ to decrease. Accordingly, if slope efficiency $S_e$ drops and deviates from the correlation between threshold current $I_{th}$ and slope efficiency $S_e$ of semiconductor laser element 120, it is possible to determine that first optical element 131 has undergone degradation. Also, in the case of semiconductor laser element 120 that is made of a nitride semiconductor, it is often the case that semiconductor laser element 120 undergoes degradation with an increase in threshold current $I_{th}$ while slope efficiency $S_e$ little decreases. For this reason, the degradation of first optical element 131 with a decrease in slope efficiency $S_e$ is likely to be detected.

As shown in FIG. 10, it is assumed that slope efficiency $S_e$ decreases as threshold current $I_{th}$ increases in a direction indicated by a white arrow along with cumulative operating time t from the initial values (a circle shown in FIG. 10) of threshold current $I_{th}$ and slope efficiency $S_e$, or in other words, from threshold current $I_{th}$ and slope efficiency $S_e$ obtained when inspection number M=0.

Here, determiner 195 determines the degree of degradation of semiconductor laser element 120 based on the magnitude of threshold current $I_{th}$. For example, determiner 195 determines the degree of degradation of semiconductor laser element 120 in such a manner that, if threshold current $I_{th}$ is greater than reference threshold current $I_{END}$, determiner 195 determines that a failure has occurred in semiconductor laser element 120, and if threshold current $I_{th}$ is less than or equal to reference threshold current $I_{END}$, determiner 195 determines that a failure has not occurred in semiconductor laser element 120.

Also, if threshold current $I_{th}$ is less than or equal to reference threshold current $I_{END}$, determiner 195 determines the degree of degradation of first optical element 131 based on slope efficiency $S_e$. For example, determiner 195 determines the degree of degradation of first optical element 131 in such a manner that, if slope efficiency $S_e$ is greater than reference slope efficiency $S_{END}$, determiner 195 determines that a failure has not occurred in first optical element 131, and if slope efficiency $S_e$ is less than or equal to reference slope efficiency $S_{END}$, determiner 195 determines that a failure has occurred in first optical element 131.

Determiner 195 may determine the degree of degradation of semiconductor laser element 120 in such a manner that, if threshold current $I_{th}$ is greater than or equal to reference threshold current $I_{END}$, determiner 195 determines that a failure has occurred in semiconductor laser element 120, and if threshold current $I_{th}$ is less than reference threshold current $I_{END}$, determiner 195 determines that a failure has not occurred in semiconductor laser element 120. Likewise, determiner 195 may determine the degree of degradation of first optical element 131 in such a manner that, for example, if slope efficiency $S_e$ is greater than or equal to reference slope efficiency $S_{END}$, determiner 195 determines that a failure has not occurred in first optical element 131, and if slope efficiency $S_e$ is less than reference slope efficiency $S_{END}$, determiner 195 determines that a failure has occurred in first optical element 131.

Figure 11:
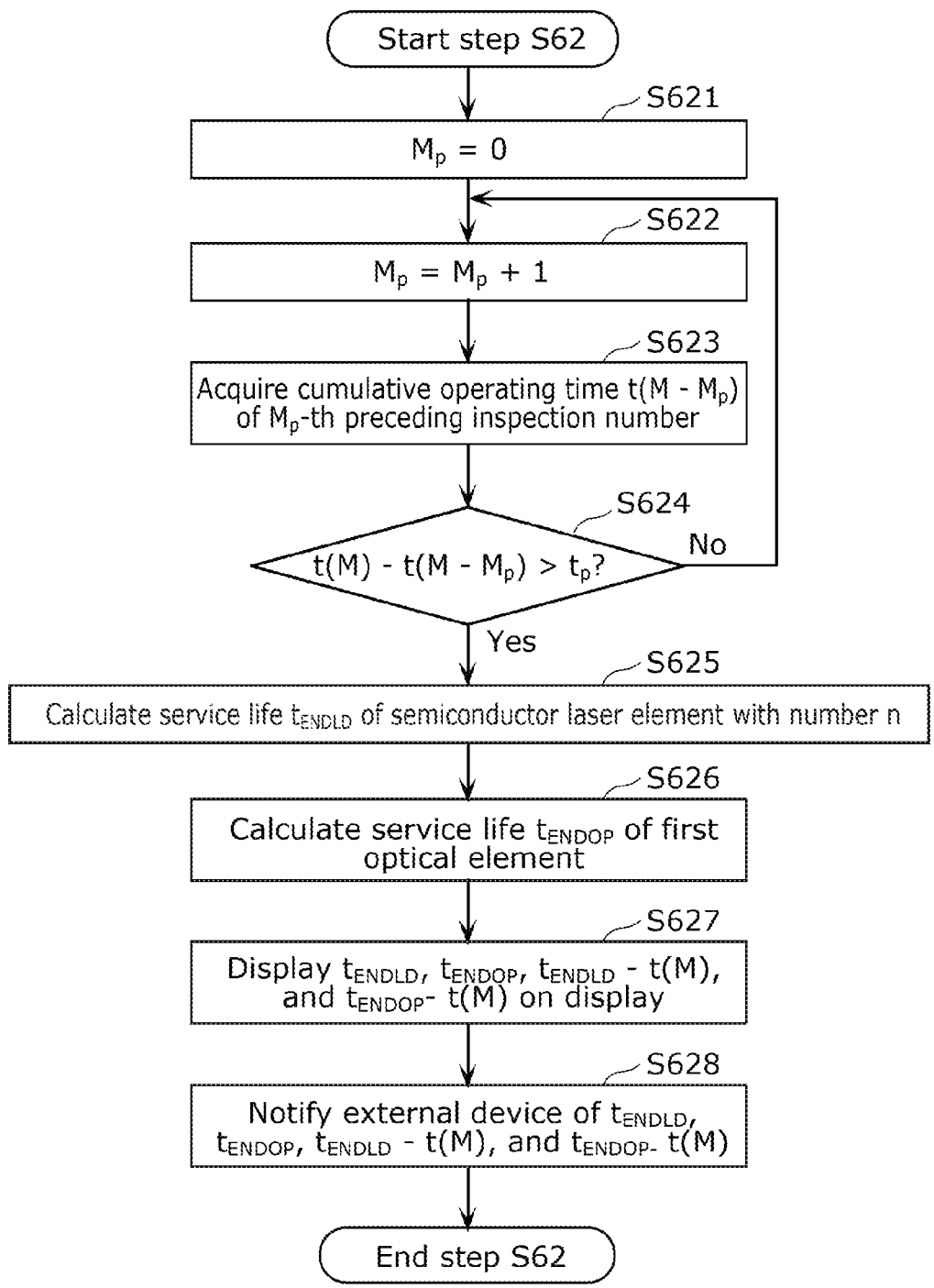
FIG. 11 is a flowchart illustrating service life prediction processing executed by the light source device according to Embodiment 1 in detail.

FIG. 11 is a flowchart illustrating the service life prediction processing (step S62) executed by light source device 100 according to Embodiment 1 in detail.

First, determiner 195 determines to which inspection number it needs to look back to perform service life prediction. $M_p$ in step S621 indicates how many numbers determiner 195 needs to look back from the latest inspection number. In the actual device, the usage conditions of semiconductor laser elements 120, or in other words, the light outputs of semiconductor laser elements 120 are not uniform, and thus the degree of degradation of each semiconductor laser element 120 and the degree of degradation of first optical element 131 do not proceed uniformly with time. A too long or too short service life may be predicted if the period of inspection data used to perform service life prediction on semiconductor laser element 120 and first optical element 131, represented by $t_p$, is too short. A relatively long period of time such as, for example, 500 hours or more has been set in advance as $t_p$ that represents the period of inspection data used to perform service life prediction.

In the present embodiment, $t_p$ that represents the period of inspection data used to perform service life prediction has been set to be 500 hours and stored in storage 194 in advance. If the inspection number that includes the time indicated by $t_p$ is not found, reference may be made to the inspection number that includes the time that is closest to the time indicated by $t_p$ and satisfies $t_p$>500 hours.

First, determiner 195 substitutes 0 as the initial value of $M_p$ (step S621).

Next, determiner 195 performs the following calculation: $M_p=M_p+1$ (step S622).

Next, determiner 195 acquires, from storage 194, cumulative operating time $t(M-M_p)$ included in $M_p$-th preceding inspection number (or in other words, inspection number $M-M_p$) from inspection number M for which latest threshold current $I_{th}$ and the like are stored (step S623).

Next, determiner 195 determines whether $t(M)-t(M-M_p)>t_p$ is satisfied (step S624).

Here, t(M) represents the cumulative operating time included in inspection number M.

If it is determined that $t(M)-t(M-M_p)>t_p$ is not satisfied (No in step S624), determiner 195 returns the processing to step S622, and repeatedly executes the processing from step S622 to step S624. By doing so, determiner 195 determines inspection number $M-M_p$ that includes cumulative operating time t that satisfies $t(M)-t(M-M_p)>t_p$.

Also, if it is determined that $t(M)-t(M-M_p)>t_p$ is satisfied (Yes in step S624), determiner 195 calculates service life $t_{ENDLD}$ of semiconductor laser element 120 with a number n (step S625).

Service life $t_{ENDLD}$ is calculated by Equation (1) given below.

[Math. 1]

$$t_{ENDLD} = \frac{I_{END} - I_{th}(M)}{I_{th}(M) - I_{th}(M-M_p)} \times \{t(M) - t(M-M_p)\} + t(M-M_p) \quad \text{Equation (1)}$$

Here, $I_{th}(M)$ represents threshold current $I_{th}$ included in inspection number M. $I_{th}(M-M_p)$ represents threshold current $I_{th}$ included in inspection number $M-M_p$.

Next, determiner 195 calculates service life $t_{ENDOP}$ of first optical element 131 located downstream of semiconductor laser element 120 with a number n (step S626).

Service life $t_{ENDOP}$ is calculated by Equation (2) given below.

[Math. 2]

$$t_{ENDOP} = \frac{S_{END} - S_e(M)}{S_e(M) - S_e(M - M_p)} \times \{t(M) - t(M - M_p)\} + t(M - M_p) \quad \text{Equation (2)}$$

Here, $S_e(M)$ represents slope efficiency $S_e$ included in inspection number M. Likewise, $S_e(M-M_p)$ represents slope efficiency $S_e$ included in inspection number $M-M_p$.

Next, determiner 195 displays, on display 210, $t_{ENDLD}$, $t_{ENDOP}$, $t_{ENDLD}-t(M)$, and $t_{ENDOP}-t(M)$ (step S627). In step S627, for example, determiner 195 transmits $t_{ENDLD}$, $t_{ENDOP}$, $t_{ENDLD}-t(M)$, and $t_{ENDOP}-t(M)$ to display device 200 via communicator 196. For example, upon receiving $t_{ENDLD}$, $t_{ENDOP}$, $t_{ENDLD}-t(M)$, and $t_{ENDOP}-t(M)$ from processor 190 via communicator 220, controller 240 of display device 200 controls display 210 to display an image indicating $t_{ENDLD}$, $t_{ENDOP}$, $t_{ENDLD}-t(M)$, and $t_{ENDOP}-t(M)$.

Also, determiner 195 notifies external device 300 of $t_{ENDLD}$, $t_{ENDOP}$, $t_{ENDLD}-t(M)$, and $t_{ENDOP}-t(M)$ (step S628). In step S628, for example, determiner 195 transmits $t_{ENDLD}$, $t_{ENDOP}$, $t_{ENDLD}-t(M)$, and $t_{ENDOP}-t(M)$ to external device 300 via communicator 196.

Figure 12:
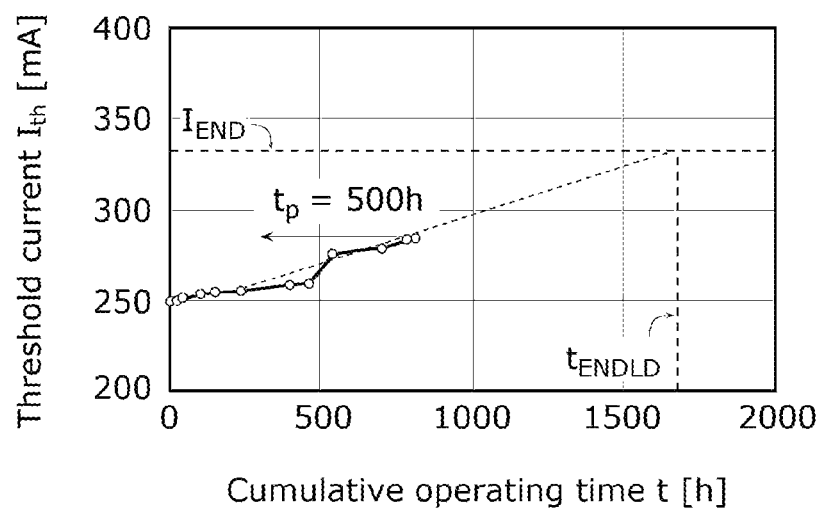
FIG. 12 is a graph showing an example of an increase in the value of threshold current for driving the semiconductor laser element included in the light source device according to Embodiment 1 relative to cumulative operating time.
Figure 13:
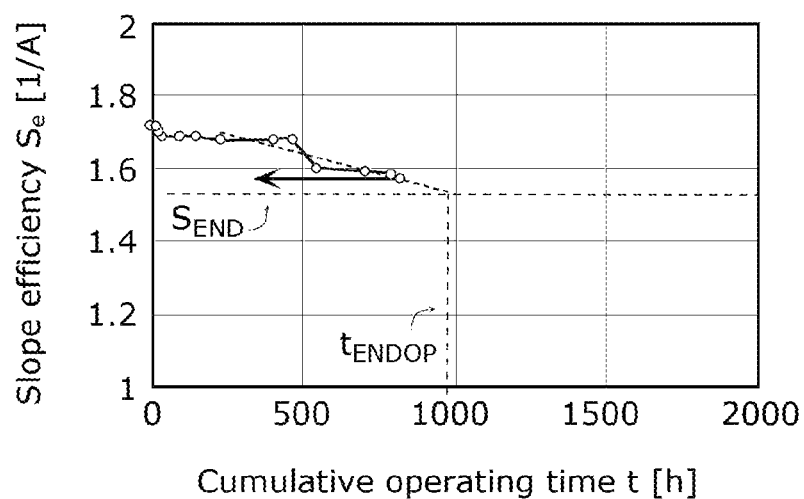
FIG. 13 is a graph showing an example of a decrease in slope efficiency of the semiconductor laser element included in the light source device according to Embodiment 1 relative to cumulative operating time.

FIG. 12 is a graph showing an example of an increase in the value of threshold current $I_{th}$ of semiconductor laser element 120 included in light source device 100 according to Embodiment 1 relative to cumulative operating time t. FIG. 13 is a graph showing an example of a decrease in slope efficiency $S_e$ of semiconductor laser element 120 included in light source device 100 according to Embodiment 1 relative to cumulative operating time t. For example, FIG. 12 shows data obtained when semiconductor laser element 120 with a number n was driven.

As shown in FIG. 12, determiner 195 calculates the service life $t_{ENDLD}$ of semiconductor laser element 120 from Equation (1) given above using, for example, the difference between threshold current $I_{th}(M-M_p)$ of inspection number $M-M_p$ and threshold current $I_{th}(M)$ of latest inspection number M, and reference threshold current $I_{END}$. Also, determiner 195 calculates, from calculated service life $t_{ENDLD}$, $t_{ENDLD}-t(M)$ that is the time remaining until the end of the service life is reached (or in other words, the time taken until it is determined that a failure has occurred in semiconductor laser element 120) if it is determined that semiconductor laser element 120 has not reached the end of the service life.

Also, as shown in FIG. 13, determiner 195 calculates service life $t_{ENDOP}$ of first optical element 131 that is disposed downstream of semiconductor laser element 120 with a number n from Equation (2) given above using, for example, the difference between slope efficiency $S_e(M-M_p)$ of inspection number $M-M_p$ and slope efficiency $S_e(M)$ of latest inspection number M, and reference slope efficiency $S_{END}$. Also, determiner 195 calculates, from calculated service life $t_{ENDOP}$, $t_{ENDOP}-t(M)$ that is the time remaining until the end of the service life is reached (or in other words, the time taken until it is determined that a failure has occurred in first optical element 131) if it is determined that first optical element 131 that is disposed downstream of semiconductor laser element 120 with a number n has not reached the end of the service life.

In the example shown in FIGS. 12 and 13, semiconductor laser element 120 and first optical element 131 are both degraded. It is predicted that first optical element 131 will be determined as having a failure when cumulative operating time t reaches about 1,000 hours, which is faster than when semiconductor laser element 120 will be determined as having a failure. Furthermore, it is also predicted that semiconductor laser element 120 will be determined as having a failure when cumulative operating time t reaches about 1,700 hours. If first optical element 131 does not degrade at all, only semiconductor laser element 120 degrades. In this case, the time required for slope efficiency $S_e$ shown in FIG. 13 to reach reference slope efficiency $S_{END}$ should also be about 1,700 hours. That is, threshold current $I_{th}$ and slope efficiency $S_e$ respectively reach reference threshold current $I_{END}$ and reference slope efficiency $S_{END}$ when semiconductor laser element 120 reaches the end of the service life.

Figure 14:
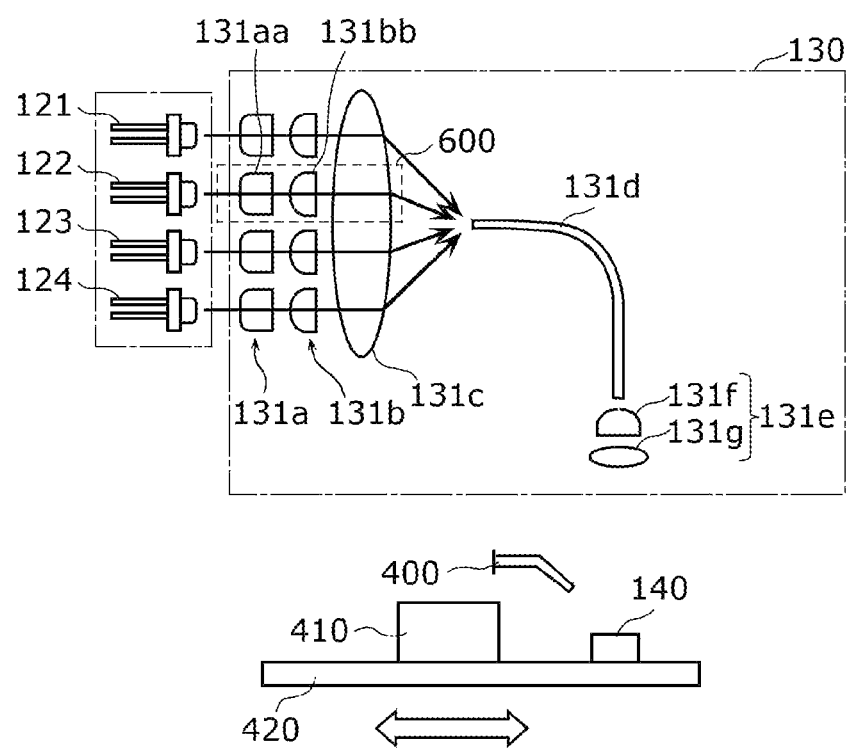
FIG. 14 is a schematic diagram illustrating a degraded portion in the first optical element in an example of the light source device according to Embodiment 1.

FIG. 14 is a schematic diagram illustrating degraded portion 600 of first optical element 131 in an example of light source device 100 according to Embodiment 1. Each of semiconductor laser elements 121, 122, 123, and 124 shown in FIG. 14 is an example of semiconductor laser element 120 shown in FIG. 1. Also, in FIG. 14, a collimating lens that is one of a plurality of collimating lenses included in collimating lens 131a that is disposed downstream of semiconductor laser element 122 will be referred to as "collimating lens 131aa". Likewise, in FIG. 14, a collimating lens that is one of a plurality of collimating lenses included in collimating lens 131b that is disposed downstream of semiconductor laser element 122 will be referred to as "collimating lens 131bb".

For example, it is assumed that determiner 195 determines, based on the results of threshold current $I_{th}$ and slope efficiency $S_e$ when semiconductor laser element 122 was driven, that a failure has occurred in first optical element 131 that is disposed downstream of semiconductor laser element 122. In this case, determiner 195 can determine that a failure has occurred in any one of degraded portion 600, optical fiber 131d, collimating lens 131f, or condensing lens 131g, degraded portion 600 including portions of collimating lens 131aa, collimating lens 131bb, and condensing lens 131c that are located downstream of semiconductor laser element 122, are included in optical system 130, and are examples of structural elements of first optical element 131 (or in other words, portions through which the laser light output from semiconductor laser element 122 passes).

[Advantageous Effects, etc.]

As described above, light source device 100 according to Embodiment 1 includes: semiconductor laser element 120; optical system 130 that includes first optical element 131 through which emission light 500 emitted from semiconductor laser element 120 propagates; first light receiver 140 that receives first propagating light 510a that has propagated through at least a portion of first optical element 131; laser driving controller 192a that controls a driving current for driving semiconductor laser element 120; and measurement circuit 180 that measures a first output value that indicates a received-light intensity of first propagating light 510a received by first light receiver 140. First light receiver 140 is disposed downstream of first optical element 131. Laser driving controller 192a drives semiconductor laser element 120 using a plurality of values of the driving current that are different from each other. Measurement circuit 180 measures the first output value of first propagating light 510a received by first light receiver 140 for each of the plurality of values of the driving current that are different from each other.

With the configuration described above, threshold current $I_{th}$ and slope efficiency $S_e$ may be calculated based on at least two driving current values and light outputs that correspond to the two driving current values. For this reason, for example, if reference threshold current $I_{END}$ and reference slope efficiency $S_{END}$ are arbitrarily set in advance based on threshold current $I_{th}$ and slope efficiency $S_e$ that were calculated, by using the graph shown in FIG. 10, the degree of degradation of optical system 130 (specifically, first optical element 131) and the degree of degradation of semiconductor laser element 120 can be determined. Accordingly, with light source device 100, it is possible to distinctively determine whether a decrease in the light output from light source device 100 is caused by a variation in the light output due to degradation of optical system 130 (specifically, first optical element 131) that is disposed upstream of first light receiver 140 or is caused by a variation in the light output due to degradation of semiconductor laser element 120.

Also, for example, first light receiver 140 is disposed downstream of optical system 130.

With the configuration described above, for example, in the case where optical system 130 includes a plurality of first optical elements 131, it is possible to determine the degree of degradation of each of all first optical elements 131 of optical system 130 that are disposed between semiconductor laser element 120 and first light receiver 140, and the degree of degradation of semiconductor laser element 120.

Also, for example, first optical element 131 includes at least one of a lens, a mirror, or an optical wave guide.

That is, first optical element 131 may be an element that can perform control of the distribution of laser light emitted from semiconductor laser element 120, wavelength combining processing, waveguide, and the like. With light source device 100, it is possible to make a distinction between a variation in the light output due to degradation of optical system 130 and a variation in the light output due to degradation of semiconductor laser element 120.

Also, for example, first light receiver 140 receives first propagating light 510*a* at a position displaced from the focal point of first propagating light 510*a* on the light receiving surface of first light receiver 140, first propagating light 510*a* being obtained as a result of emission light 500 being condensed by first optical element 131.

With the configuration described above, it is possible to prevent a portion where the laser light is concentrated excessively from being formed in the light receiving surface of first light receiver 140. Accordingly, it is unlikely that a failure occurs in first light receiver 140.

Also, for example, the driving current value that corresponds to first propagating light 510*a* received by first light receiver 140 is smaller than the rated driving current value.

For example, in order to calculate threshold current $I_{th}$ and slope efficiency $S_e$, it is sufficient that semiconductor laser element 120 performs laser oscillation, and a high light output is unnecessary. For this reason, with the configuration described above, first light receiver 140 is unlikely to be irradiated with laser light at a high light output. Accordingly, it is more unlikely that a failure occurs in first light receiver 140.

Also, for example, light source device 100 further includes temperature adjuster 150 that adjusts the temperature of semiconductor laser element 120. Also, light source device 100 further includes temperature adjustment controller 192*b* that controls temperature adjuster 150. In this case, temperature adjustment controller 192*a* controls the temperature of semiconductor laser element 120 by controlling temperature adjuster 150. For example, the temperature of semiconductor laser element 120 is controlled to be within a range of ±5° C. of a reference temperature by temperature adjustment controller 192*b* controlling temperature adjuster 150 when measurement circuit 180 measures the first output value, the reference temperature being a temperature that has been set in advance.

It is known that slope efficiency $S_e$ is temperature dependent. For this reason, with the configuration described above, the temperature of semiconductor laser element 120 can be set to a value close to the reference temperature. By doing so, slope efficiency $S_e$ can be calculated with even higher accuracy.

Also, for example, light source device 100 further includes determiner 195 that determines the degree of degradation of first optical element 131. Determiner 195 determines the degree of degradation of first optical element 131 based on, for example, the plurality of driving current values that are different from each other and the first output value of first propagating light 510*a* that has been received by first light receiver 140 for each of the plurality of driving current values that are different from each other. That is, determiner 195 determines the degree of degradation of first optical element 131 based on threshold current $I_{th}$ and slope efficiency $S_e$ that were calculated by analyzer 193.

With the configuration described above, for example, the degree of degradation of first optical element 131 can be determined by determiner 195 of light source device 100, without causing external device 300 or the like to determine the degree of degradation of first optical element 131.

Also, for example, determiner 195 determines the degree of degradation of first optical element 131 based on ΔPom/ΔIf (or in other words, slope efficiency $S_e$), where ΔIf represents the amount of variation between two driving current values out of the plurality of driving current values that are different from each other, and ΔPom represents the amount of variation between the first output values of first propagating light 510*a* that has been received by first light receiver 140 that correspond to the two driving current values.

With the configuration described above, determiner 195 can determine the degree of degradation of first optical element 131 based on slope efficiency $S_e$.

Also, for example, determiner 195 calculates the amount of variation with time in the value of threshold current $I_{th}$ at which semiconductor laser element 120 performs laser oscillation, calculates service life $t_{ENDLD}$ of semiconductor laser element 120 by using the calculated amount of variation in threshold current $I_{th}$, and determines the degree of degradation of first optical element 131.

With the configuration described above, determiner 195 can determine the degree of degradation of first optical element 131 based on the amount of variation in the value of threshold current $I_{th}$ distinctively from the degree of degradation of semiconductor laser element 120.

Also, for example, an inspection mode and an operation mode are performed repeatedly, the inspection mode being a mode in which determiner 195 determines the degree of degradation of first optical element 131 and calculates the service life of semiconductor laser element 120 by causing first light receiver 140 to receive first propagating light 510*a* that has propagated through first optical element 131, and the operation mode being a mode in which irradiation target 410 is irradiated with first propagating light 510*b* that has propagated through first optical element 131.

With the configuration described above, determiner 195 can determine the degree of degradation of semiconductor laser element 120 and the degree of degradation of first optical element 131 by utilizing, for example, a time period in which irradiation target 410 is not irradiated with laser light.

Also, for example, determiner 195 transmits the calculated service life of semiconductor laser element 120 to external device 300.

With the configuration described above, it is possible to notify a user who uses external device 300 and performs maintenance work on light source device 100 of whether it is necessary to perform maintenance work on semiconductor laser element 120 of light source device 100. Also, for example, the user can know, from the service life of semiconductor laser element 120, when maintenance work needs to be performed on semiconductor laser element 120.

Also, for example, determiner 195 transmits the determined degree of degradation of first optical element 131 to external device 300.

With the configuration described above, it is possible to notify the user who uses external device 300 and performs maintenance work on light source device 100 of whether it is necessary to perform maintenance work on first optical element 131 of light source device 100.

Also, for example, determiner 195 calculates at least one of cumulative operating time t taken until it is determined that a failure has occurred in first optical element 131 or the time taken until it is determined that a failure has occurred in first optical element 131 based on $\Delta Pom/\Delta If$, where $\Delta If$ represents the amount of variation between two driving current values out of the plurality of driving current values that are different from each other, and $\Delta Pom$ represents the amount of variation between a plurality of first output values of first propagating light 510a that has been received by first light receiver 140 that correspond to the two driving current values.

With the configuration described above, for example, by notifying the user who uses external device 300 and performs maintenance work on light source device 100 of at least one of cumulative operating time t taken until it is determined that a failure has occurred in first optical element 131 or the time taken until it is determined that a failure has occurred in first optical element 131, the user who uses external device 300 can know when maintenance work needs to be performed on light source device 100. For this reason, the user can easily set, for example, a schedule for maintenance work on light source device 100 before the light output of light source device 100 drops significantly.

Also, for example, determiner 195 transmits the calculated time taken until it is determined that a failure has occurred in first optical element 131 to external device 300.

With the configuration described above, the user who uses external device 300 and performs maintenance work on light source device 100 can know when maintenance work needs to be performed on first optical element 131 of light source device 100.

Also, for example, light source device 100 includes a plurality of semiconductor laser elements 120. In this case, for example, laser driving controller 192a drives the plurality of semiconductor laser elements 120 at different timings. Also, for example, first light receiver 140 receives at least a portion of first propagating light 510a for each of the plurality of semiconductor laser elements 120 driven at different timings. Measurement circuit 180 measures the first output value of first propagating light 510a that has been received by first light receiver 140 for each of the plurality of driving current values for driving the plurality of semiconductor laser elements 120 that are different from each other.

With the configuration described above, determiner 195 can distinctively determine the degree of degradation of each of the plurality of semiconductor laser elements 120 and the degree of degradation of first optical element 131 disposed downstream of each of the plurality of semiconductor laser elements 120.

Also, for example, each semiconductor laser element 120 is made of a nitride semiconductor. Semiconductor laser element 120 that is made of a nitride semiconductor is likely to degrade, and it is therefore practically effective to determine the degree of degradation.

Also, for example, the wavelength of emission light 500 is 500 nm or less.

Optical system 130 is likely to degrade particularly when the wavelength of emission light 500 is short (or in other words, when the energy of one photon is large). For this reason, particularly when semiconductor laser element 120 emits light with a low wavelength such as emission light 500 with a wavelength of 500 nm or less, it is effective to make a distinction between a variation in the light output due to degradation of optical system 130 and a variation in the light output due to degradation of semiconductor laser element 120, which is performed by light source device 100 according to the present disclosure.

Embodiment 2

Next, a light source device according to Embodiment 2 will be described. The description of the light source device according to Embodiment 2 will be given focusing on differences from light source device 100 according to Embodiment 1, and thus structural elements that are the same as those of light source device 100 according to Embodiment 1 are given the same reference numerals, and a description thereof may be omitted or simplified.

[Configuration]

First, the configuration of the light source device according to Embodiment 2 will be described with reference to FIGS. 15 to 17.

Figure 15:
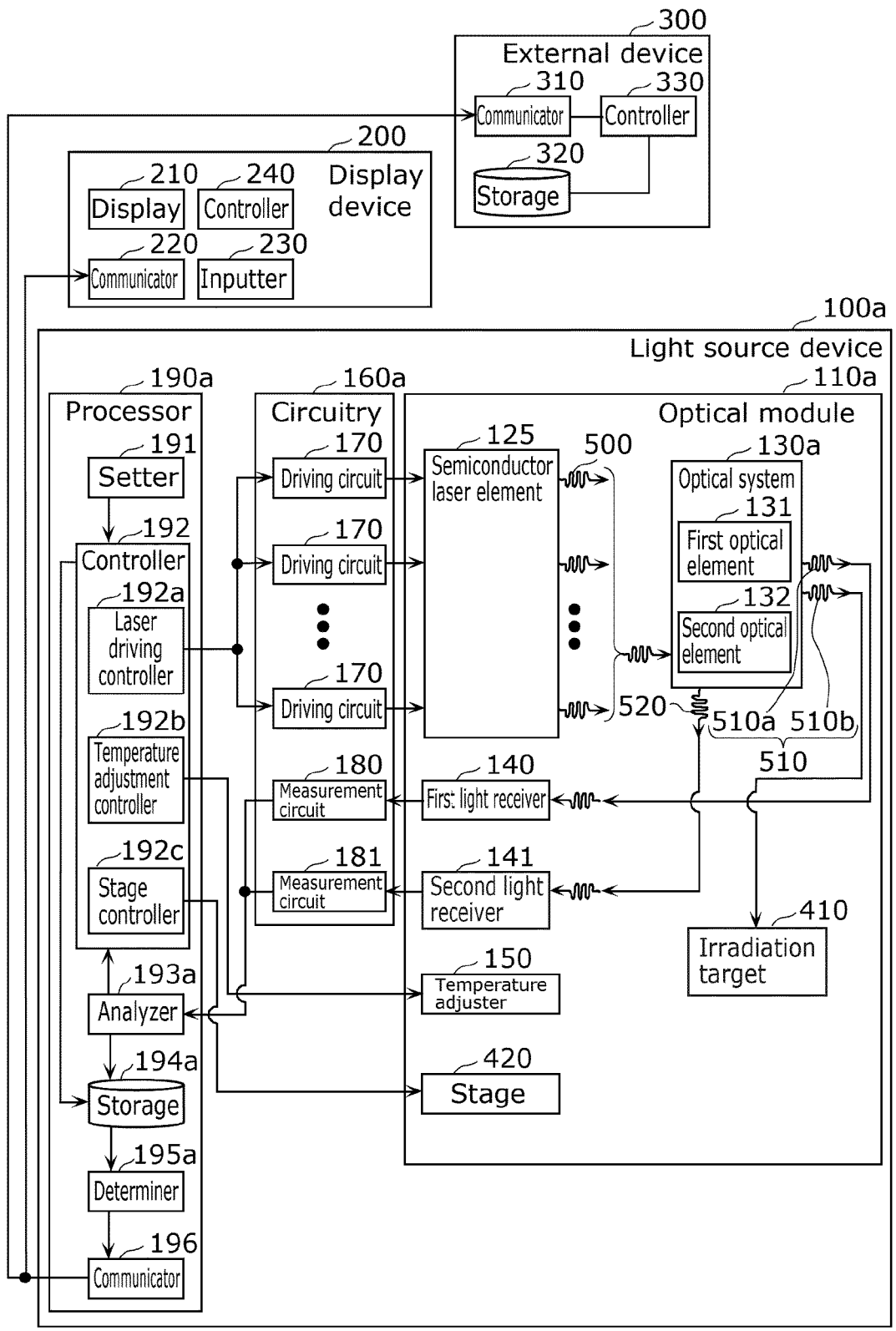
FIG. 15 is a block diagram showing a characteristic functional configuration of a light source device according to Embodiment 2.
Figure 16:
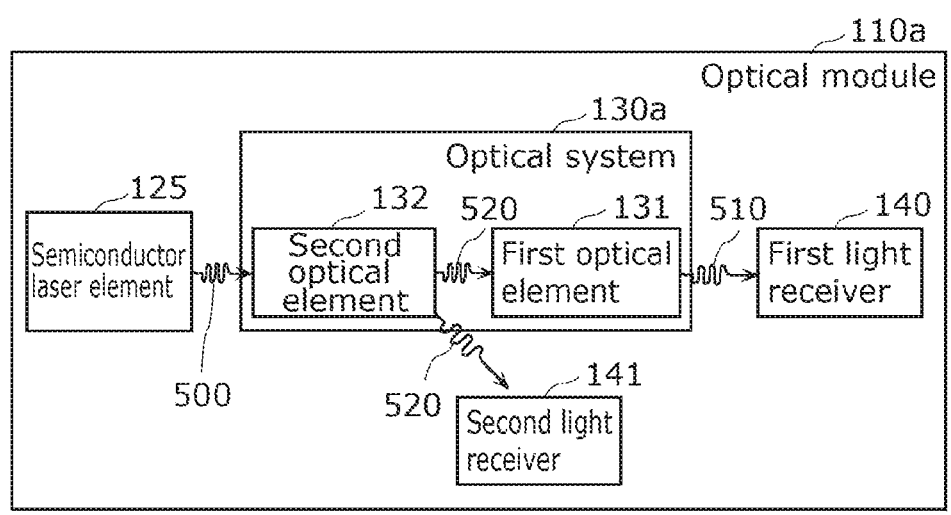
FIG. 16 is a block diagram illustrating an optical module included in the light source device according to Embodiment 2 in detail.

FIG. 15 is a block diagram showing a characteristic functional configuration of light source device 100a according to Embodiment 2. FIG. 16 is a block diagram illustrating optical module 110a included in light source device 100a according to Embodiment 2 in detail. FIG. 17 is a schematic diagram schematically showing an example of light source device 100a according to Embodiment 2.

Light source device 100a is a device that outputs laser light. Light source device 100a is used in, for example, a laser processing machine that processes irradiation target 410 shown in FIG. 17 using laser light. FIG. 17 shows an example in which light source device 100a includes a plurality of light emission points, or in other words, light source device 100a includes one semiconductor laser element (semiconductor laser array element) 125 that outputs laser light beams in the same direction from a plurality of positions. In the present embodiment, semiconductor laser element 125 includes four light emission points. Of course, there is no particular limitation on the number of light emission points included in semiconductor laser element 125.

As shown in FIG. 15, light source device 100a includes optical module 110a, circuitry 160a, and processor 190a.

Optical module 110a is a light source that outputs laser light. Optical module 110 includes semiconductor laser element 125, optical system 130*a*, first light receiver 140, second light receiver 141, temperature adjuster 150, and stage 420.

Semiconductor laser element 125 is a semiconductor element that outputs laser light. There is no particular limitation on the number of light emission points included in semiconductor laser element 125, and the number of light emission points may be 1 or more. In the present embodiment, optical module 110*a* includes one semiconductor laser element 125 that includes N light emission points. FIG. 17 shows an example in which semiconductor laser element 125 includes four light emission points. Also, the plurality of light emission points are connected to driving circuit 170 such that the light emission points can be each independently driven.

The laser light (emission light) output by semiconductor laser element 125 has a wavelength of, for example, 500 nm or less. Semiconductor laser element 125 is made of, for example, a nitride semiconductor.

Semiconductor laser element 125 outputs laser light toward optical system 130*a*.

Optical system 130*a* controls the distribution of laser light beams output from semiconductor laser element 125. Specifically, optical system 130*a* performs, on the laser light beams output from semiconductor laser element 125, collimation processing, wavelength combining processing, condensation processing, and the like, and outputs laser light beams with a controlled distribution toward irradiation target 410 or first light receiver 140.

Optical system 130*a* includes first optical element 131 and second optical element 132. Specifically, optical system 130*a* includes second optical element 132 that is disposed upstream of first optical element 131.

Second optical element 132 allows emission light 500 emitted from semiconductor laser element 125 to propagate therethrough. Second optical element 132 controls, for example, the distribution, the propagation, and the like of laser light beams output from semiconductor laser element 125. Second optical element 132 includes at least one of a lens, a mirror, or an optical wave guide. FIG. 17 shows collimating lenses 132*a* and 132*b*, and condensing lens 132*c* as examples of structural elements of second optical element 132.

Figure 17:
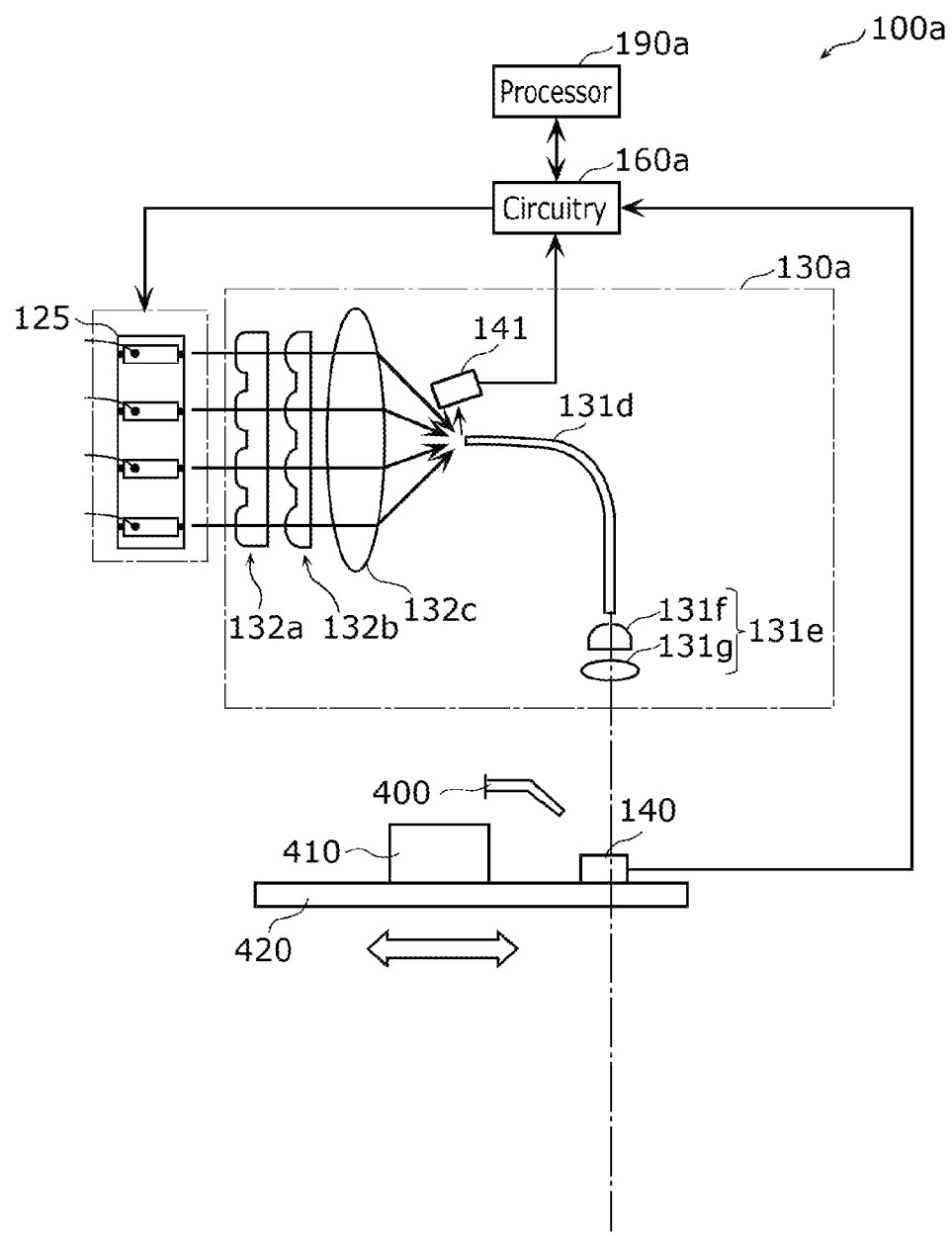
FIG. 17 is a schematic diagram schematically showing an example of the light source device according to Embodiment 2.

As shown in FIG. 17, collimating lenses 132*a* and 132*b* are formed integrally as a lens array. First optical element 131 and second optical element 132 used in optical system 130*a* may have any shape.

Second optical element 132 emits second propagating light 520 toward first optical element 131.

First optical element 131 allows second propagating light 520 to propagate therethrough and emits first propagating light 510*a* toward first light receiver 140 and first propagating light 510*b* toward irradiation target 410.

Second light receiver 141 is an optical sensor that receives second propagating light 520 that has propagated through at least a portion of second optical element 132. As shown in FIG. 16, second light receiver 141 detects a portion of second propagating light 520 emitted from second optical element 132 toward first optical element 131. As described above, second light receiver 141 receives second propagating light 520 that is light that has propagated through second optical element 132 before entering first optical element 131. Second light receiver 141 is connected to circuitry 160*a* by a control line, and outputs detected output values (analog values) to circuitry 160*a*. Specifically, second light receiver 141 is connected to measurement circuit (received-light intensity measurer) 181 included in circuitry 160*a* by a control line, and outputs the detected output values to measurement circuit 181.

First light receiver 140 is an optical sensor that receives first propagating light 510*a* that has propagated through at least a portion of optical system 130*a* (specifically, first optical element 131 and second optical element 132).

Temperature adjuster 150 is a temperature changer for controlling the temperature of semiconductor laser element 125. Semiconductor laser element 125 is incorporated in temperature adjuster 150 such as, for example, a peltier element.

Circuitry 160*a* is connected to processor 190*a* and optical module 110*a*, and controls the operations of optical module 110*a* based on instructions from processor 190*a*. Circuitry 160*a* is, for example, an analog circuit, and functionally includes driving circuit 170, measurement circuit 180, and measurement circuit 181.

Driving circuit 170 is a circuit for driving semiconductor laser element 125. In the present embodiment, circuitry 160 includes the same number of driving circuits 170 as the number of light emission points included in semiconductor laser element 125 such that the plurality of light emission points of semiconductor laser element 125 can each independently output light. For example, in the case where optical module 110*a* includes semiconductor laser element 125 that includes N light emission points, circuitry 160 includes N driving circuits 170.

Measurement circuit 181 measures a second output value that indicates the received-light intensity of second propagating light 520 received by second light receiver 141. Specifically, measurement circuit 181 is an AD converter that converts analog output values output from second light receiver 141 to digital output values. Measurement circuit 181 outputs the second output value to processor 190*a* (more specifically, analyzer 193*a* included in processor 190*a*).

Processor 190*a* controls the operations of circuitry 160*a*. Specifically, processor 190*a* controls the driving current for driving semiconductor laser element 125 by controlling circuitry 160*a*.

Processor 190*a* functionally includes setter 191, controller 192, analyzer 193*a*, storage 194*a*, determiner (degradation determiner) 195*a*, and communicator 196.

Setter 191 sets a driving current value for semiconductor laser element 125. For example, setter 191 acquires, from display device 200 operated by the user, information indicating the driving current value for driving semiconductor laser element 125, and stores the acquired driving current value in storage 194*a*. Also, in the case where optical module 110*a* includes semiconductor laser element 125 that includes a plurality of light emission points, setter 191 selects a light emission point of semiconductor laser element 125 to be used. For example, setter 191 acquires information indicating the light emission point of semiconductor laser element 125 to be used from display device 200 operated by the user and stores the acquired information indicating the light emission point of semiconductor laser element 125 to be used in storage 194*a*. Setter 191 may include a communication interface, and may be communicably connected to display device 200, or perform communication with display device 200 via communicator 196.

Controller 192 includes: laser driving controller 192*a* that controls the driving current for driving semiconductor laser element 125; temperature adjustment controller 192*b* that controls temperature adjuster 150; and stage controller 192*c* that controls the driving of stage 420 that holds semiconductor laser element 120. Specifically, laser driving controller 192a of controller 192 applies an electric current corresponding to the driving current value set by setter 191 to the light emission point of semiconductor laser element 125 to be used, which was set by setter 191, by controlling one or more arbitrary driving circuits from among N driving circuits 170 included in circuitry 160a, and drives the arbitrarily selected light emission point of semiconductor laser element 125. For example, in the inspection mode, laser driving controller 192a drives the plurality of light emission points of semiconductor laser element 125 one by one by using a plurality of driving current values that are different from each other. In this case, measurement circuit 180 measures the first output value of first propagating light 510a received by first light receiver 140 for each of the plurality of driving current values that are different from each other. Also, measurement circuit 181 measures the second output value that indicates the received-light intensity of second propagating light 520 received by second light receiver 141 for each of the plurality of driving current values that are different from each other.

Analyzer 193a calculates threshold current $I_{th}$, slope efficiency $S_{e1}$, and slope efficiency $S_{e2}$ based on the laser light output values of semiconductor laser element 125 acquired from measurement circuits 180 and 181.

Slope efficiency $S_{e1}$ represents the amount of variation (or in other words, slope) of light output of laser light received by first light receiver 140 relative to the current value in the laser oscillation current values.

Slope efficiency $S_{e2}$ represents the amount of variation (or in other words, slope) in the light output of laser light received by second light receiver 141 relative to the current value in the laser oscillation current values.

In this way, analyzer 193a calculates slope efficiency $S_{e1}$ and slope efficiency $S_{e2}$ for the laser light beams respectively detected by first light receiver 140 and second light receiver 141.

Storage 194a stores threshold current $I_{th}$, slope efficiency $S_{e1}$, and slope efficiency $S_{e2}$ that were calculated by analyzer 193a.

Storage 194a is, for example, a HDD, a non-volatile memory, or the like.

Determiner 195a determines the degree of degradation of semiconductor laser element 125 and the degree of degradation of optical system 130a based on threshold current $I_{th}$, slope efficiency $S_{e1}$, and slope efficiency $S_{e2}$ that were calculated by analyzer 193a. Specifically, determiner 195a determines the degree of degradation of semiconductor laser element 125 based on threshold current $I_{th}$ based on threshold current $I_{th}$, determines the degree of degradation of first optical element 131 of optical system 130a based on slope efficiency $S_{e1}$, and determines the degree of degradation of second optical element 132 of optical system 130a based on slope efficiency $S_{e2}$.

Specifically, determiner 195a determines the degree of degradation of first optical element 131 and the degree of degradation of second optical element 132 based on a plurality of driving current values and outputs that correspond to the plurality of driving current values. More specifically, determiner 195a determines the degree of degradation of first optical element 131 based on a plurality of driving current values that are different from each other and first output values of first propagating light 510a received by first light receiver 140 for the plurality of driving current values that are different from each other, and determines the degree of degradation of second optical element 132 based on a plurality of driving current values that are different from each other and second output values of second propagating light 520 received by second light receiver 141 for the plurality of driving current values that are different from each other.

As described above, in light source device 100a, in addition to the processing of light source device 100 according to Embodiment 1, slope efficiency $S_{e2}$ is also calculated based on the light output of second propagating light 520 received by second light receiver 141, and the degree of degradation of second optical element 132 is calculated based on calculated slope efficiency $S_{e2}$. Other structural elements and processing operations of light source device 100a are the same as those of light source device 100 according to Embodiment 1, and thus a description thereof is omitted.

As with processor 190, processor 190a is implemented by, for example, a CPU and a control program executed by the CPU. The control program is stored in, for example, storage 194a. Processor 190a may be implemented by a dedicated electronic circuit or the like. For example, setter 191, controller 192, analyzer 193a, and determiner 195a may be implemented by a single CPU or may be implemented by a plurality of CPUs.

[Processing Procedure]

A processing procedure for determining the degrees of degradation of semiconductor laser element 125, first optical element 131, and second optical element 132, executed by light source device 100a according to Embodiment 2, will be described with reference to FIGS. 18 to 28.

In the processing procedure executed by light source device 100a according to Embodiment 2 described below, steps that are substantially the same as those of the processing procedure executed by light source device 100 according to Embodiment 1 are given the same reference numerals, and a description thereof may be omitted or simplified.

Figure 18:
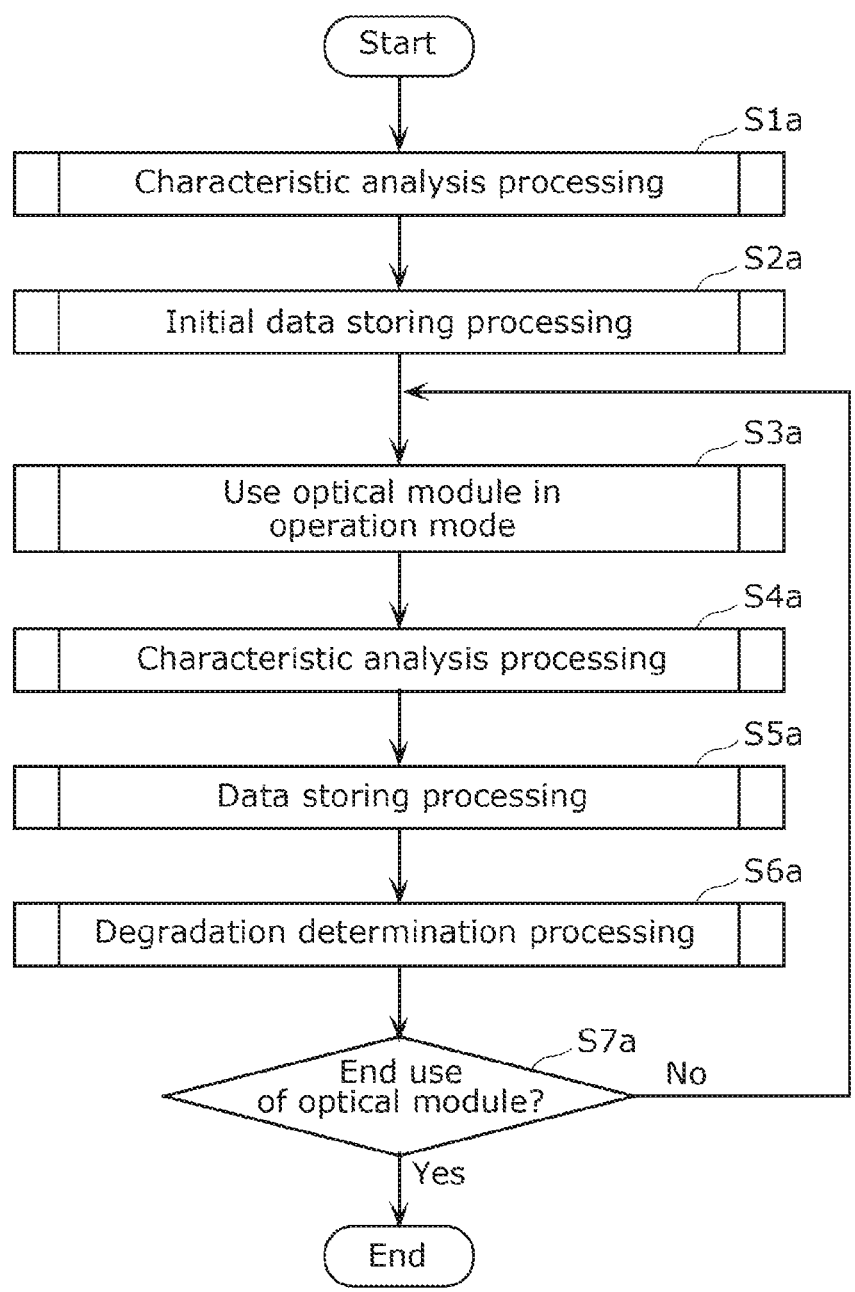
FIG. 18 is a flowchart illustrating a processing procedure for determining the degrees of degradation of a semiconductor laser element, a first optical element, and a second optical element, executed by the light source device according to Embodiment 2.

FIG. 18 is a flowchart illustrating a processing procedure for determining the degree of degradation of each of semiconductor laser element 125, first optical element 131, and second optical element 132, executed by light source device 100a according to Embodiment 2.

First, light source device 100a executes characteristic analysis processing for each of semiconductor laser element 125, first optical element 131, and second optical element 132 (step S1a). Specifically, in step S1a, analyzer 193a calculates threshold current $I_{th}$, slope efficiency $S_{e1}$, and slope efficiency $S_{e2}$, and stores the same in storage 194a.

Next, light source device 100a executes initial data storing processing for each of semiconductor laser element 125, first optical element 131, and second optical element 132 (step S2a). Specifically, in step S2a, analyzer 193a calculates an initial value for each of threshold current $I_{th}$ and slope efficiency $S_{e1}$ that were calculated in step S1a based on the laser light output from first optical element 131, calculates, based on the calculated initial values, reference threshold current $I_{END}$ and reference slope efficiency $S_{END1}$, which are used by determiner 195a as the criteria for determining the degree of degradation, and stores the same in storage 194a. Also, analyzer 193a calculates an initial value of slope efficiency $S_e e$ that was calculated in step S1a based on the laser light (second propagating light 520) output from second optical element 132, calculates, based on the calculated initial value, reference slope efficiency $S_{END2}$, which is used by determiner 195a as the criterion for determining the degree of degradation, and stores the same in storage 194a.

Reference slope efficiency $S_{END1}$ and reference slope efficiency $S_{END2}$ are each calculated by, for example, multiplying the initial value by a predetermined constant. Reference threshold current $I_{END}$, reference slope efficiency $S_{END1}$, and reference slope efficiency $S_{END2}$ may be arbitrarily set in advance.

Next, light source device 100a uses optical module 110a in the operation mode (step S3a). For example, step S3a is the same as the processing of step S3.

Next, light source device 100a executes characteristic analysis processing for each of semiconductor laser element 125, first optical element 131, and second optical element 132 (step S4a). Specifically, in step S4a, as in step S1a, analyzer 193a calculates threshold current $I_{th}$ and slope efficiency $S_{e1}$ based on the laser light output from first optical element 131, and calculates slope efficiency $S_{e2}$ based on second propagating light 520 output from second optical element 132.

Next, light source device 100a executes data storing processing for each of semiconductor laser element 125, first optical element 131, and second optical element 132 (step S5a). Specifically, in step S5a, analyzer 193a stores the values of threshold current $I_{th}$, slope efficiency $S_{e1}$, and slope efficiency $S_{e2}$ that were calculated in step S4a in storage 194a in association with cumulative operating time t that is the time during which semiconductor laser element 125 was used.

Next, light source device 100a executes degradation determination processing for each of semiconductor laser element 125, first optical element 131, and second optical element 132 (step S6a). Specifically, in step S6a, determiner 195a determines the degree of degradation of each of semiconductor laser element 125, first optical element 131, and second optical element 132 based on threshold current $I_{th}$, slope efficiency $S_{e1}$, slope efficiency $S_{e2}$, and cumulative operating time t stored in storage 194a by analyzer 193a in step S5a.

Next, light source device 100a determines whether to end the use of optical module 110a (step S7a). For example, step S7a is the same as the processing of step S7.

Next, the steps shown in FIG. 18 will be described in detail.

In the flowchart shown in FIGS. 19 to 26 described below, an example will be described in which light source device 100a includes semiconductor laser element 125 that includes N light emission points.

Figure 19:
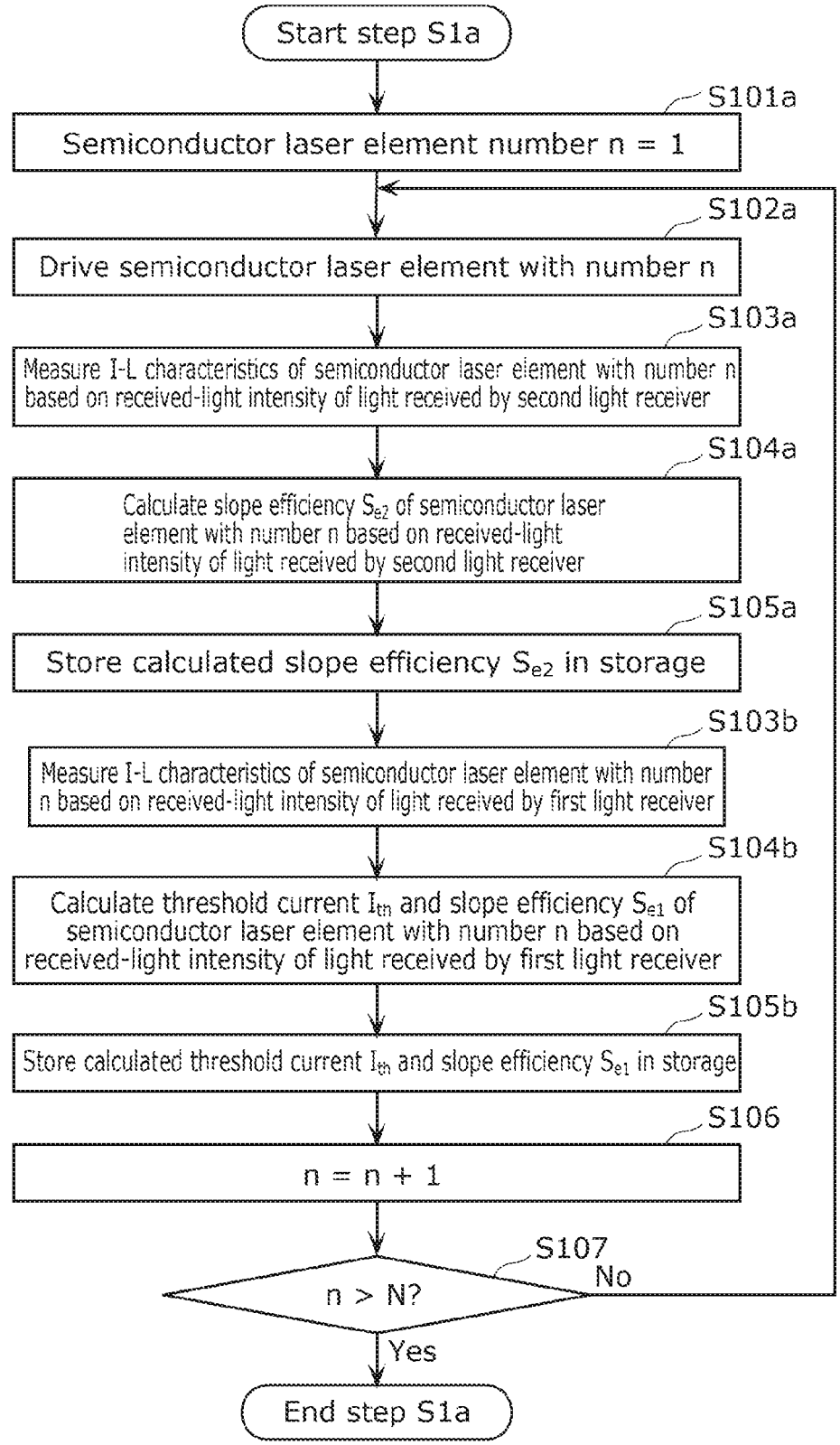
FIG. 19 is a flowchart illustrating characteristic analysis processing executed by the light source device according to Embodiment 2 in detail.

FIG. 19 is a flowchart illustrating the characteristic analysis processing (specifically, step S1a and step S4a) executed by light source device 100a according to Embodiment 2 in detail. The only difference between step S1a and step S4a is that whether semiconductor laser element 125 is in an initial state, and thus step S1a will be described in detail with reference to FIG. 19.

First, setter 191 selects one from among N semiconductor laser element 125 and sets the selected semiconductor laser element. That is, setter 191 selects one from among N light emission points of semiconductor laser element 125, and sets the selected light emission point.

Here, for example, numbers from 1 to N are assigned in advance to N light emission points of semiconductor laser element 125 so as to make a distinction between N light emission points of semiconductor laser element 125. For example, setter 191 selects a light emission point with a number n=1 included in semiconductor laser element 125 from among N light emission points of semiconductor laser element 125, and sets the selected light emission point of semiconductor laser element 125 (step S101a).

Hereinafter, a light emission point with a number n included in semiconductor laser element 125 may also be referred to simply as "semiconductor laser element 125 with a number n".

Next, controller 192 drives semiconductor laser element 125 with a number n=1 that was set by setter 191 in step S101a (or in other words, causes semiconductor laser element 125 with a number n=1 to output laser light) (step S102a).

Next, analyzer 193a measures the I-L characteristics (the light output relative to the driving current value) of semiconductor laser element 125 with a number n=1 based on the received-light intensity of light received by second light receiver 141 (step S103a). Specifically, analyzer 193a acquires, from measurement circuit 181, the light output of semiconductor laser element 125 with a number n=1 received by second light receiver 141 and acquires the driving current value used by controller 192 to drive semiconductor laser element 125 with a number n=1.

Next, analyzer 193a calculates slope efficiency $S_{e2}$ based on the I-L characteristics of semiconductor laser element 125 with a number n=1 that were measured in step S103a (step S104a).

Next, analyzer 193a stores slope efficiency $S_{e2}$ of semiconductor laser element 125 with a number n=1 that was calculated in step S104a in storage 194a (step S105a).

In step S105a, for example, analyzer 193a stores, in storage 194a, slope efficiency $S_{e2}$ together relative to cumulative operating time t of semiconductor laser element 125 with a number n=1 measured by controller 192.

Next, analyzer 193a measures the I-L characteristics (the light output relative to the driving current value) of semiconductor laser element 125 with a number n=1 based on the received-light intensity of light received by first light receiver 140 (step S103b). Specifically, analyzer 193a acquires, from measurement circuit 180, the light output of semiconductor laser element 125 with a number n=1 received by first light receiver 140 and acquires the driving current value used by controller 192 to drive semiconductor laser element 125 with a number n=1.

Next, analyzer 193a calculates threshold current $I_{th}$ and slope efficiency $S_{e1}$ based on the I-L characteristics of semiconductor laser element 125 with a number n=1 that were measured in step S103a (step S104b).

Next, analyzer 193a stores threshold current $I_{th}$ and slope efficiency $S_{e1}$ of semiconductor laser element 125 with a number n=1 that were calculated in step S104b in storage 194a (step S105b).

Threshold current $I_{th}$ may be calculated based on the received-light intensity of light received by second light receiver 141.

Next, setter 191 sets semiconductor laser element 125 with a number n=n+1, which represents the number next to number n (step S106).

Next, controller 192 determines whether number n set by setter 191 in step S106 satisfies n>N, or in other words, whether number n exceeds the largest value of the numbers assigned to N semiconductor laser elements 125 of light source device 100a (step S107).

If it is determined that number n does not satisfy n>N (No in step S107), controller 192 returns the processing to step S102a.

On the other hand, if it is determined that number n satisfies n>N (Yes in step S107), controller 192 determines that the values of threshold current $I_{th}$, slope efficiency $S_{e1}$, and slope efficiency $S_{e2}$ of N semiconductor laser elements 125 have been stored in storage 194a, and ends the processing.

Figure 20:
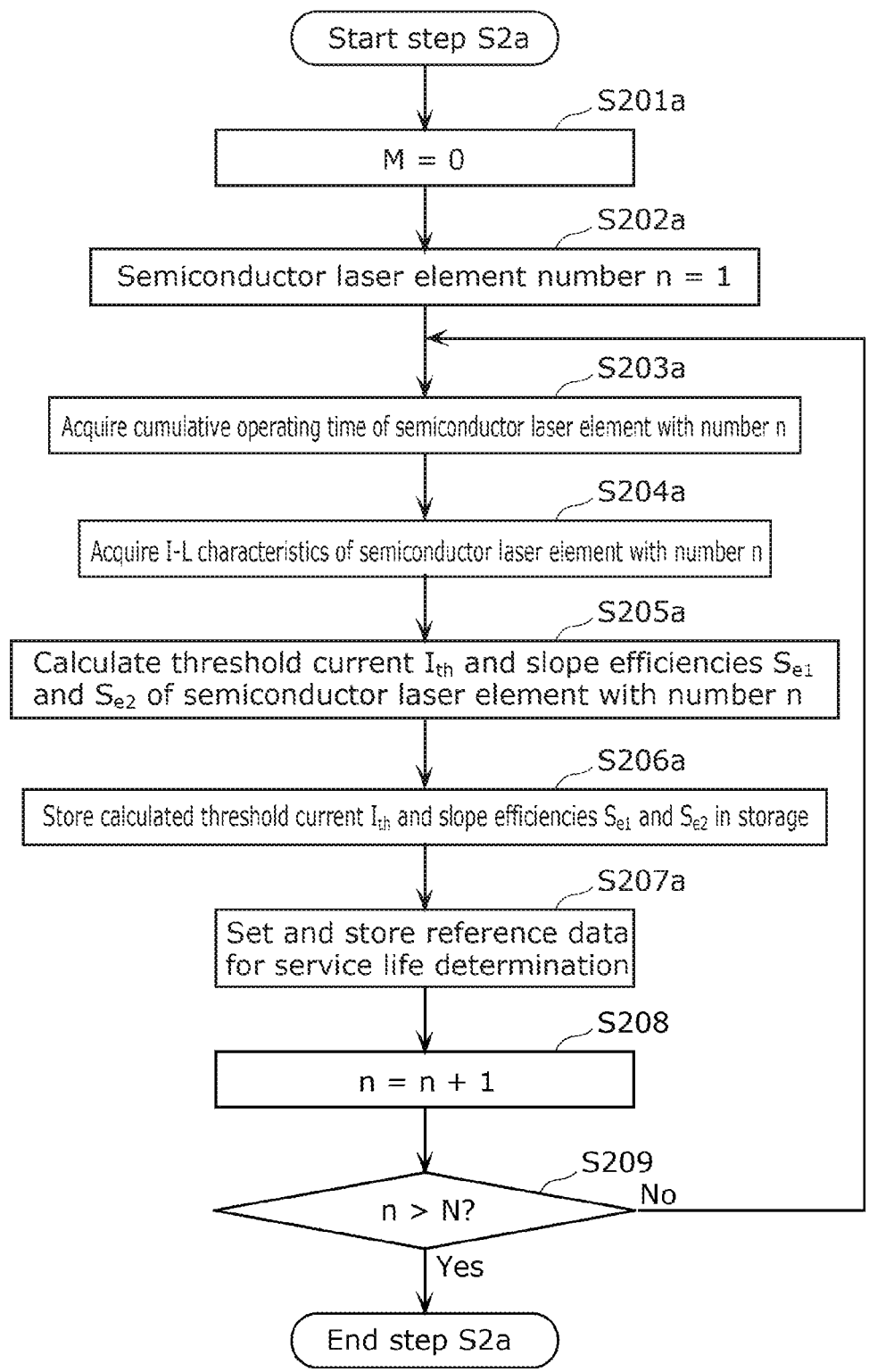
FIG. 20 is a flowchart illustrating initial data storing processing executed by the light source device according to Embodiment 2 in detail.

FIG. 20 is a flowchart illustrating the initial data storing processing executed by light source device 100a according to Embodiment 2 in detail. Specifically, FIG. 20 is a flowchart illustrating step S2a shown in FIG. 18 in detail.

First, setter 191 sets M=0 for the initial values of threshold current $I_{th}$, slope efficiency $S_{e1}$, and slope efficiency $S_{e2}$ of each of N semiconductor laser elements 125 that were analyzed by analyzer 193a in step S1a shown in FIG. 18 (step S201a).

Next, setter 191 selects, from among N semiconductor laser elements 125, semiconductor laser element 125 with a number n=1 and sets the selected semiconductor laser element (step S202a).

Next, analyzer 193a acquires, from storage 194a, cumulative operating time t of semiconductor laser element 125 with a number n=1 that was set by setter 191 in step S202a (step S203a).

Next, analyzer 193a acquires the I-L characteristics of semiconductor laser element 125 with a number n=1 stored in storage 194a (step S204a). In step S204a, analyzer 193a acquires the I-L characteristics based on the received-light intensity of light received by first light receiver 140 and the I-L characteristics based on the received-light intensity of light received by second light receiver 141 of semiconductor laser element 125 with a number n=1 stored in storage 194a.

Next, analyzer 193a acquires threshold current $I_{th}$, slope efficiency $S_{e1}$, and slope efficiency $S_{e2}$ of semiconductor laser element 125 with a number n=1 stored in storage 194a (step S205a).

Next, analyzer 193a stores, in storage 194a, data table 340a (see FIG. 22) in which acquired threshold current $I_{th}$, slope efficiency $S_{e1}$, and slope efficiency $S_{e2}$ of semiconductor laser element 125 with a number n=1 are associated with cumulative operating time t (step S206a).

Next, analyzer 193a sets (calculates) reference threshold current $I_{END}$, reference slope efficiency $S_{END1}$, and reference slope efficiency $S_{END2}$, which are criteria data for service life determination used by determiner 195a to determine the degree of degradation of each of semiconductor laser element 125 with a number n=1, first optical element 131, and second optical element 132 based on the initial data stored in storage 194a in step S206a, and stores the same in storage 194a (step S207a).

Next, setter 191 sets semiconductor laser element 125 with a number n=n+1, which represents the number next to number n (step S208).

Next, controller 192 determines whether number n set by setter 191 in step S208 satisfies n>N, or in other words, whether number n exceeds the largest value of the numbers assigned to N semiconductor laser elements 125 of light source device 100a (step S209).

If it is determined that number n does not satisfy n>N (No in step S209), controller 192 returns the processing to step S203a.

On the other hand, if it is determined that number n satisfies n>N (Yes in step S209), controller 192 determines that data tables 340a, 341a, and 342a of N semiconductor laser elements 125 have been stored in storage 194a, and ends the processing.

Figure 21:
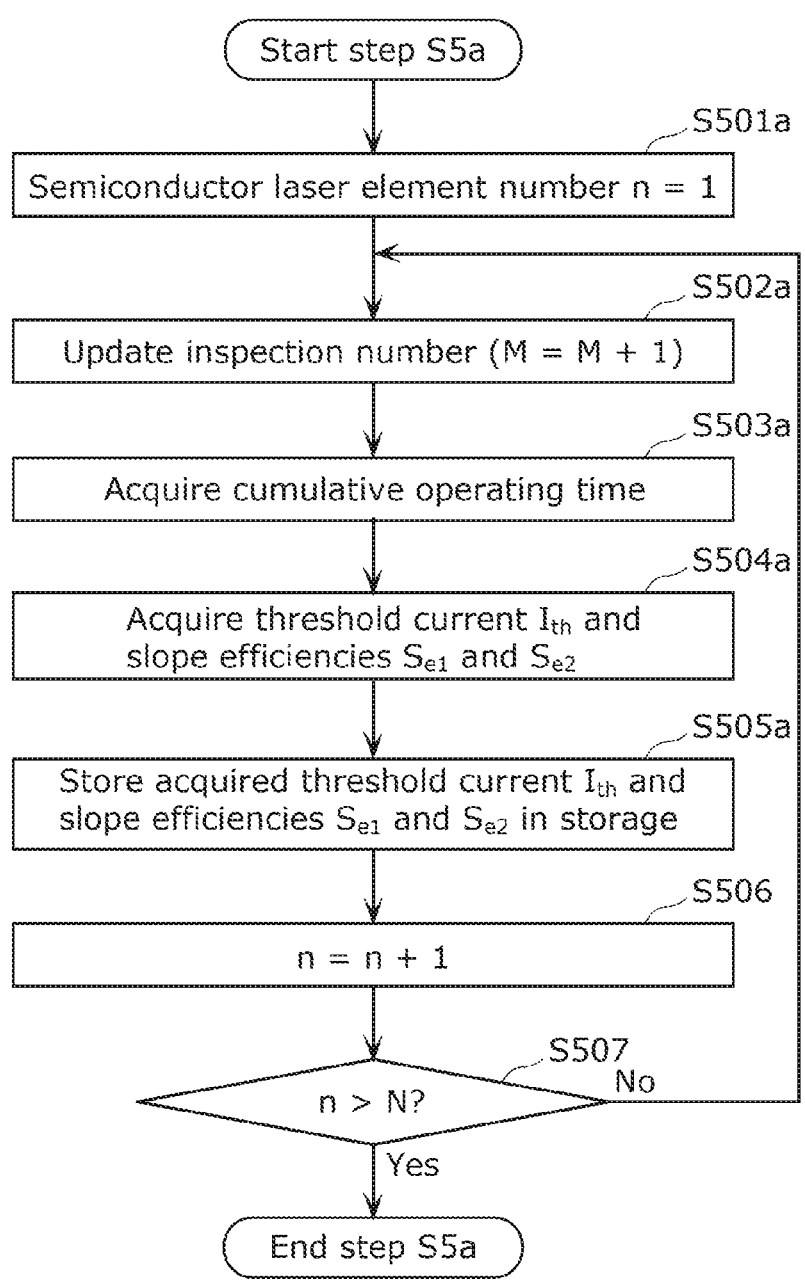
FIG. 21 is a flowchart illustrating data storing processing executed by the light source device according to Embodiment 2 in detail.

FIG. 21 is a flowchart illustrating the data storing processing (step S5a) executed by light source device 100a according to Embodiment 2 in detail.

First, setter 191 selects, from among N semiconductor laser elements 125, semiconductor laser element 125 with a number n=1, and sets the selected semiconductor laser element (step S501a).

Next, analyzer 193a updates inspection number M to M+1 (M=M+1) (step S502a).

Next, analyzer 193a acquires, from controller 192, cumulative operating time t of semiconductor laser element 125 with a number n=1 (step S503a).

Next, analyzer 193a acquires threshold current $I_{th}$, slope efficiency $S_{e1}$, and slope efficiency $S_{e2}$ that are the results of the second measurement of semiconductor laser element 125 with a number n=1 stored in storage 194a (step S504a).

Next, analyzer 193a stores, in storage 194a, data table 341a (see FIG. 7) in which acquired threshold current $I_{th}$, slope efficiency $S_{e1}$, and slope efficiency $S_{e2}$ that are the results of the second measurement of semiconductor laser element 125 with a number n=1 are associated with cumulative operating time t (step S505a).

The results of the second measurement have been stored in storage 194a by analyzer 193a in step S4a shown in FIG. 3.

Next, setter 191 sets semiconductor laser element 125 with a number n=n+1, which represents the number next to number n (step S506).

Next, controller 192 determines whether number n set by setter 191 in step S208 satisfies n>N, or in other words, whether number n exceeds the largest value of the numbers assigned to N semiconductor laser elements 125 of light source device 100a (step S507).

If it is determined that number n does not satisfy n>N (No in step S507), controller 192 returns the processing to step S502a.

On the other hand, if it is determined that number n satisfies n>N (Yes in step S507), controller 192 determines that the data tables (for example, data tables 340a, 341a, and 342a shown in FIG. 22) of N semiconductor laser elements 125 for inspection number M have been stored in storage 194a, and ends the processing.

FIG. 22 shows examples of data tables 340a, 341a, and 342a that are stored in light source device 100a according to Embodiment 2.

As shown in FIG. 22, for example, data table 340a includes cumulative operating time t, threshold current $I_{th}$, slope efficiency $S_{e1}$, and slope efficiency $S_{e2}$ for each of inspection numbers M from 0 to 12 of semiconductor laser element 125 with a number n=1.

That is, data table 340a is different from, for example, data table 340 shown in FIG. 7 in that data table 340a includes both slope efficiency $S_{e1}$ and slope efficiency $S_{e2}$.

Figure 23:
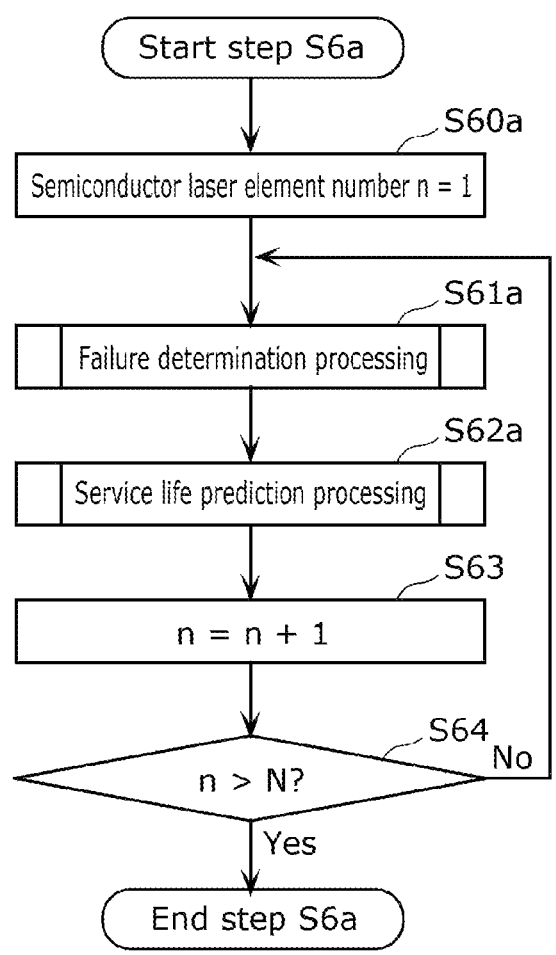
FIG. 23 is a flowchart illustrating degradation determination processing executed by the light source device according to Embodiment 2 in detail.

FIG. 23 is a flowchart illustrating the degradation determination processing (step S6a) executed by light source device 100a according to Embodiment 2 in detail.

First, setter 191 selects, from among N semiconductor laser elements 125, semiconductor laser element 125 with a number n=1, and sets the selected semiconductor laser element (step S60a).

Next, determiner 195a executes failure determination processing for each of semiconductor laser element 125 with a number n=1, first optical element 131, and second optical element 132 (step S61a). Specifically, in step S61a, determiner 195a determines, based on the data table stored in storage 194a, whether a failure has occurred in any of semiconductor laser element 125 with a number n=1, first optical element 131, and second optical element 132.

Next, determiner 195a executes service life prediction processing for each of semiconductor laser element 125 with a number n=1, first optical element 131, and second optical element 132 (step S62a). Specifically, in step S62a, determiner 195a calculates, based on the data table stored in storage 194a, the service life of each of semiconductor laser element 125 with a number n=1, first optical element 131, and second optical element 132.

That is, in steps S61a and S62a, determiner 195a calculates the degree of degradation of semiconductor laser element 125 with a number n=1, the degree of degradation of first optical element 131, and the degree of degradation of second optical element 132.

Next, setter 191 sets semiconductor laser element 125 with a number n=n+1, which represents the number next to number n (step S63).

Next, determiner 195a determines whether number n set by setter 191 in step S63 satisfies n>N, or in other words, whether number n exceeds the largest value of the numbers assigned to N semiconductor laser elements 125 of light source device 100a (step S64).

If it is determined by controller 192 that number n does not satisfy n>N (No in step S64), determiner 195a returns the processing to step S61a.

On the other hand, if it is determined by controller 192 that number n satisfies n>N (Yes in step S64), determiner 195a determines that the degree of degradation of each of N semiconductor laser elements 125, first optical element 131, and second optical element 132 has been determined, and ends the processing.

Figure 24:
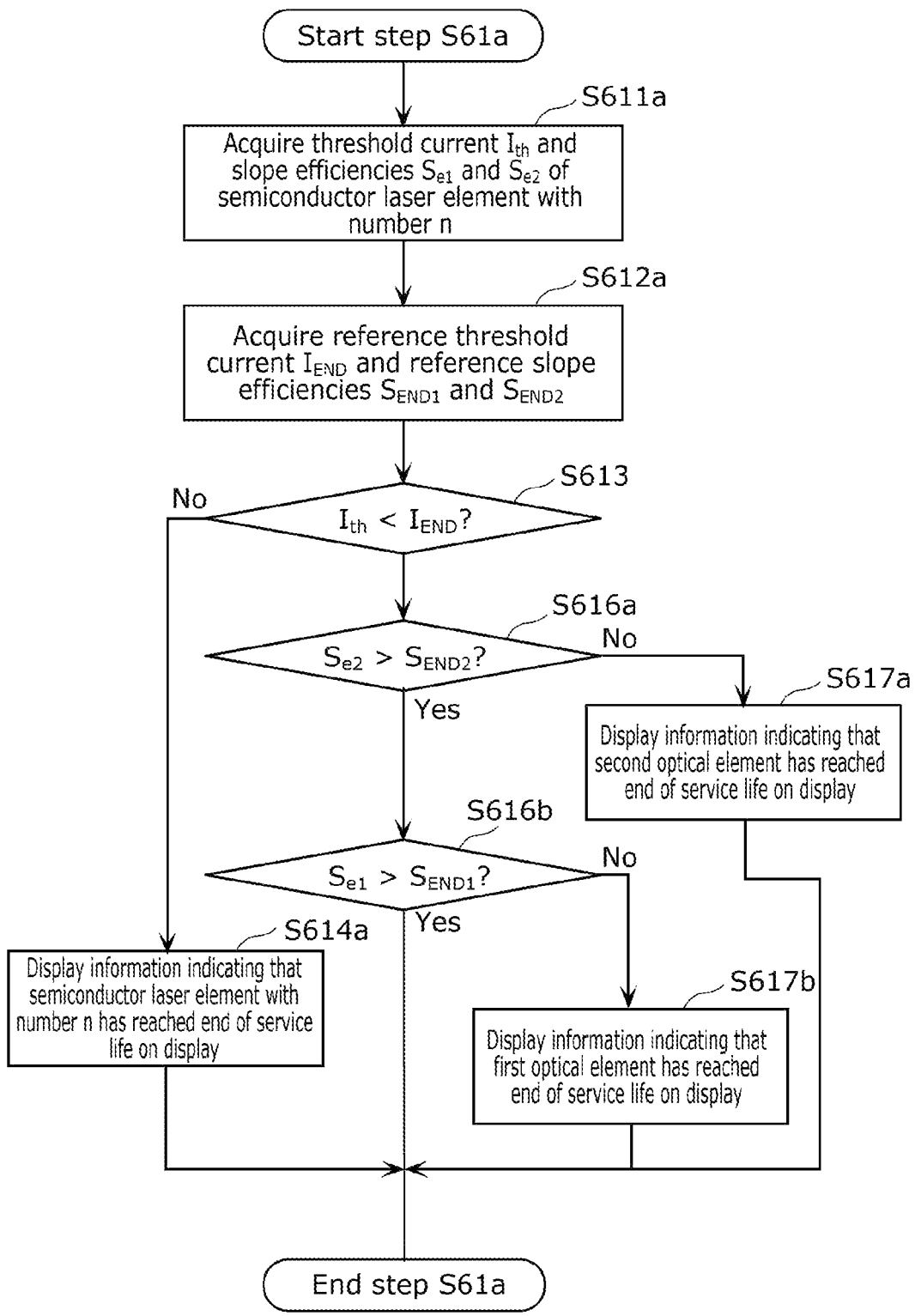
FIG. 24 is a flowchart illustrating failure determination processing executed by the light source device according to Embodiment 2 in detail.

FIG. 24 is a flowchart illustrating the failure determination processing (step S61a) executed by light source device 100a according to Embodiment 2 in detail.

First, determiner 195a acquires, from storage 194a, threshold current $I_{th}$, slope efficiency $S_{e1}$, and slope efficiency $S_{e2}$ of semiconductor laser element 125 with a number n (step S611a).

Next, determiner 195a acquires reference threshold current $I_{END}$, reference slope efficiency $S_{END1}$, and reference slope efficiency $S_{END2}$ that are criteria data for service life determination of semiconductor laser element 125 with a number n (step S612a).

Next, determiner 195a determines whether threshold current $I_{th}$<reference threshold current $I_{END}$ is satisfied (step S613).

If it is determined that threshold current $I_{th}$<reference threshold current $I_{END}$ is not satisfied (No in step S613), determiner 195a displays, on display 210, information indicating that semiconductor laser element 125 with a number n has reached the end of the service life (step S614a).

Determiner 195a may notify external device 300 of the information indicating that semiconductor laser element 125 with a number n has reached the end of the service life, as in step S615 shown in FIG. 9.

On the other hand, if it is determined that threshold current $I_{th}$<reference threshold current $I_{END}$ is satisfied (Yes in step S613), determiner 195a determines whether slope efficiency $S_{e2}$>reference slope efficiency $S_{END2}$ is satisfied (step S616a).

If it is determined that slope efficiency $S_{e2}$>reference slope efficiency $S_{END2}$ is not satisfied (No in step S616a), determiner 195a displays, on display 210, information indicating that second optical element 132 through which the laser light output from semiconductor laser element 125 with a number n passes has reached the end of the service life (step S617a).

As in step S618 shown in FIG. 9, determiner 195a may notify external device 300 of the information indicating that second optical element 132 has reached the end of the service life.

If it is determined that slope efficiency $S_{e2}$>reference slope efficiency $S_{END2}$ is satisfied (Yes in step S616a), determiner 195a determines whether slope efficiency $S_{e1}$>reference slope efficiency $S_{END1}$ is satisfied (step S616b).

If it is determined that slope efficiency $S_{e1}$>reference slope efficiency $S_{END1}$ is not satisfied (No in step S616b), determiner 195a displays, on display 210, information indicating that first optical element 131 through which the laser light output from semiconductor laser element 125 with a number n passes has reached the end of the service life (step S617b).

As in step S618 shown in FIG. 9, determiner 195a may notify external device 300 of the information indicating that first optical element 131 has reached the end of the service life.

If it is determined that slope efficiency $S_{e1}$>reference slope efficiency $S_{END1}$ is satisfied (Yes in step S616b), determiner 195a determines that a failure has not occurred in any of semiconductor laser element 125 with a number n, first optical element 131, and second optical element 132, and ends the processing.

FIG. 25 is a table that shows an example of the results of the degree of degradation of first optical element 131 and the degree of degradation of second optical element 132 determined by determiner 195a included in light source device 100a according to Embodiment 2 based on slope efficiency $S_{e1}$ and slope efficiency $S_{e2}$.

As shown in FIG. 25, if slope efficiency $S_{e1}$ is normal (or in other words, slope efficiency $S_{e1}$>reference slope efficiency $S_{END1}$ is satisfied), and slope efficiency $S_{e2}$ is normal (or in other words, slope efficiency $S_{e2}$>reference slope efficiency $S_{END2}$ is satisfied), determiner 195a determines that a failure has not occurred in optical system 130a (first optical element 131 and second optical element 132), or in other words, there is no degraded portion.

Also, if slope efficiency $S_{e1}$ is lower than the reference value (reference slope efficiency $S_{END1}$), or in other words, slope efficiency $S_{e1}$>reference slope efficiency $S_{END1}$ is not satisfied, and slope efficiency $S_{e2}$ is lower than the reference value (reference slope efficiency $S_{END2}$), or in other words, slope efficiency $S_{e2}$>reference slope efficiency $S_{END2}$ is not satisfied, determiner 195a determines that a failure has occurred in second optical element 132, or in other words, there is a degraded portion in second optical element 132.

Also, if slope efficiency $S_{e1}$ is lower than the reference value (reference slope efficiency $S_{END1}$), or in other words, slope efficiency $S_{e1}$>reference slope efficiency $S_{END1}$ is not satisfied, and slope efficiency $S_{e2}$ is normal, or in other words, slope efficiency $S_{e2}$>reference slope efficiency $S_{END2}$ is satisfied, determiner 195a determines that a failure has occurred in first optical element 131, or in other words, there is a degraded portion in first optical element 131.

Figure 26:
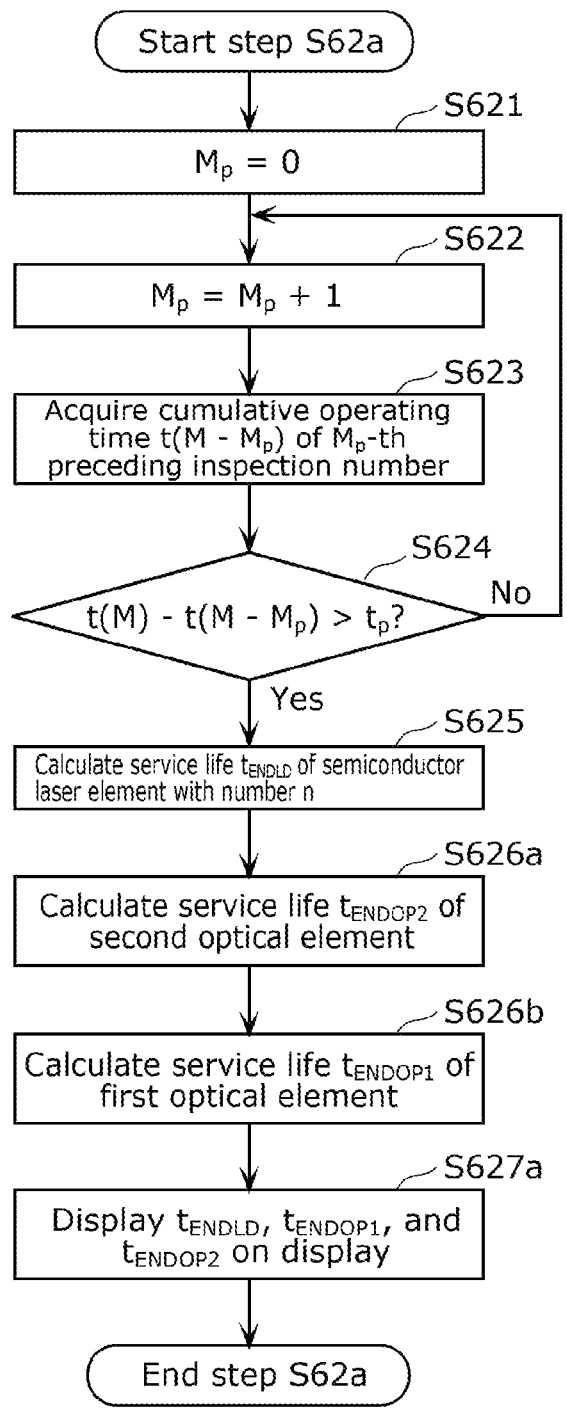
FIG. 26 is a flowchart illustrating service life prediction processing executed by the light source device according to Embodiment 2 in detail.

FIG. 26 is a flowchart illustrating the service life prediction processing (step S62a) executed by light source device 100a according to Embodiment 2 in detail.

First, determiner 195a substitutes 0 as the initial value of $M_p$ (step S621).

Next, determiner 195a performs the following calculation: $M_p=M_p+1$ (step S622).

Next, determiner 195a acquires, from storage 194a, cumulative operating time $t(M-M_p)$ included in $M_p$-th preceding inspection number (or in other words, inspection number M–$M_p$) from inspection number M for which latest threshold current $I_{th}$ and the like are stored (step S623).

Next, determiner 195a determines whether t(M)–t(M–$M_p$)>$t_p$ is satisfied (step S624).

If it is determined that t(M)–t(M–$M_p$)>$t_p$ is not satisfied (No in step S624), determiner 195a returns the processing to step S622, and repeatedly executes steps S622 to S624.

Also, if it is determined that t(M)–t(M–$M_p$)>$t_p$ is satisfied (Yes in step S624), determiner 195a calculates service life $t_{ENDLD}$ of semiconductor laser element 125 with a number n (step S625).

Service life $t_{ENDLD}$ is calculated by Equation (1) given above.

Next, determiner 195a calculates service life $t_{ENDOP2}$ of second optical element 132 provided between semiconductor laser element 125 with a number n and second light receiver 141 (step S626a).

Service life $t_{ENDOP2}$ is calculated by Equation (3) given below.

[Math. 3]

$$t_{ENDOP2} = \frac{S_{END2} - S_{e2}(M)}{S_{e2}(M) - S_{e2}(M - M_p)} \times \{t(M) - t(M - M_p)\} + t(M - M_p) \quad \text{Equation (3)}$$

Here, $S_{e2}$(M) represents slope efficiency $S_{e2}$ included in inspection number M. Also, $S_{e2}$(M–$M_p$) represents slope efficiency $S_e$e included in inspection number M–$M_p$.

Next, determiner 195a calculates service life $t_{ENDOP1}$ of first optical element 131 provided between semiconductor laser element 125 with a number n and first light receiver 140 (step S626b).

Service life $t_{ENDOP1}$ is calculated by Equation (4) given below.

[Math. 4]

$$t_{ENDOP1} = \frac{S_{END1} - S_{e1}(M)}{S_{e1}(M) - S_{e1}(M - M_p)} \times \{t(M) - t(M - M_p)\} + t(M - M_p) \quad \text{Equation (4)}$$

Here, $S_{e1}$(M) represents slope efficiency $S_{e1}$ included in inspection number M. Also, $S_{e1}$(M–$M_p$) represents slope efficiency $S_{e1}$ included in inspection number M–$M_p$.

Next, determiner 195a displays $t_{ENDLD}$, $t_{ENDOP1}$, and $t_{ENDOP2}$ on display 210 (step S627a). In step S627a, for example, determiner 195a transmits $t_{ENDLD}$, $t_{ENDOP1}$, and $t_{ENDOP2}$ to display device 200 via communicator 196. For example, when controller 240 of display device 200 receives $t_{ENDLD}$, $t_{ENDOP1}$, and $t_{ENDOP2}$ from processor 190a via communicator 220, controller 240 controls display 210 to display an image that indicates $t_{ENDLD}$, $t_{ENDOP1}$, and $t_{ENDOP2}$.

Determiner 195a may further calculate $t_{ENDLD}$–t(M), $t_{ENDOP1}$–t(M), and $t_{ENDOP2}$–t(M), and display $t_{ENDLD}$–t(M), $t_{ENDOP1}$–t(M), and $t_{ENDOP2}$–t(M) on display 210.

Also, as in step S628 shown in FIG. 11, determiner 195a may notify external device 300 of $t_{ENDLD}$, $t_{ENDOP1}$, and $t_{ENDOP2}$.

Also, determiner 195a may further calculate $t_{ENDLD}$–t(M), $t_{ENDOP1}$–t(M), and $t_{ENDOP2}$–t(M), and notify external device 300 of $t_{ENDLD}$–t(M), $t_{ENDOP1}$–t(M), and $t_{ENDOP2}$–t(M).

Figure 27:
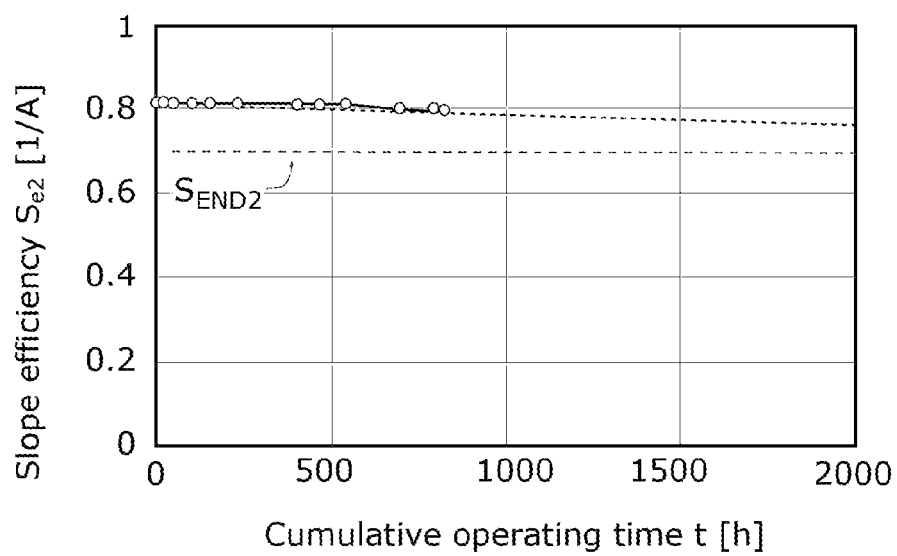
FIG. 27 is a graph showing an example of variation in slope efficiency of the semiconductor laser element included in the light source device according to Embodiment 2 relative to cumulative operating time.
Figure 28:
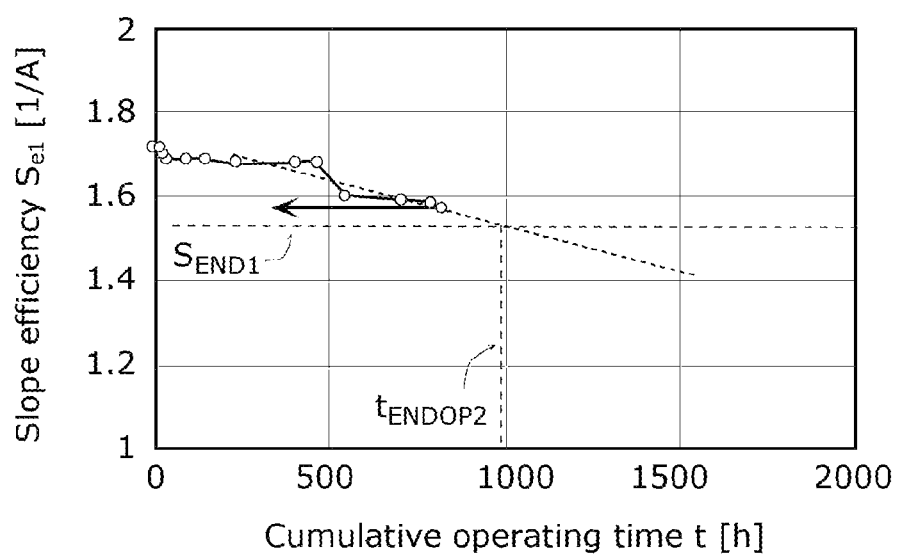
FIG. 28 is a graph showing another example of variation in slope efficiency of the semiconductor laser element included in the light source device according to Embodiment 2 relative to cumulative operating time.

FIG. 27 is a graph showing an example of variation in slope efficiency $S_{e2}$ of semiconductor laser element 125 included in light source device 100a according to Embodiment 2 relative to cumulative operating time t. FIG. 28 is a graph showing another example of variation in slope efficiency $S_{e1}$ semiconductor laser element 125 included in light source device 100a according to Embodiment 2 relative to cumulative operating time t. Specifically, FIGS. 27 and 28 are graphs showing variations in slope efficiency $S_{e1}$ and slope efficiency $S_{e2}$ of semiconductor laser element 125 with the same number n.

In the example shown in FIGS. 27 and 28, slope efficiency $S_{e2}$ varies little relative to cumulative operating time t. On the other hand, slope efficiency $S_{e1}$ varies more significantly than slope efficiency $S_{e2}$ relative to cumulative operating time t. When slope efficiency $S_{e2}$ varies little relative to cumulative operating time t, and slope efficiency $S_{e1}$ varies significantly relative to cumulative operating time t as described above, determiner 195a can determine that the degree of degradation of first optical element 131 is large.

[Advantageous Effects, etc.]

As described above, light source device 100a according to Embodiment 2 further includes second light receiver 141 in addition to the structural elements of light source device 100 according to Embodiment 1. Optical system 130a further includes second optical element 132 that is disposed upstream of first optical element 131. Second light receiver 141 receives second propagating light 520 that is light that has propagated through second optical element 132 before entering first optical element 131. Also, measurement circuit 181 measures a second output value that indicates the received-light intensity of second propagating light 520 received by second light receiver 141 for each of the plurality of driving current values that are different from each other.

With the configuration described above, it is possible to easily identify which one of the optical elements (in the present embodiment, first optical element 131 and second optical element 132) of optical system 130a is degraded.

(Variations)

Next, variations of the light source device according to the present disclosure will be described. The description of the variations will be given focusing on differences from light source devices 100 and 100a of Embodiments 1 and 2, and thus structural elements that are the same as those of light source devices 100 and 100a of Embodiments 1 and 2 are given the same reference numerals, and a description thereof may be omitted or simplified.

Variations 1 and 2 described below are different from Embodiments 1 and 2 only in that the configuration of the optical module is different. For this reason, hereinafter, a description will be given of the optical module.

[Variation 1]

Figure 29:
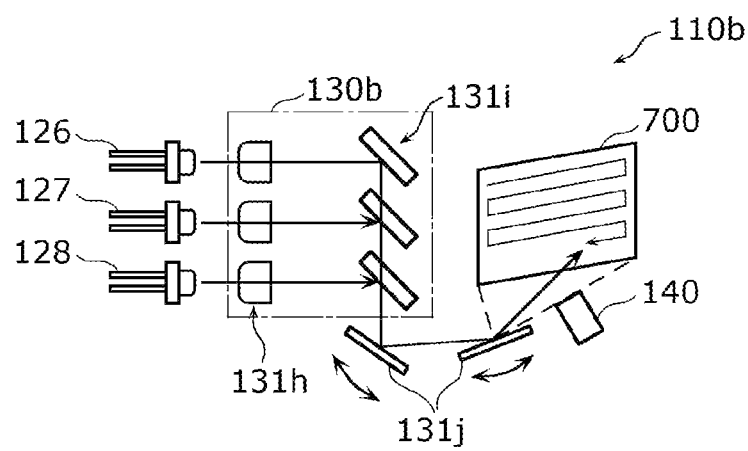
FIG. 29 is a schematic diagram schematically showing an example of an optical module according to Variation 1.

FIG. 29 is a schematic diagram schematically showing an example of optical module 110b according to Variation 1.

Optical module 110b is used as a light source of a projector (scanning laser display device) that projects video images onto screen 700. As described above, the light source device according to the present disclosure may be used as, for example, a light source of a device other than the light source of the laser processing machine as shown in FIGS. 2A and 2B.

Optical module 110b includes semiconductor laser elements 126, 127, and 128, optical system 130b, biaxial scanner 131j, and first light receiver 140.

Semiconductor laser elements 126, 127, and 128 are light sources that output laser light. For example, in the case where optical module 110b is used as a light source of a projector that projects video images onto screen 700, for example, semiconductor laser element 126 outputs red light, semiconductor laser element 127 outputs green light (for example, light with a wavelength of about 530 nm), and semiconductor laser element 128 outputs blue light (for example, light with a wavelength of about 450 nm). In particular, semiconductor laser element 127 and semiconductor laser element 128 are each preferably made of a nitride semiconductor. The wavelength of light output by the semiconductor laser elements included in the light source device according to the present disclosure may be arbitrarily set according to the device in which optical module 110b is used.

Optical system 130b includes three collimating lenses 131h and three mirrors 131i that are dichroic mirrors as first optical elements. As described above, the plurality of first optical elements used in the optical system according to the present disclosure may be arbitrarily selected.

In the operation mode, the laser light beams output from semiconductor laser elements 126, 127, and 128 pass through collimating lenses 131h, are reflected by mirrors 131i, and then scanned on screen 700 by biaxial scanner 131j.

In the inspection mode, for example, the laser light is reflected toward first light receiver 140 by biaxial scanner 131j, and first light receiver 140 detects the reflected laser light. In this way, first light receiver 140 may be disposed downstream of the first optical elements (in the present variation, collimating lenses 131h and mirrors 131i), and detect light (for example, first propagating light 510a shown in FIG. 1) that has propagated through at least a portion of the first optical elements. As used herein, the term "the light that has propagated through at least a portion of the first optical elements" refers to not only light that has passed through the optical elements such as collimating lenses 131h, but also light that was reflected by the optical elements such as mirrors 131i.

[Variation 2]

Figure 30:
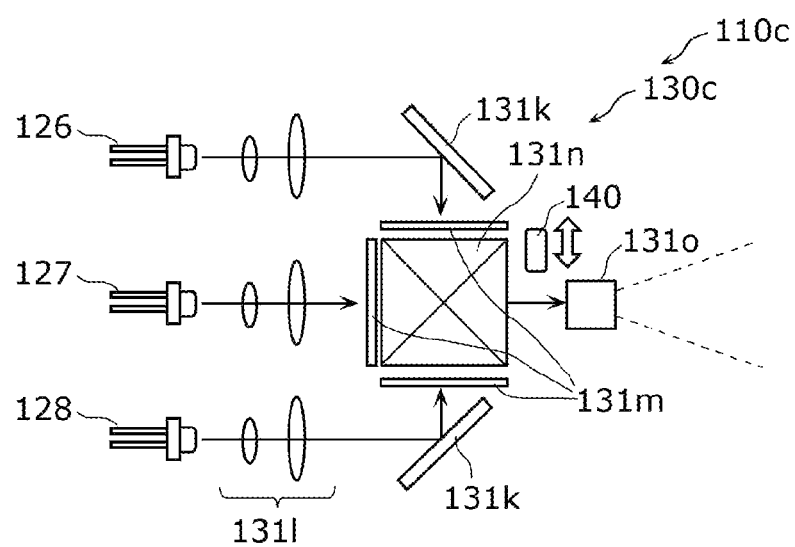
FIG. 30 is a schematic diagram schematically showing an example of an optical module according to Variation 2.

FIG. 30 is a schematic diagram schematically showing an example of optical module 110c according to Variation 2.

Optical module 110c is used as a light source of a projector (transmission laser display device) that projects video images.

Optical module 110c includes semiconductor laser elements 126, 127, and 128, optical system 130c, and first light receiver 140.

Optical system 130c includes expanding optical system 131l, two mirrors 131k, three liquid crystal panels 131m, dichroic prism 131n, and projection lens 131o.

The laser light beams output from semiconductor laser elements 126, 127, and 128 pass through expanding optical system 131l that includes, for example, a plurality of lenses, and a portion of the laser light beams is reflected by mirrors 131k, passes through liquid crystal panels 131m, and enters dichroic prism 131n. The laser light beams that have entered dichroic prism 131n are emitted toward projection lens 131o, and then emitted from projection lens 131o after the distribution angle has been controlled by projection lens 131o.

Also, first light receiver 140 is disposed on, for example, a moving stage (not shown) or the like, and is movable. In the inspection mode, first light receiver 140 is moved to, for example, a position between dichroic prism 131n and projection lens 131o, and detects the laser light emitted from dichroic prism 131n. As described above, by configuring first light receiver 140 to be movable, in the operation mode described above, it is possible to suppress a situation in which first light receiver 140 prevents a portion of the laser light from irradiating irradiation target 410. For example, the moving stage (not shown) may be communicably connected to processor 190 by a control line or the like such that the movement of the moving stage can be controlled by controller 192.

[Variation 3]

For example, controller 192 may control the driving current values for driving semiconductor laser elements 120 based on the variations in the value of threshold current $I_{th}$ analyzed by analyzer 193.

Figure 31:
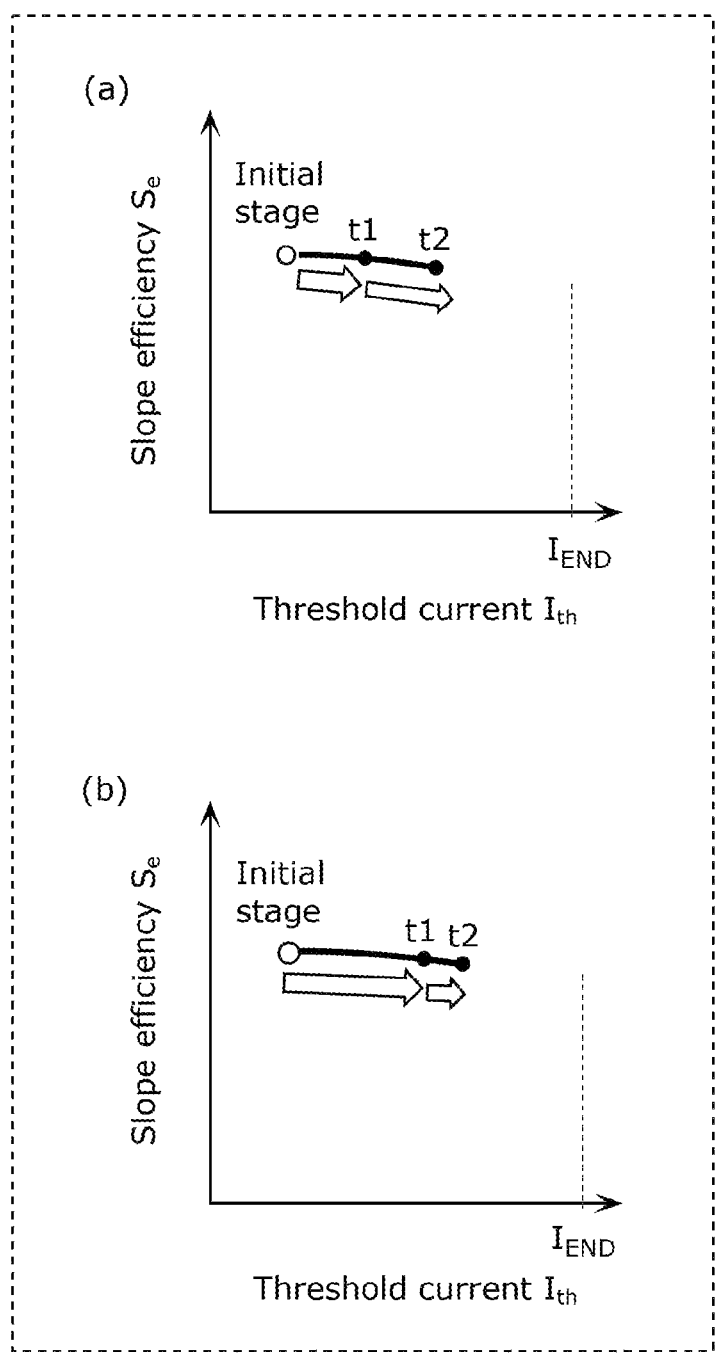
FIG. 31 is a graph showing a specific example of a decrease in slope efficiency of a semiconductor laser element included in a light source device according to Variation 3 relative to cumulative operating time.

In FIG. 31, (a) and (b) show graphs showing specific examples of an increase in threshold current $I_{th}$ and a decrease in slope efficiency $S_e$ of semiconductor laser element 120a and semiconductor laser element 120b relative to cumulative operating time t in light source device 100b according to Variation 3 that includes semiconductor laser element 120a and semiconductor laser element 120b. More specifically, (a) in FIG. 31 shows a graph showing a specific example of variation with time in semiconductor laser element 120a, and (b) in FIG. 31 shows a graph showing a specific example of variation with time in semiconductor laser element 120b.

As shown in FIG. 31, it is assumed that threshold current $I_{th}$ increases more significantly in semiconductor laser element 120b than in semiconductor laser element 120a at cumulative operating time t1. That is, it is assumed that the degree of degradation is larger in semiconductor laser element 120b than in semiconductor laser element 120a. In this case, controller 192 drives semiconductor laser elements 120a and 120b by controlling the driving current value for driving semiconductor laser element 120b to be smaller than the driving current value for driving semiconductor laser element 120a. By doing so, the progress of degradation of semiconductor laser element 120b delays. At cumulative operating time t2, threshold current $I_{th}$ of semiconductor laser element 120a and threshold current $I_{th}$ of semiconductor laser element 120b approach. In this case, the driving current value for driving semiconductor laser element 120a may be increased such that the light output of laser light output from light source device 100b does not drop.

Figure 32:
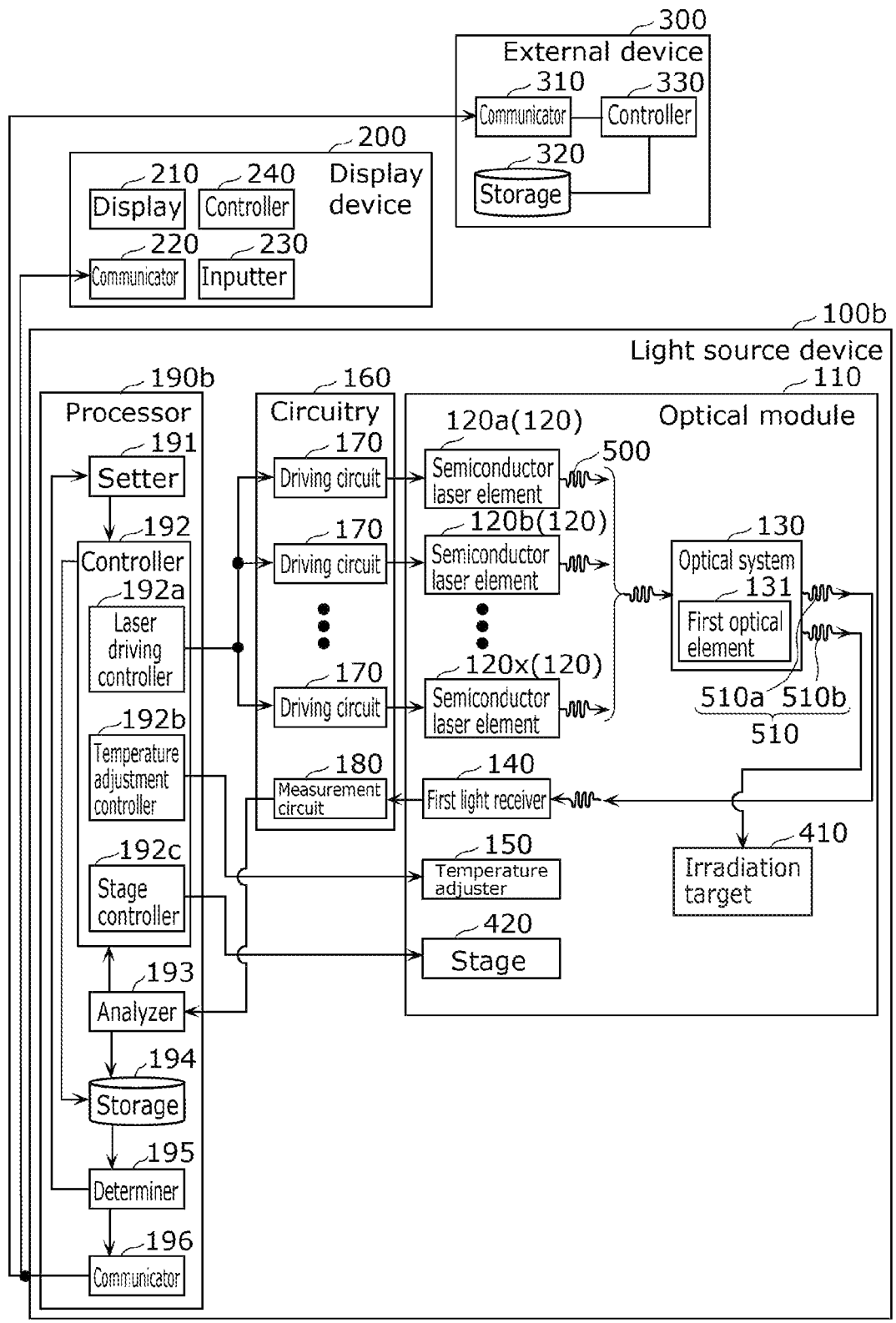
FIG. 32 is a block diagram showing a characteristic functional configuration of the light source device according to Variation 3.
Figure 33:
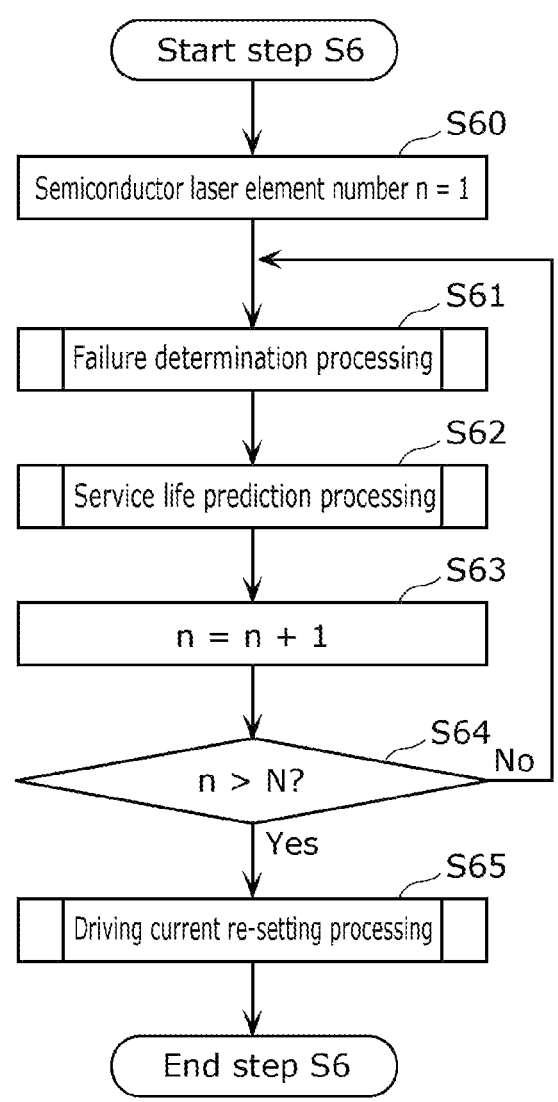
FIG. 33 is a flowchart illustrating degradation determination processing executed by the light source device according to Variation 3 in detail.

FIG. 32 is a block diagram showing a characteristic functional configuration of light source device 100b according to Variation 3. FIG. 33 is a flowchart illustrating degradation determination processing (step S6 shown in FIG. 8) executed by light source device 100b according to Variation 3 in detail. For example, in the case where light source device 100b includes a plurality of semiconductor laser elements 120, in step S62, determiner 195 predicts the service life of each of the plurality of semiconductor laser elements 120. After the service life has been predicted for all semiconductor laser elements 120, in step S65, for example, setter 191 may again set the driving current values for driving semiconductor laser elements 120 such that the service lives of the plurality of semiconductor laser elements 120 predicted by determiner 195 are equal.

Specifically, for example, semiconductor laser element 120a and semiconductor laser element 120b are driven at 2 W until cumulative operating time t1 shown in FIG. 31. After cumulative operating time t1, semiconductor laser element 120a is driven at 3 W and semiconductor laser element 120b is driven at 1 W. By setting driving conditions as described above, during a period from cumulative operating time t1 to cumulative operating time t2, the degradation of semiconductor laser element 120a with a large load proceeds rapidly, and the degradation of semiconductor laser element 120b with a small load proceeds slowly.

With the configuration described above, in the case where the light source device according to the present disclosure includes a plurality of semiconductor laser elements 120, the degree of degradation is likely to be equal between the plurality of semiconductor laser elements 120. Accordingly, for example, even when the degradation of one of the plurality of semiconductor laser elements 120 proceeds rapidly, the service life of the one of the plurality of semiconductor laser elements 120 can be extended without changing the total value of light outputs of laser light output from the light source device. Also, all semiconductor laser elements 120 can reach the end of the service life almost at the same time.

Other Embodiments

The light source device according to the present disclosure has been described by way of embodiments and variations, but the present disclosure is not limited to the embodiments and the variations that were described above. Other embodiments obtained by making various modifications that can be conceived by a person having ordinary skill in the art to the embodiments and variations described above, as well as embodiments constructed by combining the structural elements of different embodiments and variations without departing from the scope of the present invention are also included within the scope of one or more aspects.

Also, in the embodiments given above, light source devices 100 and 100a do not include display device 200. However, light source devices 100 and 100a may include display device 200.

Also, for example, the structural elements of processors 190 and 190a may be composed of one or more electronic circuits. The one or more electronic circuits may be general-purpose circuits or may be dedicated circuits. The one or more electronic circuits may include, for example, a semiconductor device, an IC (Integrated Circuit), an LSI (Large Scale integration), and the like. The IC or the LSI may be integrated on a single chip or a plurality of chips. The IC or the LSI as used herein may be called system LSI, VLSI (Very Large Scale Integration), or ULSI (Ultra Large Scale Integration) according to the degree of integration. Also, an FPGA (Field Programmable Gate Array) that can be programmed after LSI production can also be used for the same purpose.

Also, generic or specific aspects of the present disclosure may be implemented by a system, a device, a method, an integrated circuit, or a computer program. Alternatively, generic or specific aspects of the present disclosure may be implemented by a computer readable non-transitory recording medium, such as an optical disk, a HDD, or a semiconductor memory, in which the computer program is stored. Alternatively, generic or specific aspects of the present disclosure may be implemented by any combination of a system, a device, a method, an integrated circuit, a computer program, and a recording medium.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The light source device according to the present disclosure is applicable to a light source device that includes a semiconductor laser element such as, for example, a laser processing machine that processes an irradiation target by using laser light.

The invention claimed is:

1. A light source device, comprising:
a semiconductor laser element;
an optical system that includes a first optical element through which emission light emitted from the semiconductor laser element propagates;
a first light receiver that receives first propagating light that has propagated through at least a portion of the first optical element;
a laser driving controller that controls a driving current for driving the semiconductor laser element; and
a first received-light intensity measurer that measures a first output value that indicates a received-light intensity of the first propagating light that has been received by the first light receiver,
wherein the first light receiver is disposed downstream of the first optical element,
wherein the laser driving controller drives the semiconductor laser element by using a plurality of values of the driving current that are different from each other,
wherein the received-light intensity measurer measures the first output value of the first propagating light that has been received by the first light receiver for each of the plurality of values of the driving current that are different from each other,
wherein the light source device further comprises a degradation determiner that determines a degree of degradation of the first optical element,
wherein the degradation determiner determines the degree of degradation of the first optical element based on the plurality of values of the driving current that are different from each other and the first output value of the first propagating light that has been received by the first light receiver for each of the plurality of values of the driving current that are different from each other, and
wherein the degradation determiner determines the degree of degradation of the first optical element based on $\Delta Pom/\Delta If$, where $\Delta If$ represents an amount of variation between two driving current values out of the plurality of values of the driving current that are different from each other, and $\Delta Pom$ represents an amount of variation between the first output values of the first propagating light that has been received by the first light receiver that correspond to the two driving current values.

2. The light source device according to claim 1, wherein the first light receiver is disposed downstream of the optical system.

3. The light source device according to claim 2, wherein the first propagating light that has propagated through at least the portion of the first optical element is further irradiated on an irradiation target.

4. The light source device according to claim 1, wherein the first optical element includes at least one of a lens, a mirror, or an optical wave guide.

5. The light source device according to claim 1, wherein the first light receiver receives the first propagating light at a position displaced from a focal point of the first propagating light on a light receiving surface of the first light receiver, the first propagating light being obtained by the emission light being condensed by the first optical element.

6. The light source device according to claim 1, wherein each of the plurality of values of the driving current that corresponds to the first propagating light that has been received by the first light receiver is smaller than a rated driving current value.

7. The light source device according to claim 1, further comprising:
a temperature adjuster that adjusts a temperature of the semiconductor laser element; and
a temperature adjustment controller that controls the temperature adjuster,
wherein the temperature adjustment controller controls the temperature of the semiconductor laser element by controlling the temperature adjuster, and
the temperature of the semiconductor laser element is controlled to be within a range of ±5° C. of a reference temperature by the temperature adjustment controller controlling the temperature adjuster when the received-light intensity measurer measures the first output value, the reference temperature being a temperature that has been set in advance.

8. The light source device according to claim 1, wherein the degradation determiner:
calculates an amount of variation with time in a value of threshold current at which the semiconductor laser element performs laser oscillation;
calculates a service life of the semiconductor laser element by using the amount of variation with time in the value of threshold current that was calculated; and
determines the degree of degradation of the first optical element.

9. The light source device according to claim 8, wherein an inspection mode and an operation mode are performed repeatedly, the inspection mode being a mode in which the degradation determiner determines the degree of degradation of the first optical element and calculates the service life of the semiconductor laser element by causing the first light receiver to receive the first propagating light that has propagated through at least the portion of the first optical element, and the operation mode being a mode in which an irradiation target is irradiated with the first propagating light that has propagated through at least the portion of the first optical element.

10. The light source device according to claim 8, wherein the degradation determiner transmits, to an external computer, the service life of the semiconductor laser element that was calculated.

11. The light source device according to claim 1, wherein the degradation determiner transmits, to an external computer, the degree of degradation of the first optical element that was determined.

12. The light source device according to claim 1, wherein the degradation determiner calculates at least one of
cumulative operating time taken until it is determined that a failure has occurred in the first optical element, or time taken until it is determined that a failure has occurred in the first optical element,
based on $\Delta Pom/\Delta If$.

13. The light source device according to claim 12, wherein the degradation determiner transmits, to an external computer, the time taken until it is determined that a failure has occurred in the first optical element that was calculated.

14. The light source device according to claim 1, further comprising:
a second light receiver and a second received-light intensity measurer,
wherein the optical system further includes a second optical element that is disposed upstream of the first optical element,
the second light receiver receives second propagating light that is light that has propagated through the second optical element before entering the first optical element, and
the second received-light intensity measurer measures a second output value that indicates a received-light intensity of the second propagating light that has been received by the second light receiver for each of the plurality of values of the driving current that are different from each other.

15. The light source device according to claim 1, wherein the semiconductor laser element includes a plurality of semiconductor laser elements,
the laser driving controller drives the plurality of semiconductor laser elements at different timings,
the first light receiver receives at least a portion of the first propagating light for each of the plurality of semiconductor laser elements driven at different timings, and
the received-light intensity measurer measures the first output value of the first propagating light that has been received by the first light receiver for each of the plurality of values of the driving current that are different from each other for each of the plurality of semiconductor laser elements.

16. The light source device according to claim 1, wherein the semiconductor laser element includes a nitride semiconductor.

17. The light source device according to claim 1, wherein the emission light has a wavelength of 500 nm or less.

18. The light source device according to claim 8, wherein the semiconductor laser element includes a plurality of semiconductor laser elements,
the degradation determiner determines the service life of each of the plurality of semiconductor laser elements, and
the laser driving controller controls the plurality of values of the driving current that are input to the plurality of semiconductor laser elements based on the service life of each of the plurality of semiconductor laser elements that was determined by the degradation determiner.

* * * * *